US 12,367,386 B2

(12) United States Patent
Tran et al.

(10) Patent No.: US 12,367,386 B2
(45) Date of Patent: Jul. 22, 2025

(54) SPLIT ARRAY ARCHITECTURE FOR ANALOG NEURAL MEMORY IN A DEEP LEARNING ARTIFICIAL NEURAL NETWORK

(71) Applicant: Silicon Storage Technology, Inc., San Jose, CA (US)

(72) Inventors: Hieu Van Tran, San Jose, CA (US); Thuan Vu, San Jose, CA (US); Stanley Hong, San Jose, CA (US); Stephen Trinh, San Jose, CA (US); Anh Ly, San Jose, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 984 days.

(21) Appl. No.: 17/461,901

(22) Filed: Aug. 30, 2021

(65) Prior Publication Data
US 2022/0374696 A1    Nov. 24, 2022

Related U.S. Application Data

(60) Provisional application No. 63/190,228, filed on May 18, 2021.

(51) Int. Cl.
*G11C 11/54*    (2006.01)
*G06N 3/065*    (2023.01)
(Continued)

(52) U.S. Cl.
CPC .......... *G06N 3/065* (2023.01); *G11C 7/1069* (2013.01); *G11C 7/1096* (2013.01); *G11C 7/12* (2013.01); *G11C 8/10* (2013.01); *G11C 11/54* (2013.01)

(58) Field of Classification Search
CPC .... G06N 3/065; G11C 7/1069; G11C 7/1096; G11C 7/12; G11C 8/10; G11C 11/534
See application file for complete search history.

(56) References Cited

U.S. PATENT DOCUMENTS

| 6,574,148 | B2 | 6/2003 | Chevalier |
| 10,748,630 | B2 | 8/2020 | Tran et al. |

(Continued)

FOREIGN PATENT DOCUMENTS

| JP | 2019 511802 A | 4/2019 | |
| TW | 202016928 A | * 5/2020 | ............. G06F 17/16 |

(Continued)

OTHER PUBLICATIONS

Roohi, et al, Adaptive model-free synchronization of different fractional-order neural networks with an application in cryptography, [received Sep. 17, 2024]. Retrieved from Internet: <https://link.springer.com/article/10.1007/s11071-020-05719-y> (Year: 2020).*

(Continued)

*Primary Examiner* — Miranda M Huang
*Assistant Examiner* — Bart I Rylander
(74) *Attorney, Agent, or Firm* — Vedder Price P.C.

(57) ABSTRACT

Numerous embodiments are disclosed for splitting an array of non-volatile memory cells in an analog neural memory in a deep learning artificial neural network into multiple parts. Each part of the array interacts with certain circuitry dedicated to that part and with other circuitry that is shared with one or more other parts of the array.

10 Claims, 41 Drawing Sheets

(51) Int. Cl.
   *G11C 7/10*   (2006.01)
   *G11C 7/12*   (2006.01)
   *G11C 8/10*   (2006.01)

(56) References Cited

U.S. PATENT DOCUMENTS

| | | | |
|---|---|---|---|
| 2017/0337466 A1* | 11/2017 | Bayat | ............... G11C 29/38 |
| 2019/0164044 A1 | 5/2019 | Song et al. | |
| 2020/0192970 A1 | 6/2020 | Ma et al. | |
| 2020/0233482 A1* | 7/2020 | Tran | ............... G11C 11/54 |
| 2022/0392524 A1 | 12/2022 | Chen | |

FOREIGN PATENT DOCUMENTS

| | | | |
|---|---|---|---|
| WO | 2021 015813 | 1/2021 | |
| WO | WO-2021028723 A2 * | 2/2021 | ......... G06F 12/0215 |

OTHER PUBLICATIONS

Xiao, et al, Analog architectures for neural network acceleration based on non-volatile memory, [received Sep. 17, 2024]. Retrieved from Internet :<https://pubs.aip.org/aip/apr/article/7/3/031301/997525> (Year: 2020).*

Ziegler, et al., In-Memory Binary Vector-Matrix Multiplication Based on Complementary Resistive Switches, [received Sep. 17, 2024]. Retrieved from Internet :< https://onlinelibrary.wiley.com/doi/full/10. 1002/aisy.202000134> (Year: 2020).*

PCT Search Report & Written Opinion dated Jan. 25, 2024 for the related PCT Patent Application No. US2021/048864.

PCT Invitation to Pay Additional Fees and Partial Search Report dated Feb. 3, 2022 for the related PCT Patent Application No. US2021/048864.

Taiwanese Office Action mailed on Jan. 10, 2024 corresponding to the related Taiwanese Patent Application No. 111117950.

Taiwanese Office Action mailed on Jun. 4, 2024 corresponding to the related Taiwanese Patent Application No. 111117950. (English Google Machine Translations and original copy of the Taiwanese Office Action).

S. Korean Office Action mailed on Sep. 13, 2024 corresponding to the related S. Korean Patent Application No. 10-2023-7032814. (Google English Translations and original copy of the S. Korean Office Action are attached.).

Taiwanese Office Action mailed on Sep. 30, 2024 corresponding to the related Taiwanese Patent Application No. 111117950. (Google English Translations and original copy of the Taiwanese Office Action are attached.).

Japanese Office Action mailed on Oct. 15, 2024 corresponding to the related Japanese Patent Application No. 2023-563861. (Attached are the Google English Translations and original copy of the Japanese Office Action.).

European Communication mailed on Sep. 26, 2024 corresponding to the related European Patent Application No. 21 778 651.6.

* cited by examiner

SPLIT ARRAY ARCHITECTURE FOR ANALOG NEURAL MEMORY IN A DEEP LEARNING ARTIFICIAL NEURAL NETWORK

PRIORITY CLAIM

This application claims priority to U.S. Provisional Patent Application No. 63/190,228, filed on May 18, 2021, and titled, "Split Array Architecture for Analog Neural Memory in a Deep Learning Artificial Neural Network," which is incorporated by reference herein.

FIELD OF THE INVENTION

Numerous embodiments are disclosed for splitting an array into multiple parts in an analog neural memory in a deep learning artificial neural network, where each part interacts with certain circuitry dedicated to that part and other circuitry that is shared with one or more other parts.

BACKGROUND OF THE INVENTION

Artificial neural networks mimic biological neural networks (the central nervous systems of animals, in particular the brain) and are used to estimate or approximate functions that can depend on a large number of inputs and are generally unknown. Artificial neural networks generally include layers of interconnected "neurons" which exchange messages between each other.

FIG. 1 illustrates an artificial neural network, where the circles represent the inputs or layers of neurons. The connections (called synapses) are represented by arrows and have numeric weights that can be tuned based on experience. This makes neural networks adaptive to inputs and capable of learning. Typically, neural networks include a layer of multiple inputs. There are typically one or more intermediate layers of neurons, and an output layer of neurons that provide the output of the neural network. The neurons at each level individually or collectively make a decision based on the received data from the synapses.

One of the major challenges in the development of artificial neural networks for high-performance information processing is a lack of adequate hardware technology. Indeed, practical neural networks rely on a very large number of synapses, enabling high connectivity between neurons, i.e. a very high computational parallelism. In principle, such complexity can be achieved with digital supercomputers or specialized graphics processing unit clusters. However, in addition to high cost, these approaches also suffer from mediocre energy efficiency as compared to biological networks, which consume much less energy primarily because they perform low-precision analog computation. CMOS analog circuits have been used for artificial neural networks, but most CMOS-implemented synapses have been too bulky given the high number of neurons and synapses.

Applicant previously disclosed an artificial (analog) neural network that utilizes one or more non-volatile memory arrays as the synapses in U.S. patent application Ser. No. 15/594,439, which is incorporated by reference. The non-volatile memory arrays operate as an analog neuromorphic memory. The neural network device includes a first plurality of synapses configured to receive a first plurality of inputs and to generate therefrom a first plurality of outputs, and a first plurality of neurons configured to receive the first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a non-floating gate disposed over and insulated from a second portion of the channel region. Each of the plurality of memory cells is configured to store a weight value corresponding to a number of electrons on the floating gate. The plurality of memory cells is configured to multiply the first plurality of inputs by the stored weight values to generate the first plurality of outputs.

Non-Volatile Memory Cells

Non-volatile memories are well known. For example, U.S. Pat. No. 5,029,130 ("the '130 patent"), which is incorporated herein by reference, discloses an array of split gate non-volatile memory cells, which are a type of flash memory cells. Such a memory cell 210 is shown in FIG. 2. Each memory cell 210 includes source region 14 and drain region 16 formed in semiconductor substrate 12, with channel region 18 there between. Floating gate 20 is formed over and insulated from (and controls the conductivity of) a first portion of the channel region 18, and over a portion of the source region 14. Word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline 24 is coupled to drain region 16.

Memory cell 210 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim (FN) tunneling.

Memory cell 210 is programmed by source side injection (SSI) with hot electrons (where electrons are placed on the floating gate) by placing a positive voltage on the word line terminal 22, and a positive voltage on the source region 14. Electron current will flow from the drain region 16 towards the source region 14. The electrons will accelerate and become heated when they reach the gap between the word line terminal 22 and the floating gate 20. Some of the heated electrons will be injected through the gate oxide onto the floating gate 20 due to the attractive electrostatic force from the floating gate 20.

Memory cell 210 is read by placing positive read voltages on the drain region 16 and word line terminal 22 (which turns on the portion of the channel region 18 under the word line terminal). If the floating gate 20 is positively charged (i.e. erased of electrons), then the portion of the channel region 18 under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state.

Table No. 1 depicts typical voltage and current ranges that can be applied to the terminals of memory cell 110 for performing read, erase, and program operations:

TABLE 1

Operation of Flash Memory Cell 210 of FIG. 3

|  | WL | BL | SL |
|---|---|---|---|
| Read | 2-3 V | 0.6-2 V | 0 V |
| Erase | ~11-13 V | 0 V | 0 V |
| Program | 1-2 V | 10.5-3 μA | 9-10 V |

Other split gate memory cell configurations, which are other types of flash memory cells, are known. For example, FIG. 3 depicts a four-gate memory cell 310 comprising source region 14, drain region 16, floating gate 20 over a first portion of channel region 18, a select gate 22 (typically coupled to a word line, WL) over a second portion of the channel region 18, a control gate 28 over the floating gate 20, and an erase gate 30 over the source region 14. This configuration is described in U.S. Pat. No. 6,747,310, which is incorporated herein by reference for all purposes. Here, all gates are non-floating gates except floating gate 20, meaning that they are electrically connected or connectable to a voltage source. Programming is performed by heated electrons from the channel region 18 injecting themselves onto the floating gate 20. Erasing is performed by electrons tunneling from the floating gate 20 to the erase gate 30.

Table No. 2 depicts typical voltage and current ranges that can be applied to the terminals of memory cell 310 for performing read, erase, and program operations:

TABLE 2

Operation of Flash Memory Cell 310 of FIG. 3

|  | WL/SG | BL | CG | EG | SL |
|---|---|---|---|---|---|
| Read | 1.0-2 V | 0.6-2 V | 0-2.6 V | 0-2.6 V | 0 V |
| Erase | −0.5 V/0 V | 0 V | 0 V/−8 V | 8-12 V | 0 V |
| Program | 1 V | 0.1-1 μA | 8-11 V | 4.5-9 V | 4.5-5 V |

FIG. 4 depicts a three-gate memory cell 410, which is another type of flash memory cell. Memory cell 410 is identical to the memory cell 310 of FIG. 3 except that memory cell 410 does not have a separate control gate. The erase operation (whereby erasing occurs through use of the erase gate) and read operation are similar to that of the FIG. 3 except there is no control gate bias applied. The programming operation also is done without the control gate bias, and as a result, a higher voltage must be applied on the source line during a program operation to compensate for a lack of control gate bias.

Table No. 3 depicts typical voltage and current ranges that can be applied to the terminals of memory cell 410 for performing read, erase, and program operations:

TABLE 3

Operation of Flash Memory Cell 410 of FIG. 4

|  | WL/SG | BL | EG | SL |
|---|---|---|---|---|
| Read | 0.7-2.2 V | 0.6-2 V | 0-2.6 V | 0 V |
| Erase | −0.5 V/0 V | 0 V | 11.5 V | 0 V |
| Program | 1 V | 0.2-3 μA | 4.5 V | 7-9 V |

FIG. 5 depicts stacked gate memory cell 510, which is another type of flash memory cell. Memory cell 510 is similar to memory cell 210 of FIG. 2, except that floating gate 20 extends over the entire channel region 18, and control gate 22 (which here will be coupled to a word line) extends over floating gate 20, separated by an insulating layer (not shown). The erase is done by FN tunneling of electrons from FG to substrate, programming is by channel hot electron (CHE) injection at region between the channel 18 and the drain region 16, by the electrons flowing from the source region 14 towards to drain region 16 and read operation which is similar to that for memory cell 210 with a higher control gate voltage.

Table No. 4 depicts typical voltage ranges that can be applied to the terminals of memory cell 510 and substrate 12 for performing read, erase, and program operations:

TABLE 4

Operation of Flash Memory Cell 510 of FIG. 5

|  | CG | BL | SL | Substrate |
|---|---|---|---|---|
| Read | 2-5 V | 0.6-2 V | 0 V | 0 V |
| Erase | −8 to −10 V/0 V | FLT | FLT | 8-10 V/15-20 V |
| Program | 8-12 V | 3-5 V | 0 V | 0 V |

The methods and means described herein may apply to other non-volatile memory technologies such as FINFET split gate flash or stack gate flash memory, NAND flash, SONOS (silicon-oxide-nitride-oxide-silicon, charge trap in nitride), MONOS (metal-oxide-nitride-oxide-silicon, metal charge trap in nitride), ReRAM (resistive ram), PCM (phase change memory), MRAM (magnetic ram), FeRAM (ferroelectric ram), CT (charge trap) memory, CN (carbon-tube) memory, OTP (bi-level or multi-level one time programmable), and CeRAM (correlated electron ram), without limitation.

In order to utilize the memory arrays comprising one of the types of non-volatile memory cells described above in an artificial neural network, two modifications are made. First, the lines are configured so that each memory cell can be individually programmed, erased, and read without adversely affecting the memory state of other memory cells in the array, as further explained below. Second, continuous (analog) programming of the memory cells is provided.

Specifically, the memory state (i.e. charge on the floating gate) of each memory cell in the array can be continuously changed from a fully erased state to a fully programmed state, independently and with minimal disturbance of other memory cells. In another embodiment, the memory state (i.e., charge on the floating gate) of each memory cell in the array can be continuously changed from a fully programmed state to a fully erased state, and vice-versa, independently and with minimal disturbance of other memory cells. This means the cell storage is analog or at the very least can store one of many discrete values (such as 16 or 64 different values), which allows for very precise and individual tuning of all the cells in the memory array, and which makes the memory array ideal for storing and making fine tuning adjustments to the synapsis weights of the neural network.

Neural Networks Employing Non-Volatile Memory Cell Arrays

FIG. 6 conceptually illustrates a non-limiting example of a neural network utilizing a non-volatile memory array of the present embodiments. This example uses the non-volatile memory array neural network for a facial recognition application, but any other appropriate application could be implemented using a non-volatile memory array based neural network.

S0 is the input layer, which for this example is a 32×32 pixel RGB image with 5 bit precision (i.e. three 32×32 pixel arrays, one for each color R, G and B, each pixel being 5 bit precision). The synapses CB1 going from input layer S0 to layer C1 apply different sets of weights in some instances and shared weights in other instances, and scan the input image with 3×3 pixel overlapping filters (kernel), shifting the filter by 1 pixel (or more than 1 pixel as dictated by the model). Specifically, values for 9 pixels in a 3×3 portion of the image (i.e., referred to as a filter or kernel) are provided to the synapses CB1, where these 9 input values are multiplied by the appropriate weights and, after summing the outputs of that multiplication, a single output value is determined and provided by a first synapse of CB1 for generating a pixel of one of the feature maps of layer C1. The 3×3 filter is then shifted one pixel to the right within input layer S0 (i.e., adding the column of three pixels on the right, and dropping the column of three pixels on the left), whereby the 9 pixel values in this newly positioned filter are provided to the synapses CB1, where they are multiplied by the same weights and a second single output value is determined by the associated synapse. This process is continued until the 3×3 filter scans across the entire 32×32 pixel image of input layer S0, for all three colors and for all bits (precision values). The process is then repeated using different sets of weights to generate a different feature map of layer C1, until all the features maps of layer C1 have been calculated.

In layer C1, in the present example, there are 16 feature maps, with 30×30 pixels each. Each pixel is a new feature pixel extracted from multiplying the inputs and kernel, and therefore each feature map is a two dimensional array, and thus in this example layer C1 constitutes 16 layers of two dimensional arrays (keeping in mind that the layers and arrays referenced herein are logical relationships, not necessarily physical relationships—i.e., the arrays are not necessarily oriented in physical two dimensional arrays). Each of the 16 feature maps in layer C1 is generated by one of sixteen different sets of synapse weights applied to the filter scans. The C1 feature maps could all be directed to different aspects of the same image feature, such as boundary identification. For example, the first map (generated using a first weight set, shared for all scans used to generate this first map) could identify circular edges, the second map (generated using a second weight set different from the first weight set) could identify rectangular edges, or the aspect ratio of certain features, and so on.

An activation function P1 (pooling) is applied before going from layer C1 to layer S1, which pools values from consecutive, non-overlapping 2×2 regions in each feature map. The purpose of the pooling function P1 is to average out the nearby location (or a max function can also be used), to reduce the dependence of the edge location for example and to reduce the data size before going to the next stage. At layer S1, there are 16 15×15 feature maps (i.e., sixteen different arrays of 15×15 pixels each). The synapses CB2 going from layer S1 to layer C2 scan maps in layer S1 with 4×4 filters, with a filter shift of 1 pixel. At layer C2, there are 22 12×12 feature maps. An activation function P2 (pooling) is applied before going from layer C2 to layer S2, which pools values from consecutive non-overlapping 2×2 regions in each feature map. At layer S2, there are 22 6×6 feature maps. An activation function (pooling) is applied at the synapses CB3 going from layer S2 to layer C3, where every neuron in layer C3 connects to every map in layer S2 via a respective synapse of CB3. At layer C3, there are 64 neurons. The synapses CB4 going from layer C3 to the output layer S3 fully connects C3 to S3, i.e. every neuron in layer C3 is connected to every neuron in layer S3. The output at S3 includes 10 neurons, where the highest output neuron determines the class. This output could, for example, be indicative of an identification or classification of the contents of the original image.

Each layer of synapses is implemented using an array, or a portion of an array, of non-volatile memory cells.

FIG. 7 is a block diagram of an array that can be used for that purpose. Vector-by-matrix multiplication (VMM) array 32 includes non-volatile memory cells and is utilized as the synapses (such as CB1, CB2, CB3, and CB4 in FIG. 6) between one layer and the next layer. Specifically, VMM array 32 includes an array of non-volatile memory cells 33, erase gate and word line gate decoder 34, control gate decoder 35, bit line decoder 36 and source line decoder 37, which decode the respective inputs for the non-volatile memory cell array 33. Input to VMM array 32 can be from the erase gate and wordline gate decoder 34 or from the control gate decoder 35. Source line decoder 37 in this example also decodes the output of the non-volatile memory cell array 33. Alternatively, bit line decoder 36 can decode the output of the non-volatile memory cell array 33.

Non-volatile memory cell array 33 serves two purposes. First, it stores the weights that will be used by the VMM array 32. Second, the non-volatile memory cell array 33 effectively multiplies the inputs by the weights stored in the non-volatile memory cell array 33 and adds them up per output line (source line or bit line) to produce the output, which will be the input to the next layer or input to the final layer. By performing the multiplication and addition function, the non-volatile memory cell array 33 negates the need for separate multiplication and addition logic circuits and is also power efficient due to its in-situ memory computation.

The output of non-volatile memory cell array 33 is supplied to a differential summer (such as a summing op-amp or a summing current mirror) 38, which sums up the outputs of the non-volatile memory cell array 33 to create a single value for that convolution. The differential summer 38 is arranged to perform summation of positive weight and negative weight.

The summed-up output values of differential summer 38 are then supplied to an activation function block 39, which rectifies the output. The activation function block 39 may provide sigmoid, tanh, or ReLU functions. The rectified output values of activation function block 39 become an element of a feature map as the next layer (e.g. C1 in FIG. 6), and are then applied to the next synapse to produce the next feature map layer or final layer. Therefore, in this example, non-volatile memory cell array 33 constitutes a plurality of synapses (which receive their inputs from the prior layer of neurons or from an input layer such as an image database), and summing op-amp 38 and activation function block 39 constitute a plurality of neurons.

The input to VMM array 32 in FIG. 7 (WLx, EGx, CGx, and optionally BLx and SLx) can be analog level, binary level, or digital bits (in which case a DAC is provided to convert digital bits to appropriate input analog level) and the output can be analog level, binary level, or digital bits (in which case an output ADC is provided to convert output analog level into digital bits).

FIG. 8 is a block diagram depicting the usage of numerous layers of VMM arrays 32, here labeled as VMM arrays 32a, 32b, 32c, 32d, and 32e. As shown in FIG. 8, the input, denoted Inputx, is converted from digital to analog by a digital-to-analog converter 31 and provided to input VMM array 32a. The converted analog inputs could be voltage or current. The input D/A conversion for the first layer could be done by using a function or a LUT (look up table) that maps the inputs Inputx to appropriate analog levels for the matrix multiplier of input VMM array 32a. The input conversion could also be done by an analog to analog (A/A) converter to convert an external analog input to a mapped analog input to the input VMM array 32a.

The output generated by input VMM array 32a is provided as an input to the next VMM array (hidden level 1) 32b, which in turn generates an output that is provided as an input to the next VMM array (hidden level 2) 32c, and so on. The various layers of VMM array 32 function as different layers of synapses and neurons of a convolutional neural network (CNN). Each VMM array 32a, 32b, 32c, 32d, and 32e can be a stand-alone, physical non-volatile memory array, or multiple VMM arrays could utilize different portions of the same physical non-volatile memory array, or multiple VMM arrays could utilize overlapping portions of the same physical non-volatile memory array. The example shown in FIG. 8 contains five layers (32a,32b,32c,32d,32e): one input layer (32a), two hidden layers (32b,32c), and two fully connected layers (32d,32e). One of ordinary skill in the art will appreciate that this is merely exemplary and that a system instead could comprise more than two hidden layers and more than two fully connected layers.

Vector-by-Matrix Multiplication (VMM) Arrays

FIG. 9 depicts neuron VMM array 900, which is particularly suited for memory cells 310 as shown in FIG. 3 and is utilized as the synapses and parts of neurons between an input layer and the next layer. VMM array 900 comprises memory array 901 of non-volatile memory cells and reference array 902 (at the top of the array) of non-volatile reference memory cells. Alternatively, another reference array can be placed at the bottom.

In VMM array 900, control gate lines, such as control gate line 903, run in a vertical direction (hence reference array 902 in the row direction is orthogonal to control gate line 903), and erase gate lines, such as erase gate line 904, run in a horizontal direction. Here, the inputs to VMM array 900 are provided on the control gate lines (CG0, CG1, CG2, CG3), and the output of VMM array 900 emerges on the source lines (SL0, SL1). In one embodiment, only even rows are used, and in another embodiment, only odd rows are used. The current placed on each source line (SL0, SL1, respectively) performs a summing function of all the currents from the memory cells connected to that particular source line.

As described herein for neural networks, the non-volatile memory cells of VMM array 900, i.e. the memory cells 310 of VMM array 900, are preferably configured to operate in a sub-threshold region.

The non-volatile reference memory cells and the non-volatile memory cells described herein are biased in weak inversion (sub threshold region):

$$Ids=Io*e^{(Vg-Vth)/nVt}=w*Io*e^{(Vg)/nVt},$$

where $w=e^{(-Vth)/nVt}$ where Ids is the drain to source current; Vg is gate voltage on the memory cell; Vth is threshold voltage of the memory cell; Vt is thermal voltage=k*T/q with k being the Boltzmann constant, T the temperature in Kelvin, and q the electronic charge; n is a slope factor=1+(Cdep/Cox) with Cdep=capacitance of the depletion layer, and Cox capacitance of the gate oxide layer; Io is the memory cell current at gate voltage equal to threshold voltage, Io is proportional to (Wt/L)*u*Cox*(n−1)*Vt² where u is carrier mobility and Wt and L are width and length, respectively, of the memory cell.

For an I-to-V log converter using a memory cell (such as a reference memory cell or a peripheral memory cell) or a transistor to convert input current into an input voltage:

$$Vg=n*Vt*\log[Ids/wp*Io]$$

where, wp is w of a reference or peripheral memory cell.

For a memory array used as a vector matrix multiplier VMM array with the current input, the output current is:

$$Iout=wa*Io*e^{(Vg)/nVt}, \text{namely}$$

$$Iout=(wa/wp)*Iin=W*Iin$$

$$W=e^{(Vthp-Vtha)/nVt}$$

Here, wa=w of each memory cell in the memory array. Vthp is effective threshold voltage of the peripheral memory cell and Vtha is effective threshold voltage of the main (data) memory cell. Note that the threshold voltage of a transistor is a function of substrate body bias voltage and the substrate body bias voltage, denoted Vsb, can be modulated to compensate for various conditions, on such temperature. The threshold voltage Vth can be expressed as:

$$Vth=Vth0+\text{gamma}(\text{SQRT}|Vsb-2*\varphi F|-\text{SQRT}|2*\varphi F|)$$

Where Vth0 is threshold voltage with zero substrate bias, φF is a surface potential, and gamma is a body effect parameter.

A wordline or control gate can be used as the input for the memory cell for the input voltage.

Alternatively, the flash memory cells of VMM arrays described herein can be configured to operate in the linear region:

$$Ids=\text{beta}*(Vgs-Vth)*Vds; \text{beta}=u*Cox*Wt/L$$

$$W=\alpha(Vgs-Vth)$$

meaning weight W in the linear region is proportional to (Vgs−Vth)

A wordline or control gate or bitline or sourceline can be used as the input for the memory cell operated in the linear region. The bitline or sourceline can be used as the output for the memory cell.

For an I-to-V linear converter, a memory cell (such as a reference memory cell or a peripheral memory cell) or a transistor operating in the linear region can be used to linearly convert an input/output current into an input/output voltage.

Alternatively, the memory cells of VMM arrays described herein can be configured to operate in the saturation region:

$$Ids=\tfrac{1}{2}*\text{beta}*(Vgs-Vth)^2; \text{beta}=u*Cox*Wt/L$$

$$W\alpha(Vgs-Vth)^2, \text{meaning weight } W \text{ is proportional to } (Vgs-Vth)^2$$

A wordline, control gate, or erase gate can be used as the input for the memory cell operated in the saturation region. The bitline or sourceline can be used as the output for the output neuron.

Alternatively, the memory cells of VMM arrays described herein can be used in all regions or a combination thereof (sub threshold, linear, or saturation) for each layer or multi layers of a neural network.

Other embodiments for VMM array 32 of FIG. 7 are described in U.S. Patent Application No. application Ser. No. 15/826,345, which is incorporated by reference herein. As described in that application. a sourceline or a bitline can be used as the neuron output (current summation output).

FIG. 10 depicts neuron VMM array 1000, which is particularly suited for memory cells 210 as shown in FIG. 2 and is utilized as the synapses between an input layer and the next layer. VMM array 1000 comprises a memory array 1003 of non-volatile memory cells, reference array 1001 of first non-volatile reference memory cells, and reference array 1002 of second non-volatile reference memory cells. Reference arrays 1001 and 1002, arranged in the column direction of the array, serve to convert current inputs flowing into terminals BLR0, BLR1, BLR2, and BLR3 into voltage inputs WL0, WL1, WL2, and WL3. In effect, the first and second non-volatile reference memory cells are diode-connected through multiplexors 1014 (only partially depicted) with current inputs flowing into them. The reference cells are tuned (e.g., programmed) to target reference levels. The target reference levels are provided by a reference mini-array matrix (not shown).

Memory array 1003 serves two purposes. First, it stores the weights that will be used by the VMM array 1000 on respective memory cells thereof. Second, memory array 1003 effectively multiplies the inputs (i.e. current inputs provided in terminals BLR0, BLR1, BLR2, and BLR3, which reference arrays 1001 and 1002 convert into the input voltages to supply to wordlines WL0, WL1, WL2, and WL3) by the weights stored in the memory array 1003 and then adds all the results (memory cell currents) to produce the output on the respective bit lines (BL0-BLN), which will be the input to the next layer or input to the final layer. By performing the multiplication and addition function, memory array 1003 negates the need for separate multiplication and addition logic circuits and is also power efficient. Here, the voltage inputs are provided on the word lines WL0, WL1, WL2, and WL3, and the output emerges on the respective bit lines BL0-BLN during a read (inference) operation. The current placed on each of the bit lines BL0-BLN performs a summing function of the currents from all non-volatile memory cells connected to that particular bitline.

Table No. 5 depicts operating voltages and currents for VMM array 1000. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

an input layer and the next layer. VMM array 1100 comprises a memory array 1103 of non-volatile memory cells, reference array 1101 of first non-volatile reference memory cells, and reference array 1102 of second non-volatile reference memory cells. Reference arrays 1101 and 1102 run in row direction of the VMM array 1100. VMM array is similar to VMM 1000 except that in VMM array 1100, the word lines run in the vertical direction. Here, the inputs are provided on the word lines (WLA0, WLB0, WLA1, WLB2, WLA2, WLB2, WLA3, WLB3), and the output emerges on the source line (SL0, SL1) during a read operation. The current placed on each source line performs a summing function of all the currents from the memory cells connected to that particular source line.

Table No. 6 depicts operating voltages and currents for VMM array 1100. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

TABLE 6

Operation of VMM Array 1100 of FIG. 11

|  | WL | WL-unsel | BL | BL-unsel | SL | SL-unsel |
|---|---|---|---|---|---|---|
| Read | 1-3.5 V | −0.5 V/0 V | 0.6-2 V | 0.6 V-2 V/0 V | ~0.3-1 V (Ineuron) | 0 V |
| Erase | ~5-13 V | 0 V | 0 V | 0 V | 0 V | SL-inhibit (~4-8 V) |
| Program | 1-2 V | −0.5 V/0 V | 0.1-3 uA | Vinh ~2.5 V | 4-10 V | 0-1 V/FLT |

FIG. 12 depicts neuron VMM array 1200, which is particularly suited for memory cells 310 as shown in FIG. 3 and is utilized as the synapses and parts of neurons between an input layer and the next layer. VMM array 1200 comprises a memory array 1203 of non-volatile memory cells, reference array 1201 of first non-volatile reference memory cells, and reference array 1202 of second non-volatile reference memory cells. Reference arrays 1201 and 1202 serve to convert current inputs flowing into terminals BLR0, BLR1, BLR2, and BLR3 into voltage inputs CG0, CG1, CG2, and CG3. In effect, the first and second non-volatile reference memory cells are diode-connected through multiplexors 1212 (only partially shown) with current inputs flowing into them through BLR0, BLR1, BLR2, and BLR3. Multiplexors 1212 each include a respective multiplexor 1205 and a cascoding transistor 1204 to ensure a constant voltage on the bitline (such as BLR0) of each of the first and second non-volatile reference memory cells during a read operation. The reference cells are tuned to target reference levels.

TABLE 5

Operation of VMM Array 1000 of FIG. 10:

|  | WL | WL-unsel | BL | BL-unsel | SL | SL-unsel |
|---|---|---|---|---|---|---|
| Read | 1-3.5 V | −0.5 V/0 V | 0.6-2 V (Ineuron) | 0.6 V-2 V/0 V | 0 V | 0 V |
| Erase | ~5-13 V | 0 V | 0 V | 0 V | 0 V | 0 V |
| Program | 1-2 V | −0.5 V/0 V | 0.1-3 uA | Vinh ~2.5 V | 4-10 V | 0-1 V/FLT |

FIG. 11 depicts neuron VMM array 1100, which is particularly suited for memory cells 210 as shown in FIG. 2 and is utilized as the synapses and parts of neurons between Memory array 1203 serves two purposes. First, it stores the weights that will be used by the VMM array 1200. Second, memory array 1203 effectively multiplies the inputs (current inputs provided to terminals BLR0, BLR1, BLR2, and BLR3, for which reference arrays 1201 and 1202 convert these current inputs into the input voltages to supply to the control gates (CG0, CG1, CG2, and CG3) by the weights stored in the memory array and then add all the results (cell currents) to produce the output, which appears on BL0-BLN, and will be the input to the next layer or input to the final layer. By performing the multiplication and addition function, the memory array negates the need for separate multiplication and addition logic circuits and is also power efficient. Here, the inputs are provided on the control gate lines (CG0, CG1, CG2, and CG3), and the output emerges on the bitlines (BL0-BLN) during a read operation. The current placed on each bitline performs a summing function of all the currents from the memory cells connected to that particular bitline.

VMM array 1200 implements uni-directional tuning for non-volatile memory cells in memory array 1203. That is, each non-volatile memory cell is erased and then partially programmed until the desired charge on the floating gate is reached. If too much charge is placed on the floating gate (such that the wrong value is stored in the cell), the cell is erased and the sequence of partial programming operations starts over. As shown, two rows sharing the same erase gate (such as EG0 or EG1) are erased together (which is known as a page erase), and thereafter, each cell is partially programmed until the desired charge on the floating gate is reached.

Table No. 7 depicts operating voltages and currents for VMM array 1200. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

FIG. 13 depicts neuron VMM array 1300, which is particularly suited for memory cells 310 as shown in FIG. 3, and is utilized as the synapses and parts of neurons between an input layer and the next layer. VMM array 1300 comprises a memory array 1303 of non-volatile memory cells, reference array 1301 or first non-volatile reference memory cells, and reference array 1302 of second non-volatile reference memory cells. EG lines EGR0, EG0, EG1 and EGR1 are run vertically while CG lines CG0, CG1, CG2 and CG3 and SL lines WL0, WL1, WL2 and WL3 are run horizontally. VMM array 1300 is similar to VMM array 1400, except that VMM array 1300 implements bi-directional tuning, where each individual cell can be completely erased, partially programmed, and partially erased as needed to reach the desired amount of charge on the floating gate due to the use of separate EG lines. As shown, reference arrays 1301 and 1302 convert input current in the terminal BLR0, BLR1, BLR2, and BLR3 into control gate voltages CG0, CG1, CG2, and CG3 (through the action of diode-connected reference cells through multiplexors 1314) to be applied to the memory cells in the row direction. The current output (neuron) is in the bitlines BL0-BLN, where each bit line sums all currents from the non-volatile memory cells connected to that particular bitline.

Table No. 8 depicts operating voltages and currents for VMM array 1300. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

TABLE 7

Operation of VMM Array 1200 of FIG. 12

|  | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2 V | −0.5 V/ 0 V | 0.6-2 V (Ineuron) | 0 V | 0-2.6 V | 0-2.6 V | 0-2.6 V | 0-2.6 V | 0-2.6 V | 0 V | 0 V |
| Erase | 0 V | 0 V | 0 V | 0 V | 0 V | 0-2.6 V | 0-2.6 V | 5-12 V | 0-2.6 V | 0 V | 0 V |
| Program | 0.7-1 V | −0.5 V/ 0 V | 0.1-1 uA | Vinh (1-2 V) | 4-11 V | 0-2.6 V | 0-2.6 V | 4.5-5 V | 0-2.6 V | 4.5-5 V | 0-1 V |

TABLE 8

Operation of VMM Array 1300 of FIG. 13

|  | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2 V | −0.5 V/0 V | 0.6-2 V (Ineuron) | 0 V | 0-2.6 V | 0-2.6 V | 0-2.6 V | 0-2.6 V | 0-2.6 V | 0 V | 0 V |
| Erase | 0 V | 0 V | 0 V | 0 V | 0 V | 4-9 V | 0-2.6 V | 5-12 V | 0-2.6 V | 0 V | 0 V |
| Program | 0.7-1 V | −0.5 V/0 V | 0.1-1 uA | Vinh (1-2 V) | 4-11 V | 0-2.6 V | 0-2.6 V | 4.5-5 V | 0-2.6 V | 4.5-5 V | 0-1 V |

FIG. 22 depicts neuron VMM array 2200, which is particularly suited for memory cells 210 as shown in FIG. 2 and is utilized as the synapses and parts of neurons between an input layer and the next layer. In VMM array 2200, the inputs $INPUT_0, \ldots, INPUT_N$ are received on bit lines $BL_0, \ldots BL_N$, respectively, and the outputs $OUTPUT_1$, $OUTPUT_2$, $OUTPUT_3$, and $OUTPUT_4$ are generated on source lines $SL_0$, $SL_1$, $SL_2$, and $SL_3$, respectively.

FIG. 23 depicts neuron VMM array 2300, which is particularly suited for memory cells 210 as shown in FIG. 2 and is utilized as the synapses and parts of neurons between an input layer and the next layer. In this example, the inputs $INPUT_0$, $INPUT_1$, $INPUT_2$, and $INPUT_3$ are received on source lines $SL_0$, $SL_1$, $SL_2$, and $SL_3$, respectively, and the outputs $OUTPUT_0, \ldots OUTPUT_N$ are generated on bit lines $BL_0, \ldots, BL_N$.

FIG. 24 depicts neuron VMM array 2400, which is particularly suited for memory cells 210 as shown in FIG. 2, and is utilized as the synapses and parts of neurons between an input layer and the next layer. In this example, the inputs $INPUT_0, \ldots, INPUT_M$ are received on word lines $WL_0, \ldots, WL_M$, respectively, and the outputs $OUTPUT_0, \ldots OUTPUT_N$ are generated on bit lines $BL_0, \ldots, BL_N$.

FIG. 25 depicts neuron VMM array 2500, which is particularly suited for memory cells 310 as shown in FIG. 3, and is utilized as the synapses and parts of neurons between an input layer and the next layer. In this example, the inputs $INPUT_0, \ldots, INPUT_M$ are received on word lines $WL_0, \ldots, WL_M$, respectively, and the outputs $OUTPUT_0, \ldots OUTPUT_N$ are generated on bit lines $BL_0, \ldots, BL_N$. Alternatively, the inputs can be received on control gate $CG_0, \ldots, CG_M$.

FIG. 26A depicts neuron VMM array 2600, which is particularly suited for memory cells 410 as shown in FIG. 4, and is utilized as the synapses and parts of neurons between an input layer and the next layer. In this example, the inputs $INPUT_0, \ldots, INPUT_n$ are received on vertical control gate lines $CG_0, \ldots, CG_N$, respectively, and the outputs $OUTPUT_1$ and $OUTPUT_2$ are generated on source lines $SL_0$ and $SL_1$.

FIG. 26B depicts neuron VMM array 2620, which is an alternative design of VMM array 2600 with the wordlines vertical instead of horizontal. In this instance, the inputs can be received on vertical word lines $WL_0$, $WL_1$, and the outputs $OUTPUT_1$ and $OUTPUT_2$ are generated on horizontal source lines $SL_0$ and $SL_1$.

FIG. 26C depicts neuron VMM array 2640, which is an alternative design of VMM array 2600 with erase gate lines vertical instead of horizontal. In this instance, the inputs can be received on vertical erase gate lines $EG_0$, $EG_1$, and the outputs $OUTPUT_1$ and $OUTPUT_2$ are generated on horizontal source lines $SL_0$ and $SL_1$. and the outputs $OUTPUT_1$ and $OUTPUT_2$ are generated on horizontal source lines $SL_0$ and $SL_1$.

FIG. 27 depicts neuron VMM array 2700, which is particularly suited for memory cells 410 as shown in FIG. 4, and is utilized as the synapses and parts of neurons between an input layer and the next layer. In this example, the inputs $INPUT_0, \ldots, INPUT_N$ are received on the gates of bit line control gates 2701-1, 2701-2, ..., 2701-(N−1), and 2701-N, respectively, which are coupled to bit lines $BL_0, \ldots, BL_N$, respectively. Exemplary outputs $OUTPUT_1$ and $OUTPUT_2$ are generated on source lines $SL_0$ and $SL_1$ FIG. 28 depicts neuron VMM array 2800, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0, \ldots, INPUT_M$ are received on word lines $WL_0, \ldots, WL_M$, and the outputs $OUTPUT_0, \ldots, OUTPUT_N$ are generated on bit lines $BL_0, \ldots, BL_N$, respectively. Alternatively, the inputs can be received on control gate lines $CG_0, \ldots, CG_M$.

FIG. 29 depicts neuron VMM array 2900, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0, \ldots, INPUT_M$ are received on control gate lines $CG_0, \ldots, CG_M$. Outputs $OUTPUT_0, \ldots, OUTPUT_N$ are generated on vertical source lines $SL_0, \ldots, SL_N$, respectively, where each source line $SL_i$ is coupled to the source lines of all memory cells in column i. Alternatively, the inputs can be received on word lines $WL_0, \ldots, WL_M$.

FIG. 30 depicts neuron VMM array 3000, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0, \ldots, INPUT_M$ are received on control gate lines $CG_0, \ldots, CG_M$. Outputs $OUTPUT_0, \ldots, OUTPUT_N$ are generated on vertical bit lines $BL_0, \ldots, BL_N$, respectively, where each bit line $BL_i$ is coupled to the bit lines of all memory cells in column i.

Long Short-Term Memory

The prior art includes a concept known as long short-term memory (LSTM). LSTM units often are used in neural networks. LSTM allows a neural network to remember information over predetermined arbitrary time intervals and to use that information in subsequent operations. A conventional LSTM unit comprises a cell, an input gate, an output gate, and a forget gate. The three gates regulate the flow of information into and out of the cell and the time interval that the information is remembered in the LSTM. VMMs are particularly useful in LSTM units.

FIG. 14 depicts an exemplary LSTM 1400. LSTM 1400 in this example comprises cells 1401, 1402, 1403, and 1404.

Cell 1401 receives input vector $x_0$ and generates output vector $h_0$ and cell state vector $c_0$. Cell 1402 receives input vector the output vector (hidden state) $h_0$ from cell 1401, and cell state $c_0$ from cell 1401 and generates output vector $h_1$ and cell state vector $c_1$. Cell 1403 receives input vector $x_2$, the output vector (hidden state) $h_1$ from cell 1402, and cell state $c_1$ from cell 1402 and generates output vector $h_2$ and cell state vector $c_2$. Cell 1404 receives input, vector $x_3$, the output vector (hidden state) $h_2$ from cell 1403, and cell state $c_2$ from cell 1403 and generates output vector $h_3$. Additional cells can be used, and an LSTM with four cells is merely an example.

FIG. 15 depicts an exemplary implementation of an LSTM cell 1500, which can be used for cells 1401, 1402, 1403, and 1404 in FIG. 14. LSTM cell 1500 receives input vector x(t), cell state vector c(t−1) from a preceding cell, and output, vector h(t−1) from a preceding cell, and generates cell state vector c(t) and output vector h(t).

LSTM cell 1500 comprises sigmoid function devices 1501, 1502, and 1503, each of which applies a number between 0 and 1 to control how much of each component m the input vector is allowed through to the output vector. LSTM cell 1500 also comprises tanh devices 1504 and 1505 to apply a hyperbolic tangent function to an input vector, multiplier devices 1506, 1507, and 1508 to multiply two vectors together, and addition device 1509 to add two vectors together. Output vector h(t) can be provided to the next LSTM cell in the system, or it can be accessed for other purposes.

FIG. 16 depicts an LSTM cell 1600, which is an example of an implementation of LSTM cell 1500. For the reader's convenience, the same numbering from LSTM cell 1500 is used in LSTM cell 1600. Sigmoid function devices 1501, 1502, and 1503 and tanh device 1504 each comprise multiple WM arrays 1601 and activation function blocks 1602 blocks 1602. Thus, it can be seen that VMM arrays are particular useful in LSTM cells used in certain neural network systems. The multiplier devices 1506, 1507, and 1508 and the addition device 1509 are implemented in a digital manner or in an analog manner. The activation function blocks 1602 can be implemented in a digital manner or in an analog manner.

An alternative to LSTM cell 1600 (and another example of an implementation of LSTM cell 1500) is shown in FIG. 17. In FIG. 17, sigmoid function devices 1501, 1502, and 1503 and tanh device 1504 share the same physical hardware (VMM arrays 1701 and activation function block 1702) in a time-multiplexed fashion. LSTM cell 1700 also comprises multiplier device 1703 to multiply two vectors together, addition device 1708 to add two vectors together, tanh device 1505 (which comprises activation function block 1702), register 1707 to store the value i(t) when i(t) is output from sigmoid function block 1702, register 1704 to store the value f(t)*c(t−1) when that value is output from multiplier device 1703 through multiplexor 1710, register 1705 to store the value i(t)*u(t) when that value is output from multiplier device 1703 through multiplexor 1710, and register 1706 to store the value o(t)*c−(t) when that value is output from multiplier device 1703 through multiplexor 1710, and multiplexor 1709.

Whereas LSTM cell 1600 contains multiple sets of VMM arrays 1601 and respective activation function blocks 1602, LSTM cell 1700 contains only one set of VMM arrays 1701 and activation function block 1702, which are used to represent multiple layers in the embodiment of LSTM cell 1700. LSTM cell 1700 will require less space than LSTM cell 1600, as LSTM cell 1700 will require ¼ as much space for VMMs and activation function blocks compared to LSTM cell 1600.

It can be further appreciated that LSTM units will typically comprise multiple VMM arrays, each of which requires functionality provided by certain circuit blocks outside of the VMM arrays, such as a summer and activation function block and high voltage generation blocks. Providing separate circuit blocks for each VMM array would require a significant amount of space within the semiconductor device and would be somewhat inefficient. The embodiments described below therefore attempt, to minimize the circuitry required outside of the VMM arrays themselves.

Gated Recurrent Units

An analog VMM implementation can be utilized for a GRU (gated recurrent unit) system. GRUs are a gating mechanism in recurrent neural networks. GRUs are similar to LSTMs, except that GRU cells generally contain fewer components than an LSTM cell.

FIG. 18 depicts an exemplary GRU 1800. GRU 1800 in this example comprises cells 1801, 1802, 1803, and 1804. Cell 1801 receives input vector $x_0$ and generates output vector $h_0$. Cell 1802 receives input vector $x_1$, the output vector $h_0$ from cell 1801 and generates output vector $h_1$. Cell 1803 receives input vector $x_2$ and the output vector (hidden state) $h_1$ from cell 1802 and generates output vector $h_2$. Cell 1804 receives input vector $x_3$ and the output vector (hidden state) $h_2$ from cell 1803 and generates output vector $h_3$. Additional cells can be used, and an GRU with four cells is merely an example.

FIG. 19 depicts an exemplary implementation of a GRU cell 1900, which can be used for cells 1801, 1802, 1803, and 1804 of FIG. 18. GRU cell 1900 receives input vector x(t) and output vector h(t−1) from a preceding GRU cell and generates output, vector h(t), GRU cell 1900 comprises sigmoid function devices 1901 and 1902, each of which applies a number between 0 and 1 to components from output vector h(t−1) and input vector x(t). GRU cell 1900 also comprises a tanh device 1903 to apply a hyperbolic tangent function to an input vector, a plurality of multiplier devices 1904, 1905, and 1906 to multiply two vectors together, an addition device 1907 to add two vectors together, and a complementary device 1908 to subtract an input from 1 to generate an output.

FIG. 20 depicts a GRU cell 2000, which is an example of an implementation of GRU cell 1900. For the reader's convenience, the same numbering from GM cell 1900 is used in GRU cell 2000. As can be seen in FIG. 20, sigmoid function devices 1901 and 1902, and tanh device 1903 each comprise multiple VMM arrays 2001 and activation function blocks 2002. Thus, it can be seen that WM arrays are of particular use in GRU cells used in certain neural network systems. The multiplier devices 1904, 1905, 1906, the addition device 1907, and the complementary device 1908 are implemented in a digital manner or in an analog manner. The activation function blocks 2002 can be implemented in a digital manner or in an analog manner.

An alternative to GRU cell 2000 (and another example of an implementation of GRU cell 1900) is shown in FIG. 21. In FIG. 21, GRU cell 2100 utilizes VMM arrays 2101 and activation function block 2102, which when configured as a sigmoid function applies a number between 0 and 1 to control how much of each component in the input vector is allowed through to the output vector. In FIG. 21, sigmoid function devices 1901 and 1902 and tanh device 1903 share the same physical hardware (VMM arrays 2101 and activation function block 2102) in a time-multiplexed fashion. GRU cell 2100 also comprises multiplier device 2103 to multiply two vectors together, addition device 2105 to add two vectors together, complementary device 2109 to subtract an input from 1 to generate an output, multiplexor 2104, register 2106 to hold the value h(t−1) r(t) when that value is output from multiplier device 2103 through multiplexor 2104, register 2107 to hold the value h(t−1)*z(t) when that value is output from multiplier device 2103 through multiplexor 2104, and register 2108 to hold the value hˆ(t)*(1−z(t)) when that value is output from multiplier device 2103 through multiplexor 2104.

Whereas GRU cell 2000 contains multiple sets of VMM arrays 2001 and activation function blocks 2002, GRU cell 2100 contains only one set of VMM arrays 2101 and activation function block 2102, which are used to represent multiple layers in the embodiment of GRU cell 2100. GRU cell 2100 will require less space than GRU cell 2000, as GRU cell 2100 will require ⅓ as much space for VMMs and activation function blocks compared to GRU cell 2000.

It can be further appreciated that GRU systems will typically comprise multiple VMM arrays, each of which requires functionality provided by certain circuit blocks outside of the VMM arrays, such as a summer and activation function block and high voltage generation blocks. Providing separate circuit blocks for each VMM array would require a significant amount of space within the semiconductor device and would be somewhat inefficient. The embodiments described below therefore attempt to minimize the circuitry required outside of Elle VMM arrays themselves.

The input to the VMM arrays can be an analog level, a binary level, a pulse, a time modulated pulse, or digital bits (in this case a DAC is needed to convert digital bits to appropriate input analog level) and the output can be an analog level, a binary level, a timing pulse, pulses, or digital bits (in this case an output ADC is needed to convert output analog level into digital bits).

In general, for each memory cell in a VMM array, each weight W can be implemented by a single memory cell or by a differential cell or by two blend memory cells (average of 2 cells). In the differential cell case, two memory cells are needed to implement a weight W as a differential weight (W=W+−W−). In the two blend memory cells, two memory cells are needed to implement a weight W as an average of two cells.

Each non-volatile memory cells used in the analog neuromorphic memory system must be erased and programmed to hold a very specific and precise amount of charge, i.e., the number of electrons, in the floating gate. For example, each floating gate must hold one of N different values, where N is the number of different weights that can be indicated by each cell. Examples of N include 16, 32, 64, 128, and 256.

There is a need in VMM systems to increase throughput and decrease latency as much as possible, while reducing the overall amount of space required for memory cells and supporting circuitry.

SUMMARY OF THE INVENTION

Numerous embodiments are disclosed for splitting an array into multiple parts in an analog neural memory in a deep learning artificial neural network, where each part interacts with certain circuitry dedicated to that part and other circuitry that is shared with one or more other parts.

DETAILED DESCRIPTION OF THE INVENTION

The artificial neural networks of the present invention utilize a combination of CMOS technology and non-volatile memory arrays.

VMM System Overview

Figure 1:
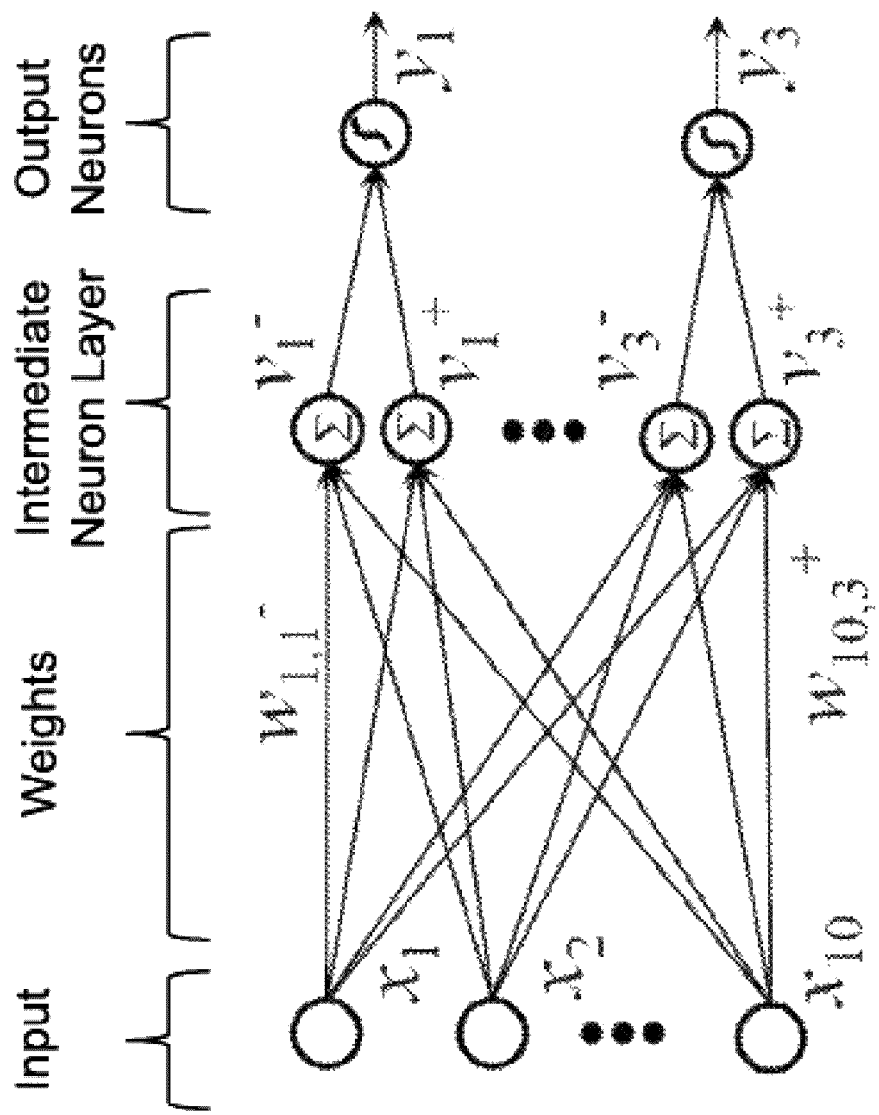
FIG. 1 is a diagram that illustrates an artificial neural network.
Figure 2:
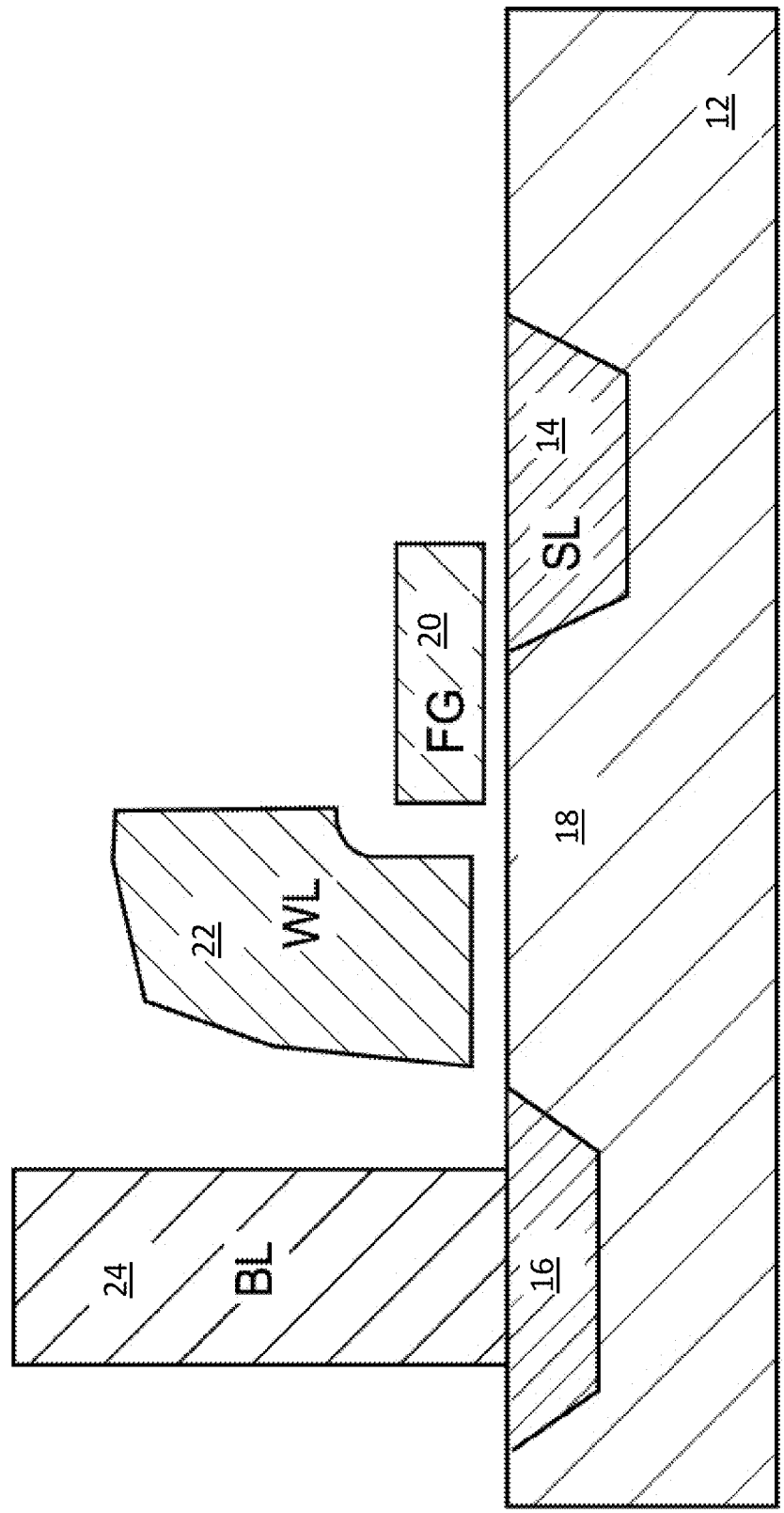
FIG. 2 depicts a prior art split gate flash memory cell.
Figure 3:
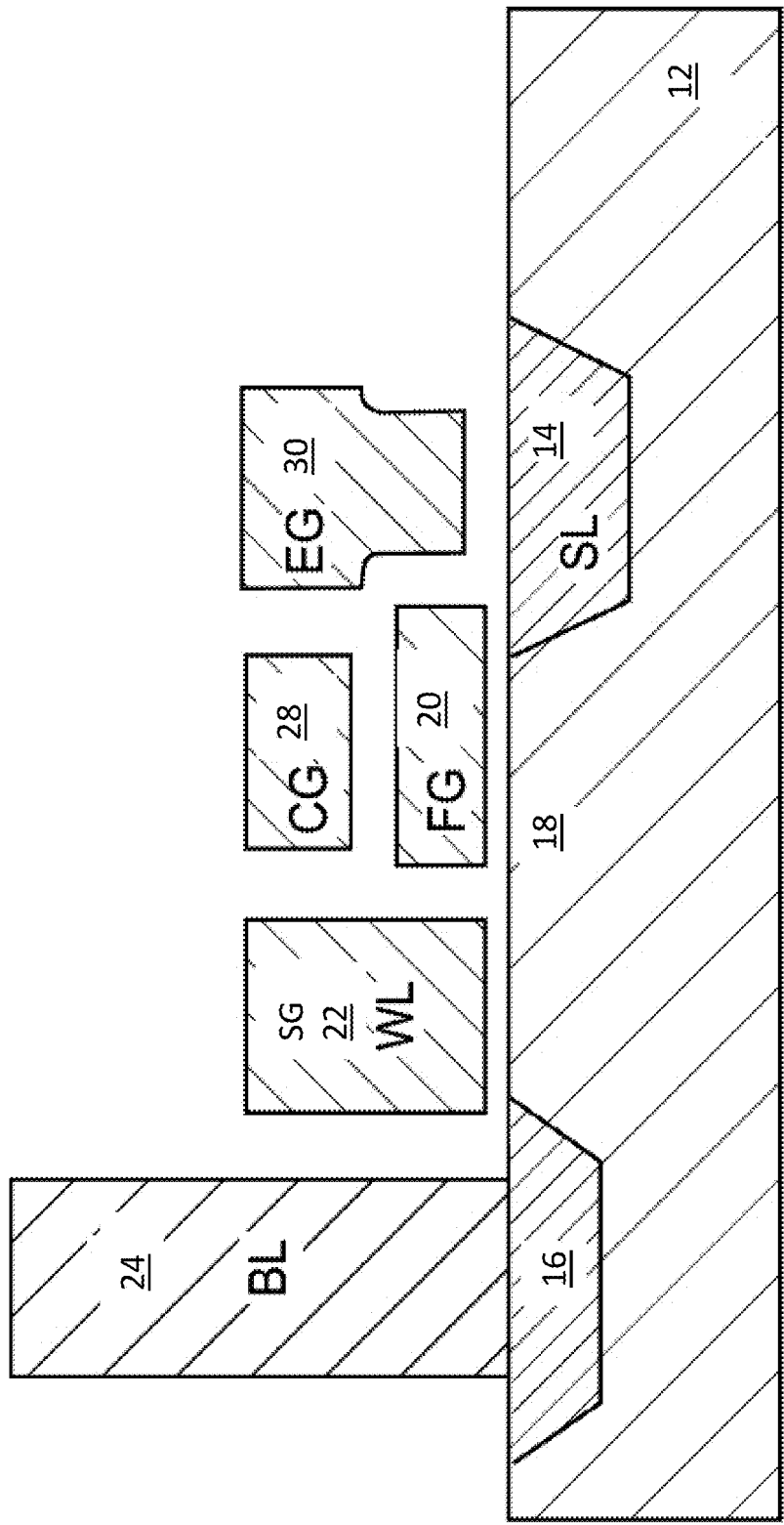
FIG. 3 depicts another prior art split gate flash memory cell.
Figure 4:
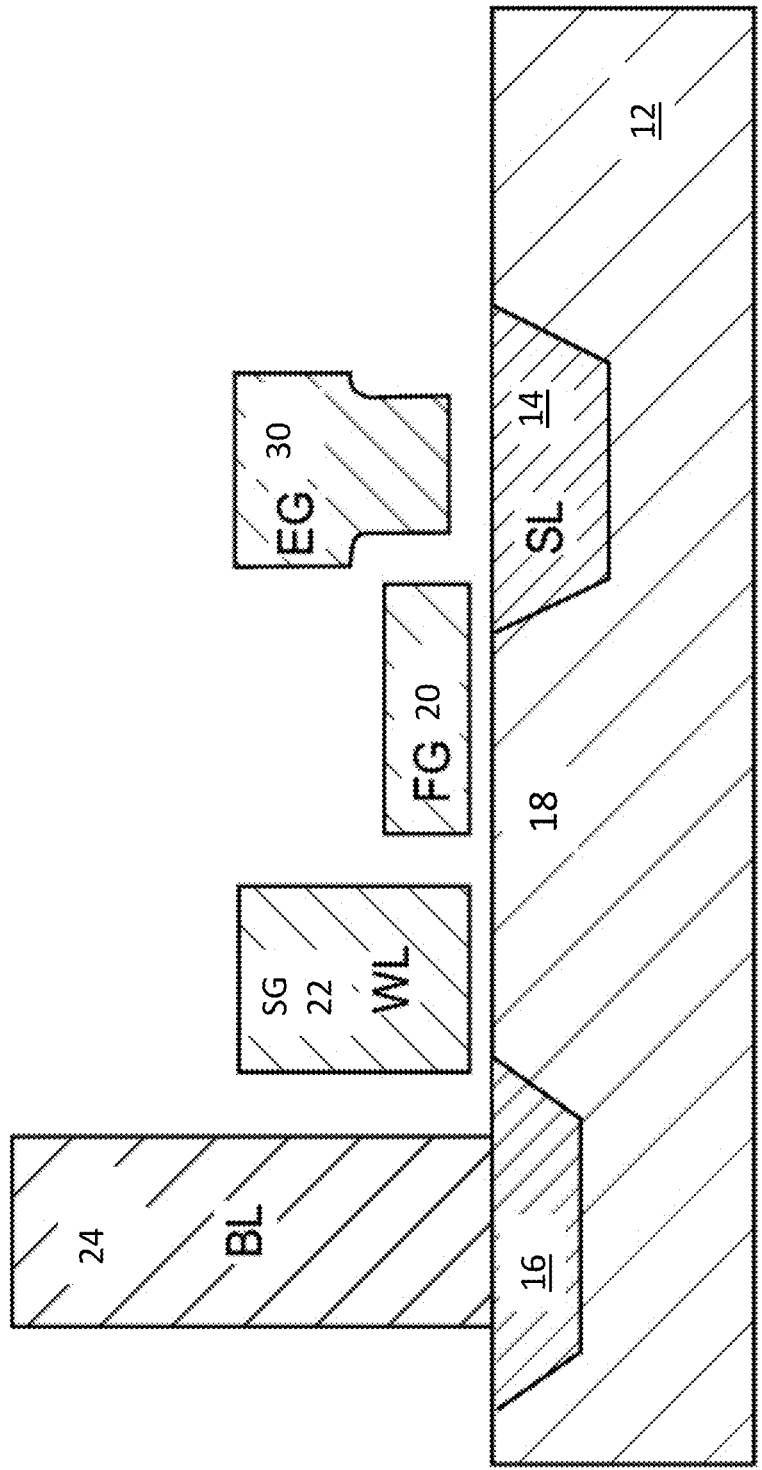
FIG. 4 depicts another prior art split gate flash memory cell.
Figure 5:
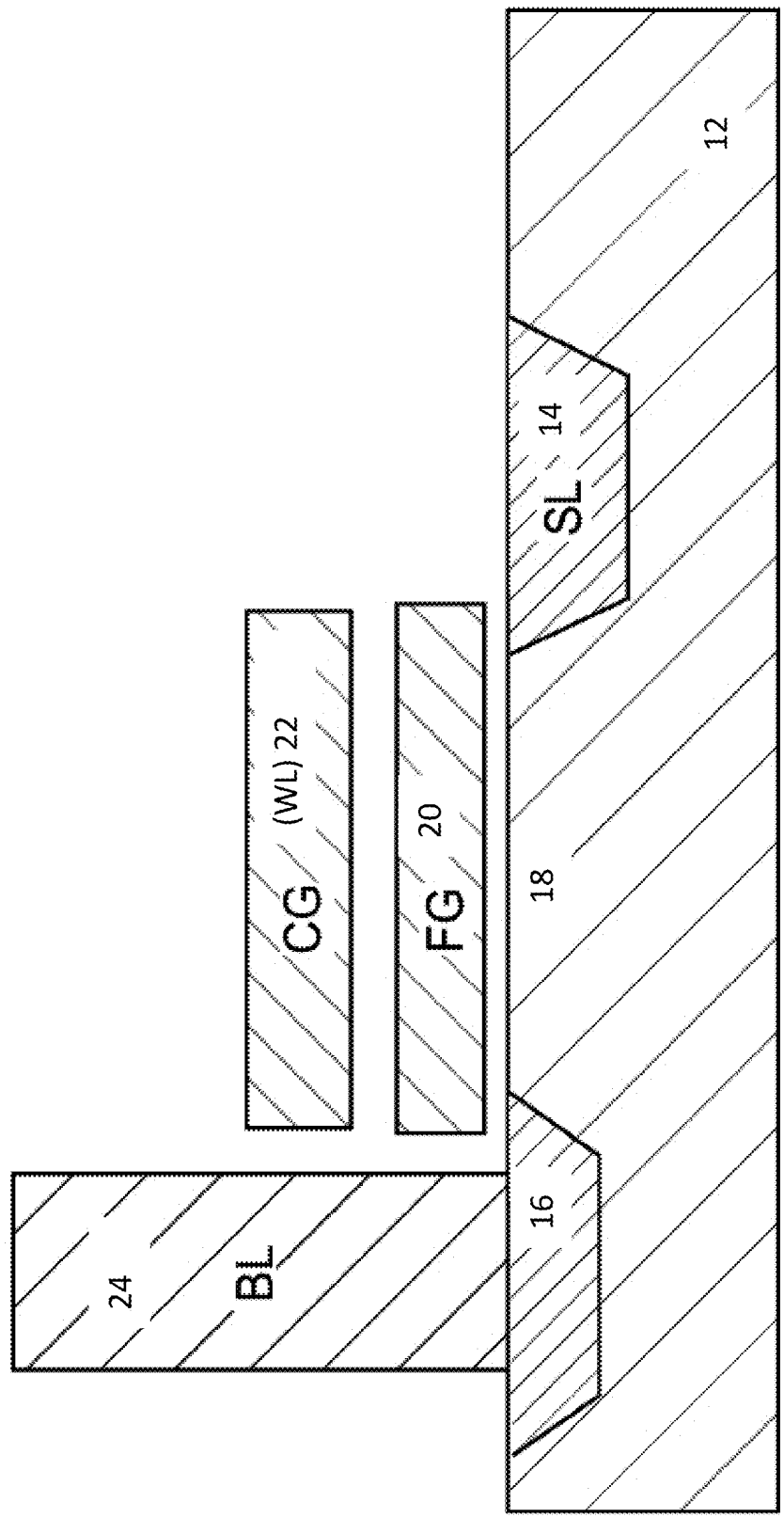
FIG. 5 depicts another prior art split gate flash memory cell.
Figure 6:
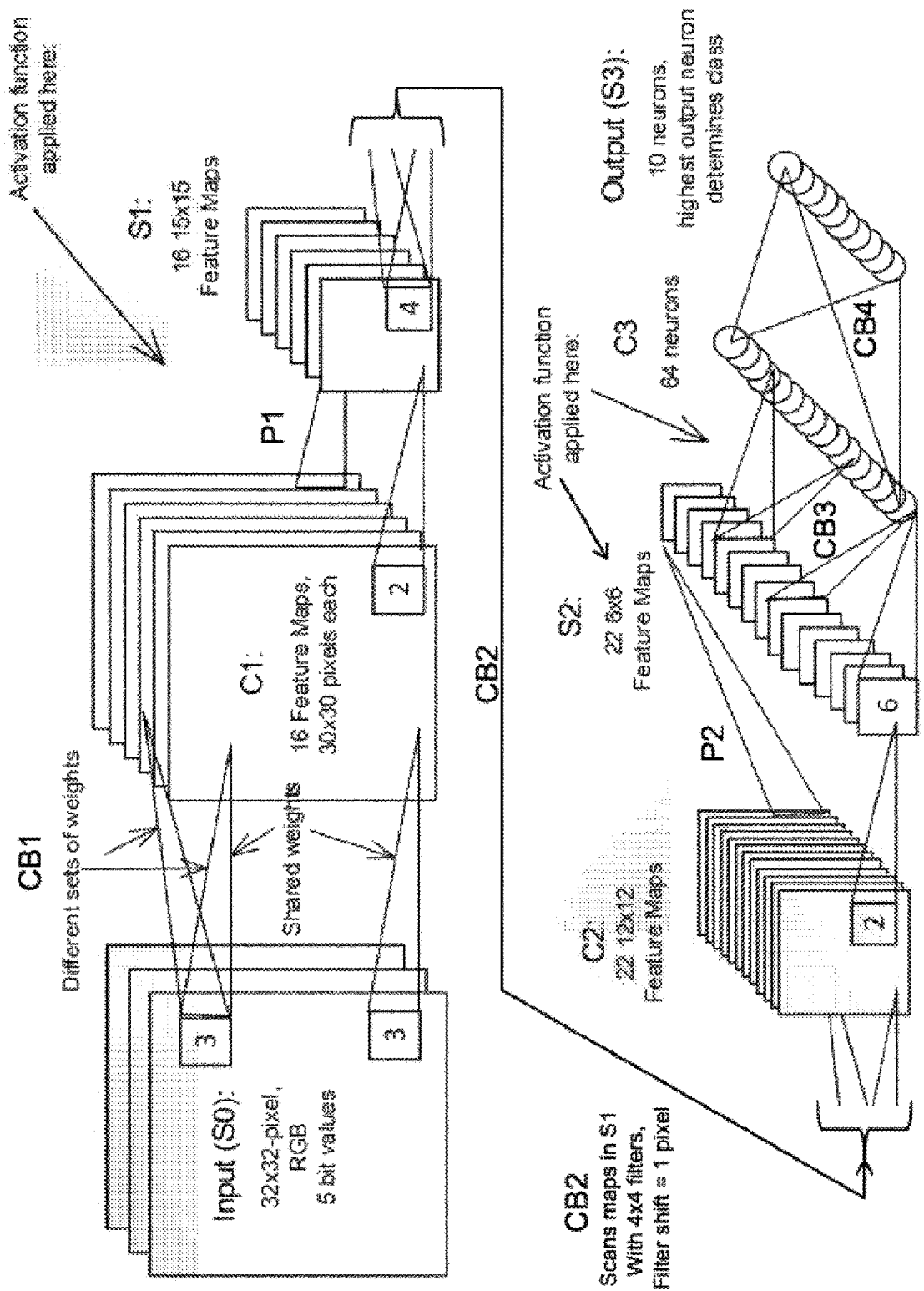
FIG. 6 is a diagram illustrating the different levels of an exemplary artificial neural network utilizing one or more non-volatile memory arrays.
Figure 7:
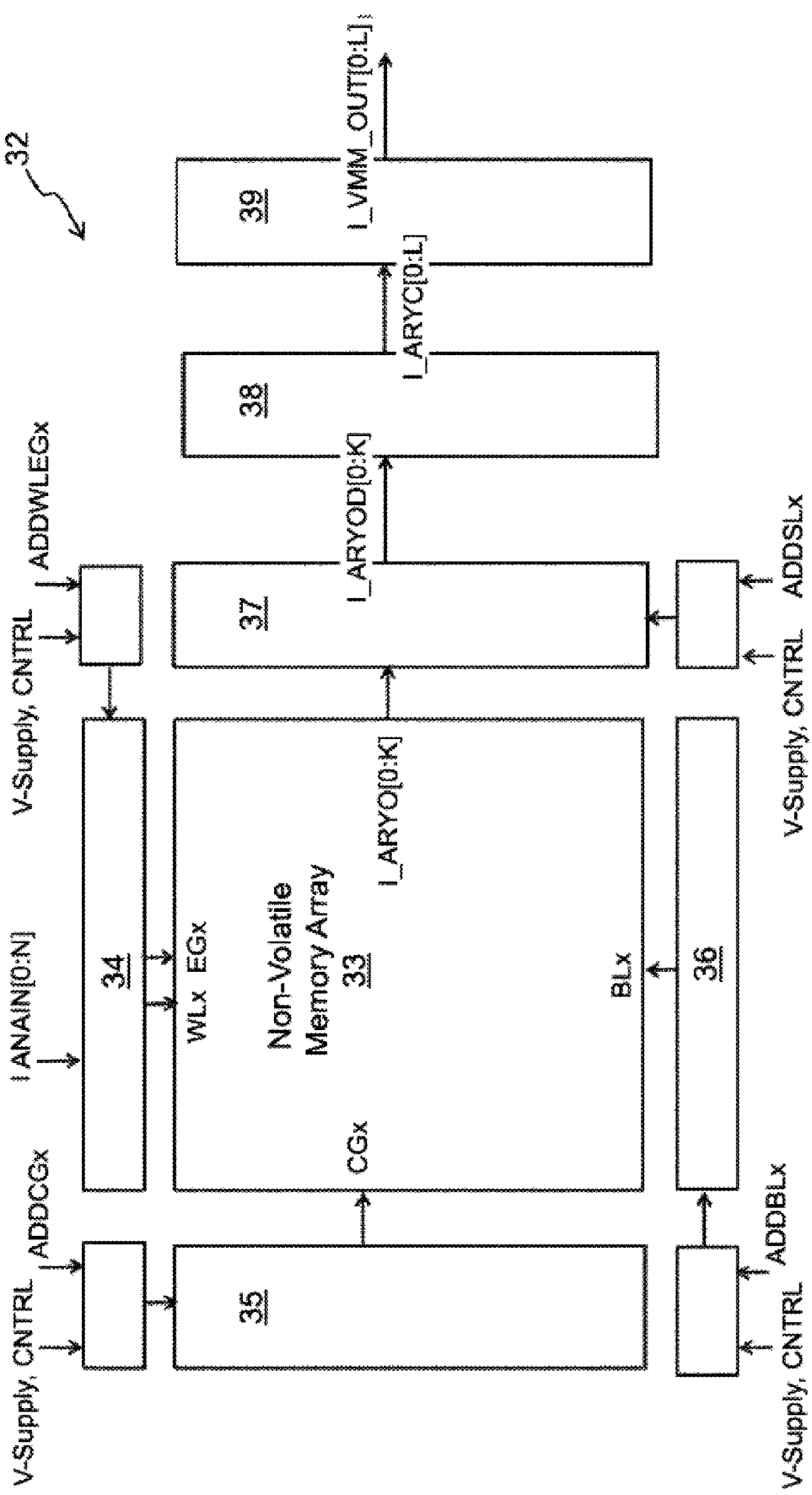
FIG. 7 is a block diagram illustrating a vector-by-matrix multiplication system.
Figure 8:
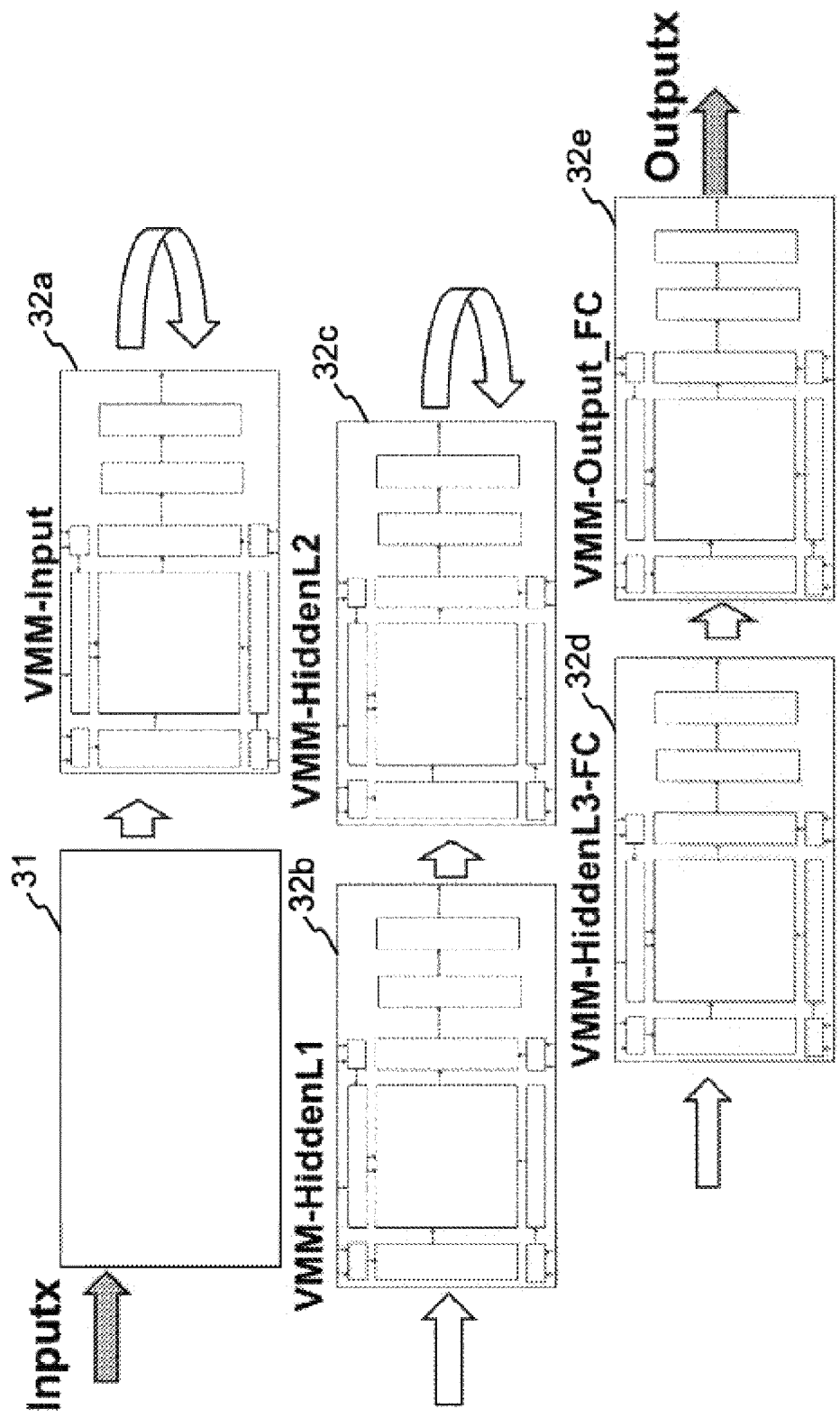
FIG. 8 is a block diagram illustrates an exemplary artificial neural network utilizing one or more vector-by-matrix multiplication systems.
Figure 9:
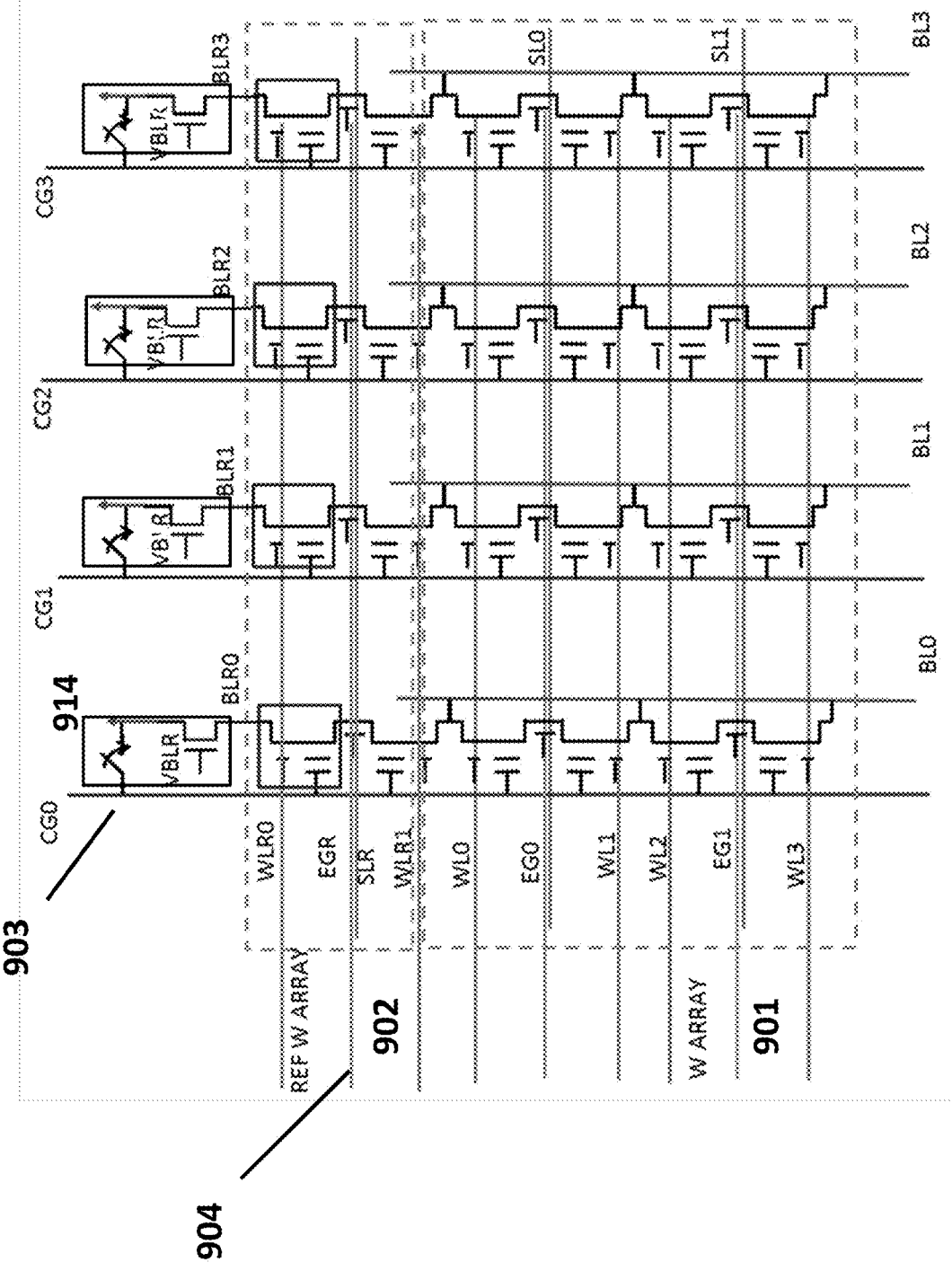
FIG. 9 depicts another embodiment of a vector-by-matrix multiplication system.
Figure 10:
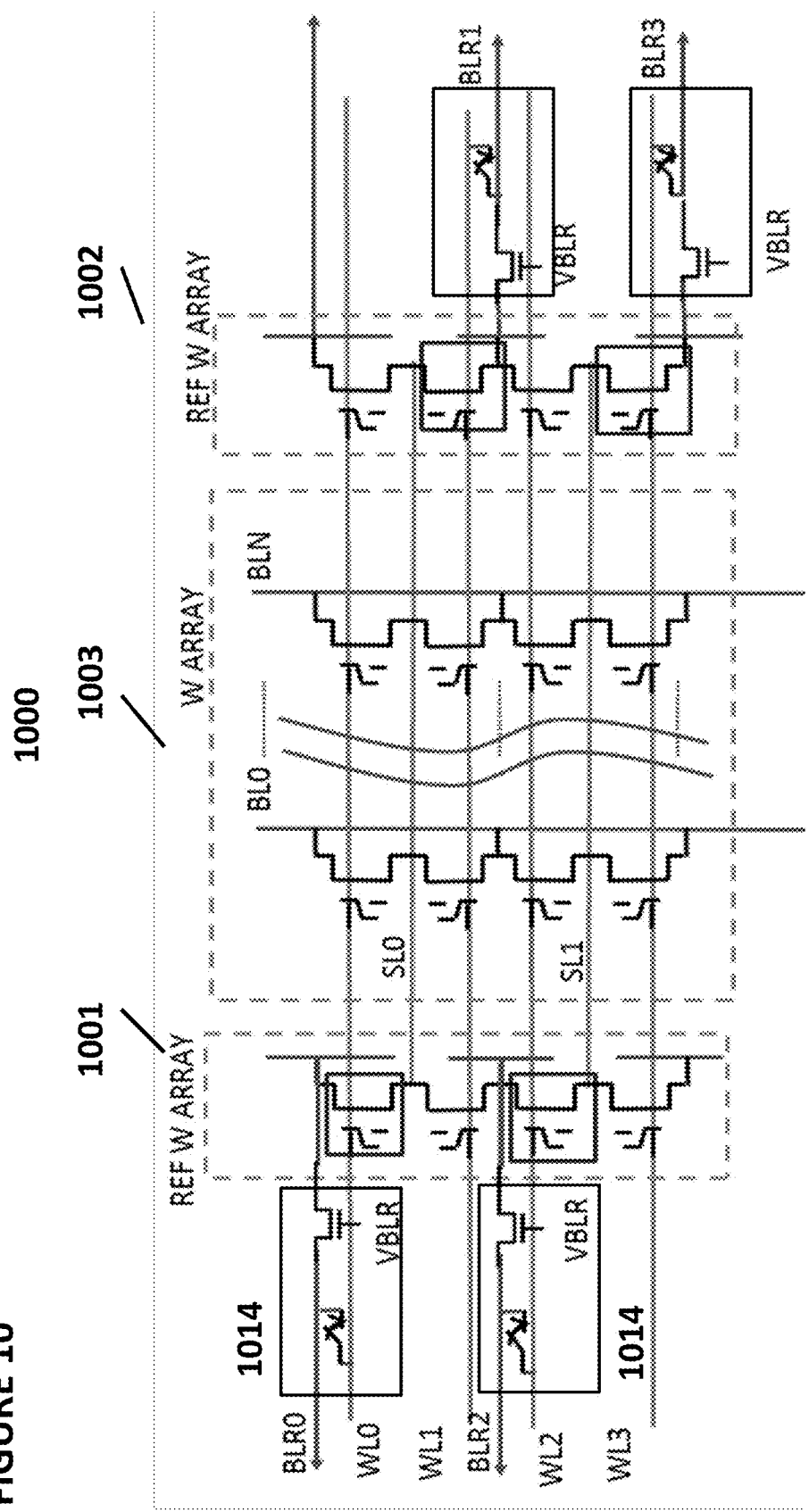
FIG. 10 depicts another embodiment of a vector-by-matrix multiplication system.
Figure 11:
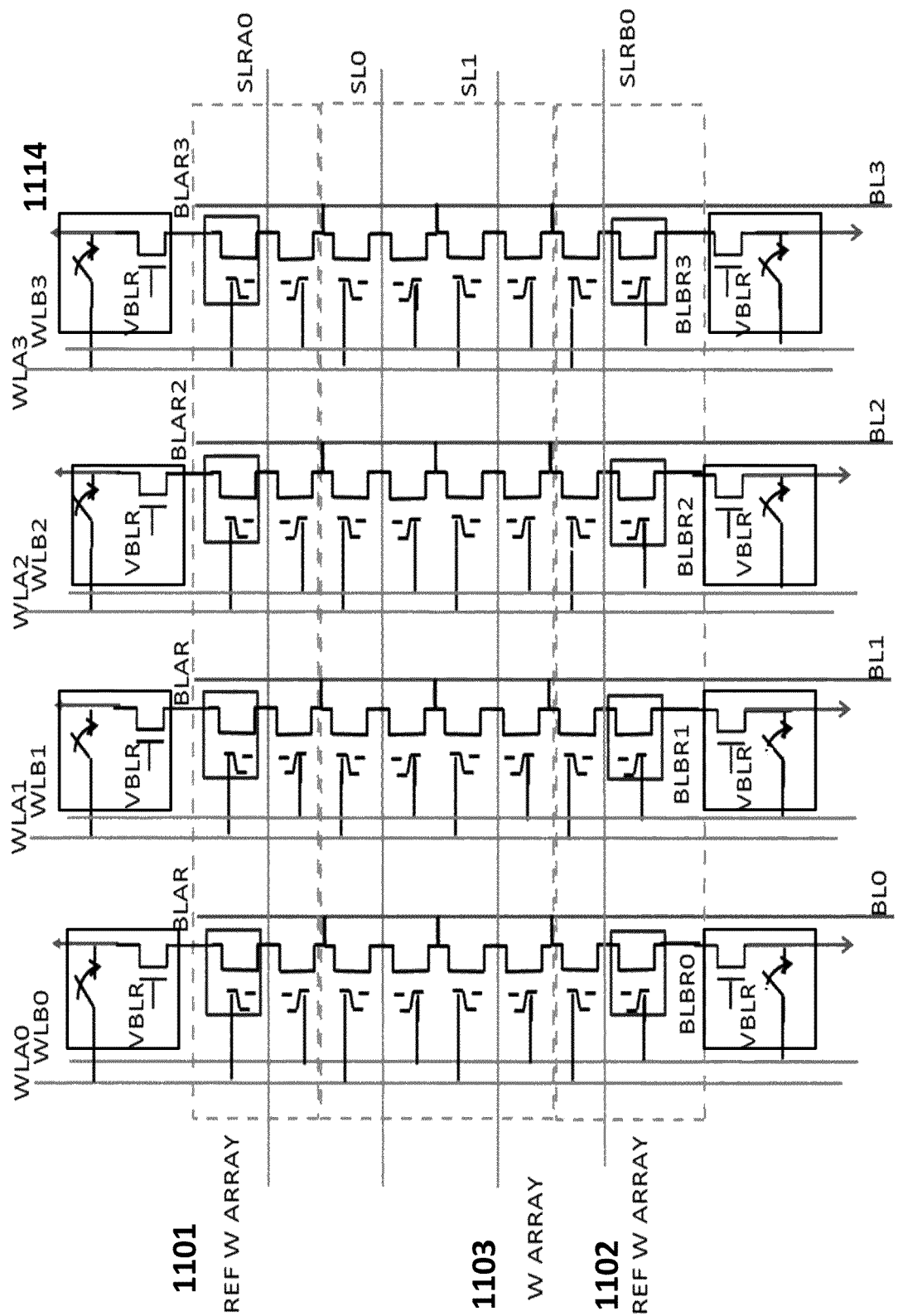
FIG. 11 depicts another embodiment of a vector-by-matrix multiplication system.
Figure 12:
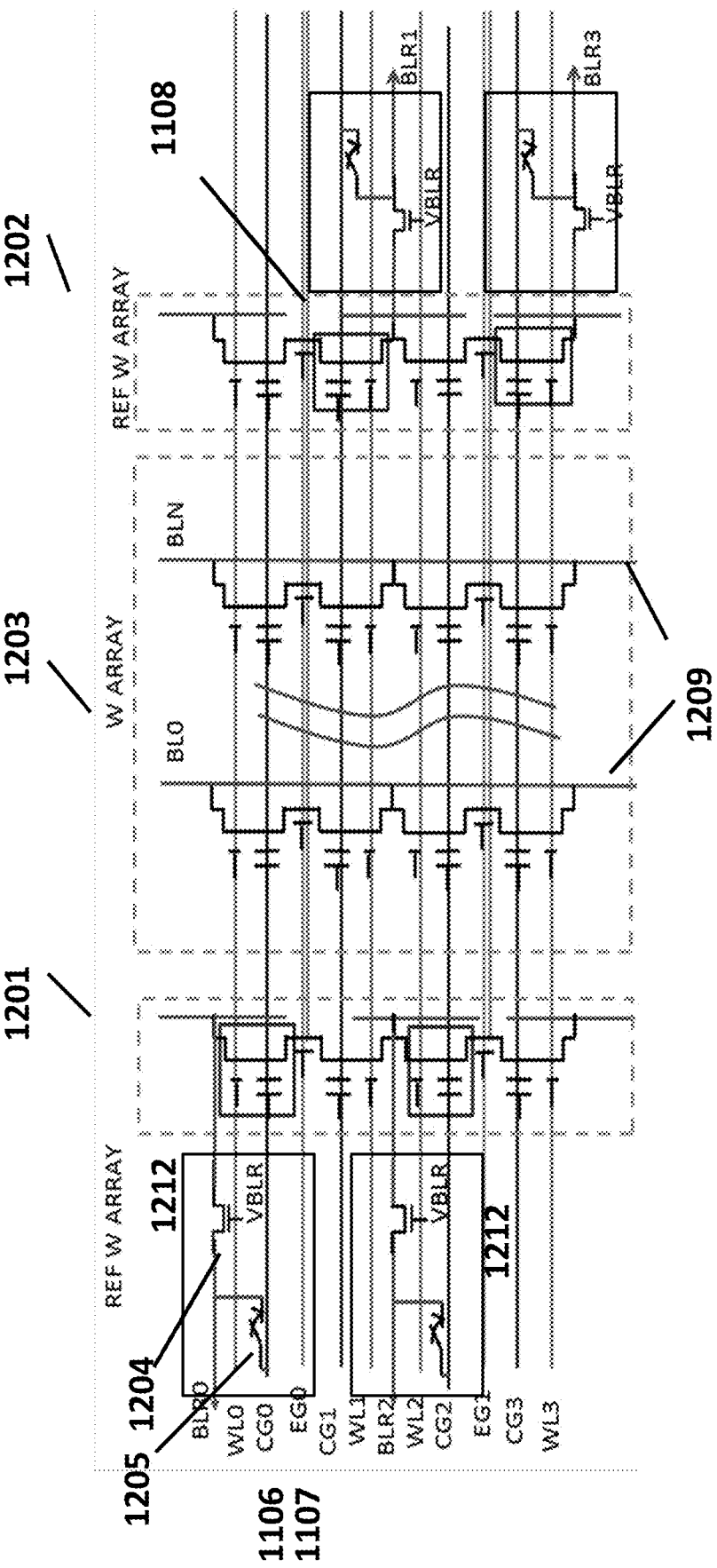
FIG. 12 depicts another embodiment of a vector-by-matrix multiplication system.
Figure 13:
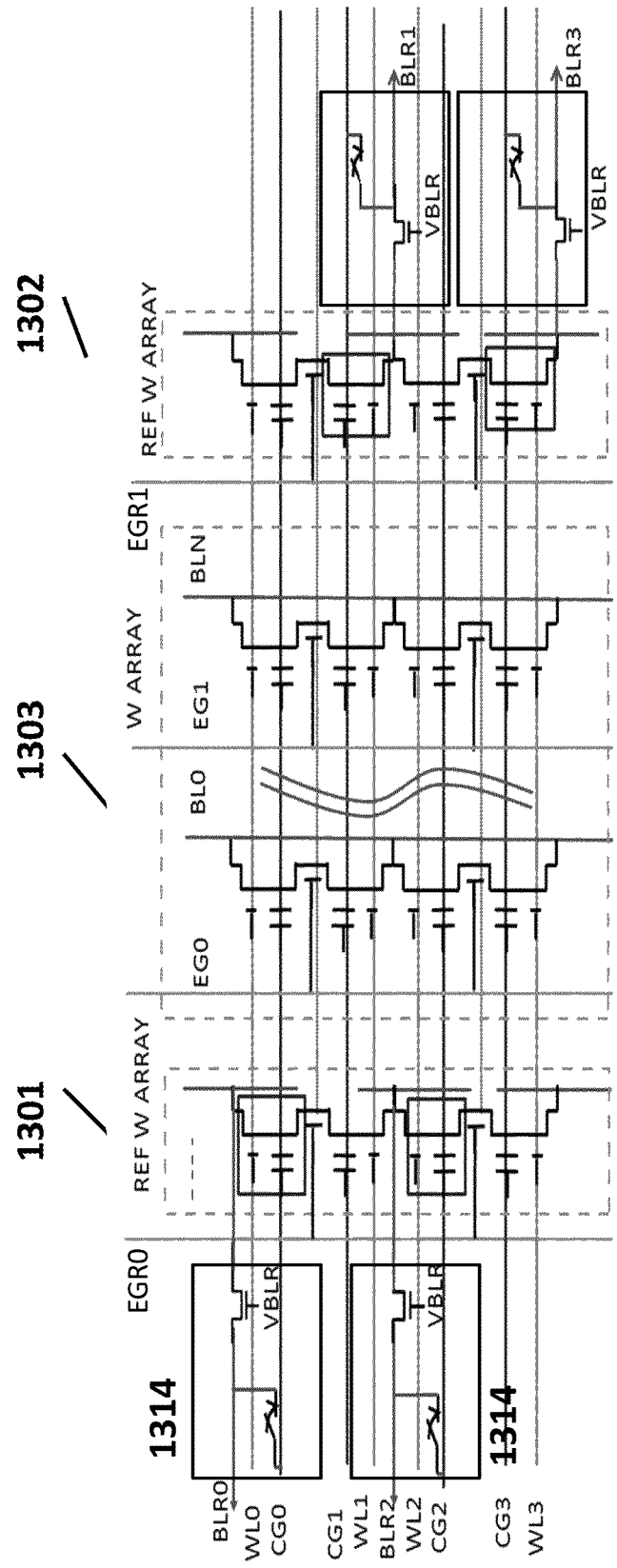
FIG. 13 depicts another embodiment of a vector-by-matrix multiplication system.
Figure 14:
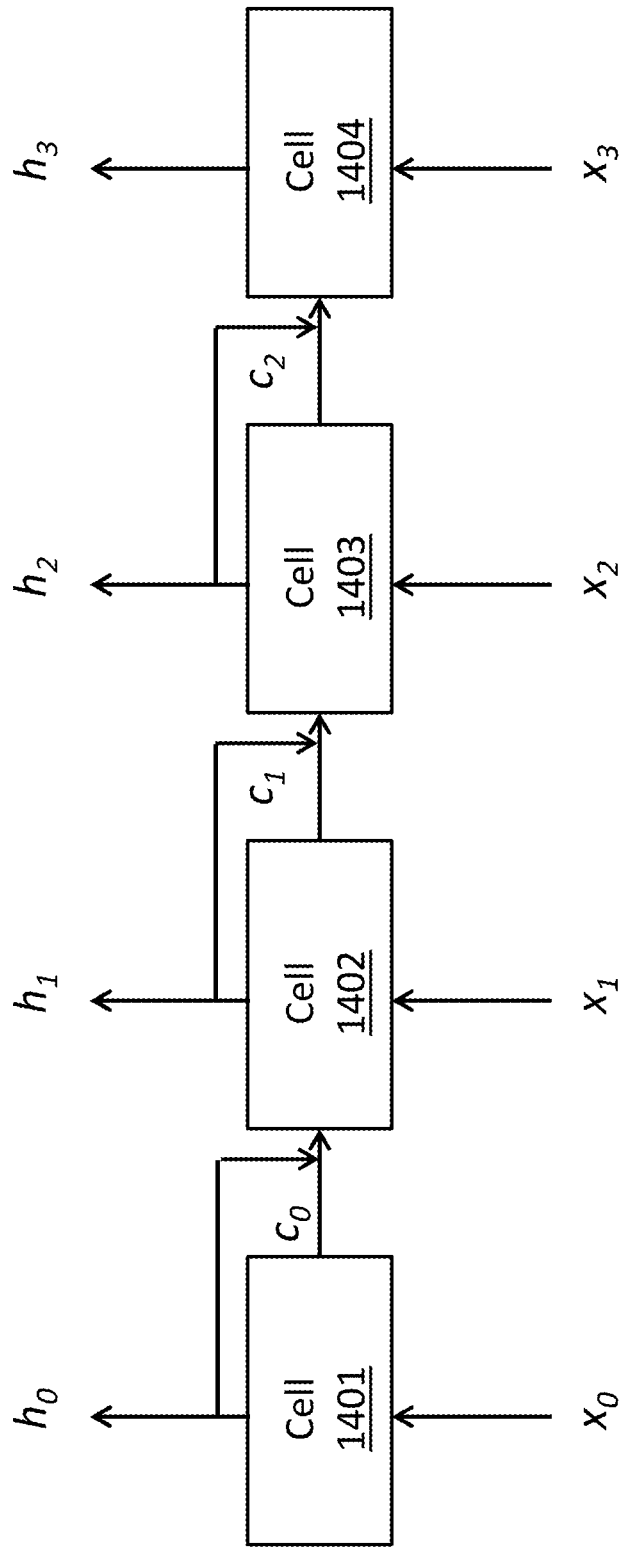
FIG. 14 depicts a prior art long short-term memory system.
Figure 15:
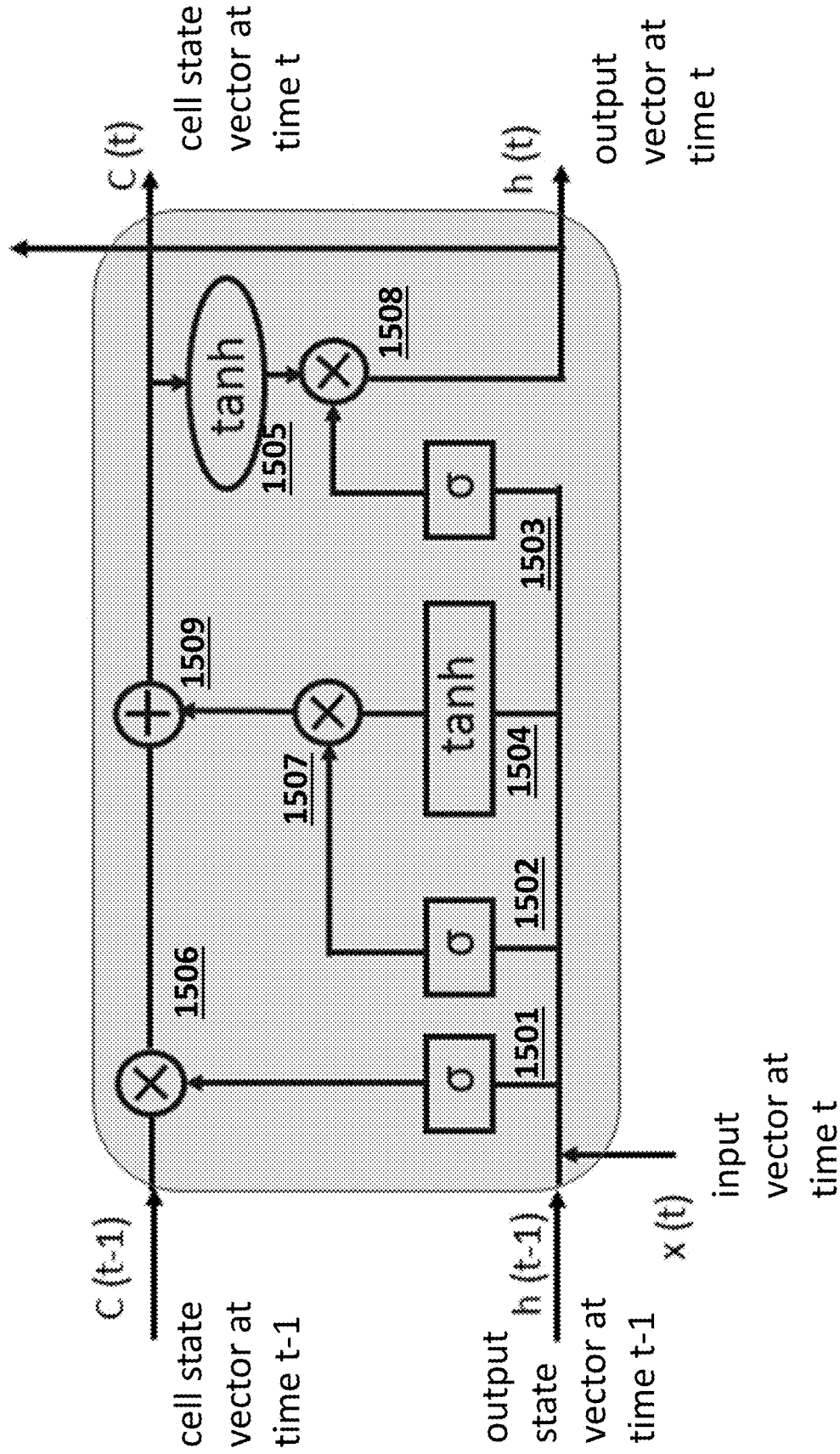
FIG. 15 depicts an exemplary cell for use in a long short-term memory system.
Figure 16:
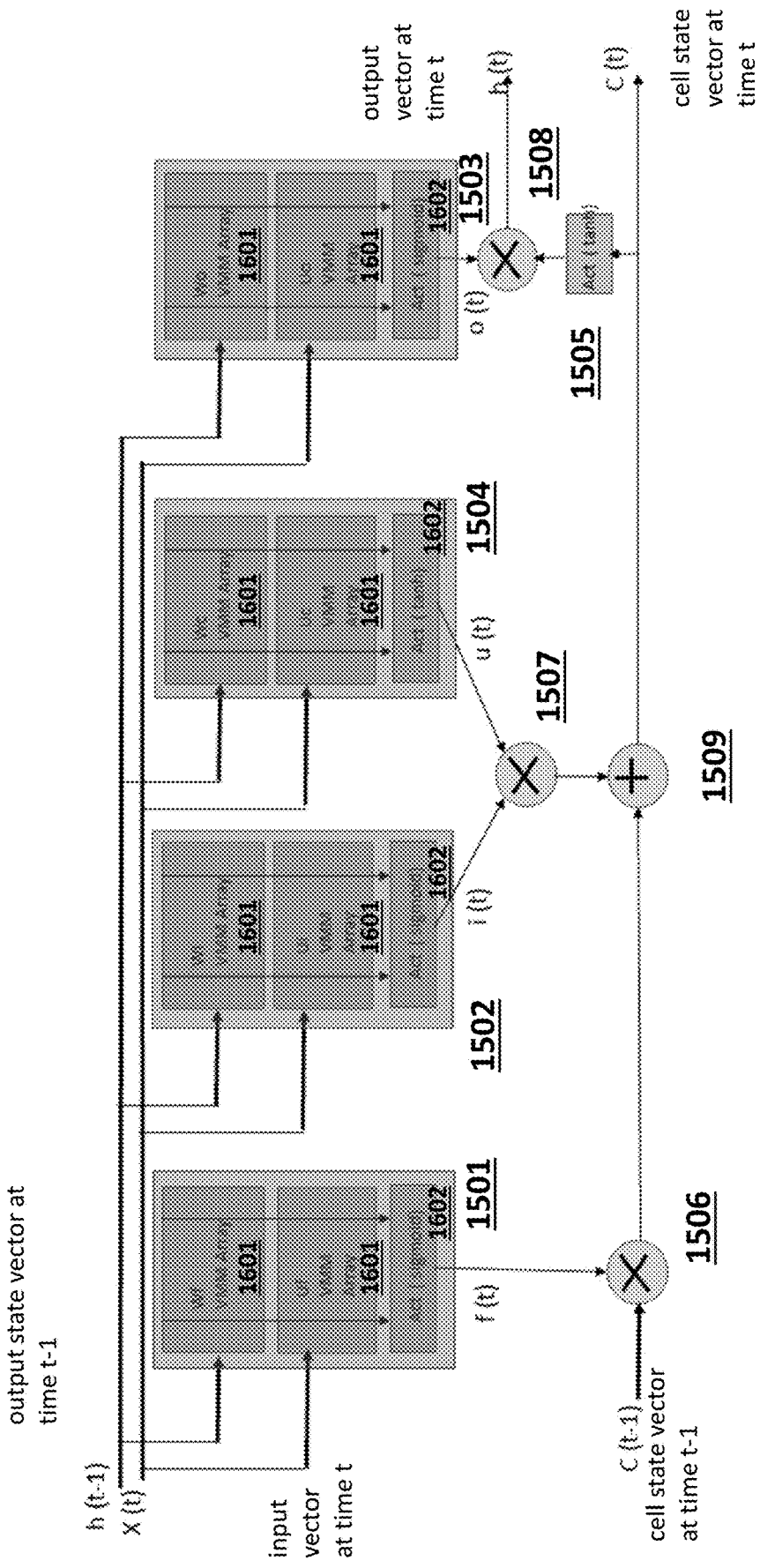
FIG. 16 depicts an embodiment of the exemplary cell of FIG. 15.
Figure 17:
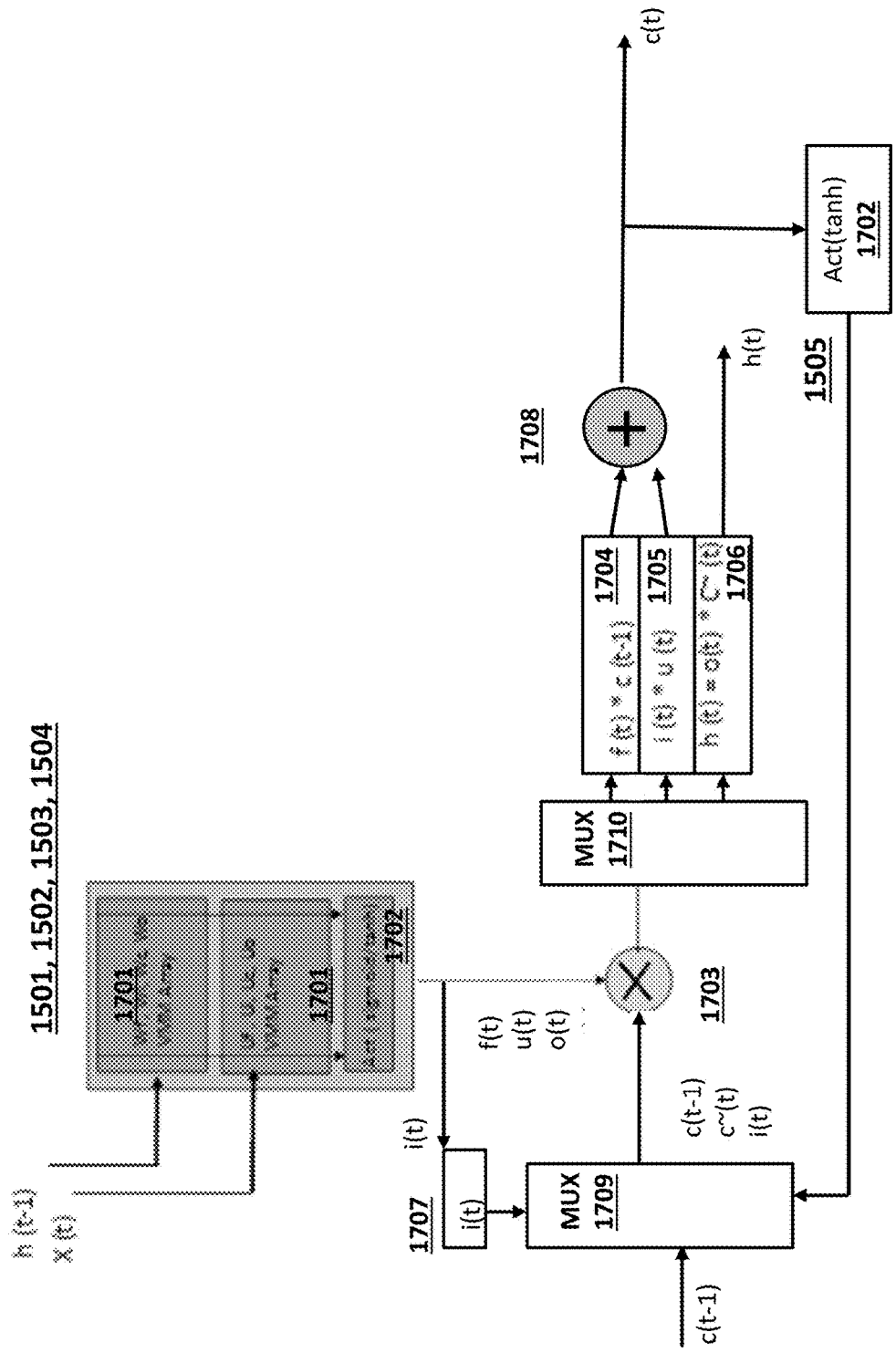
FIG. 17 depicts another embodiment of the exemplary cell of FIG. 15.
Figure 18:
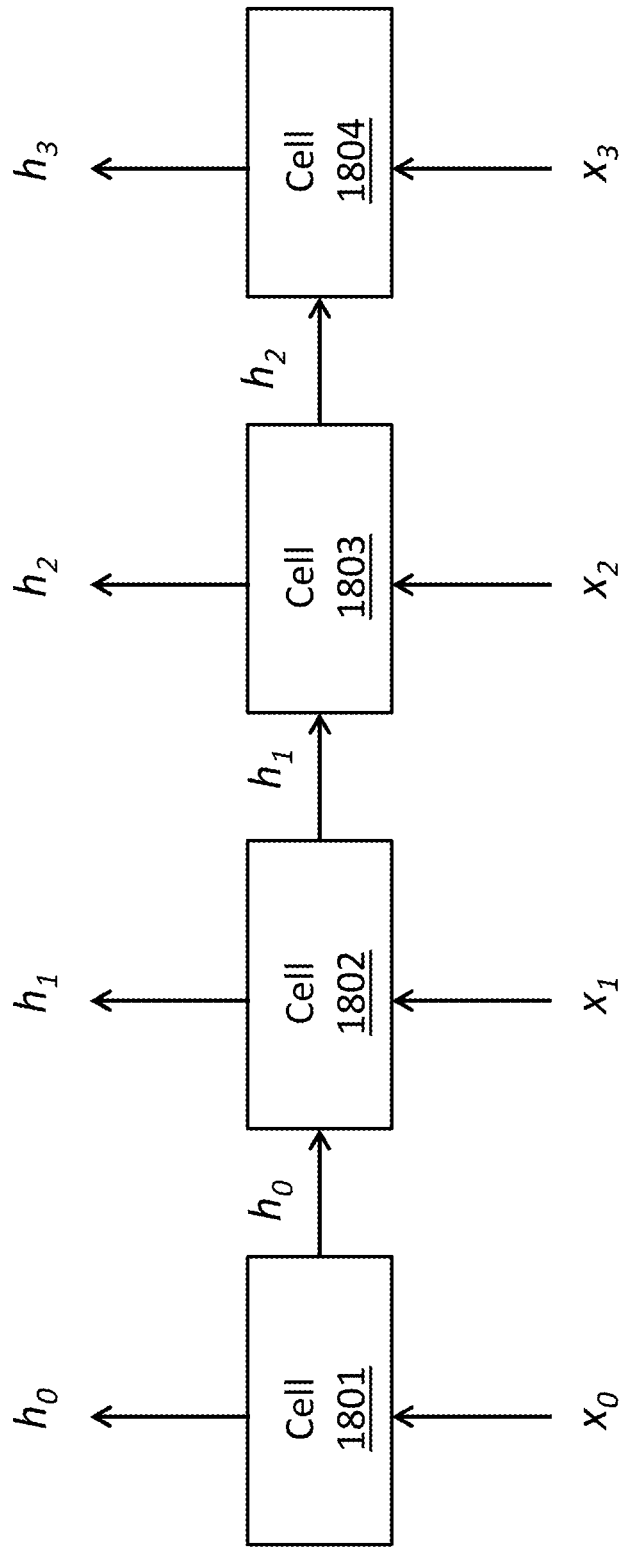
FIG. 18 depicts a prior art gated recurrent unit system.
Figure 19:
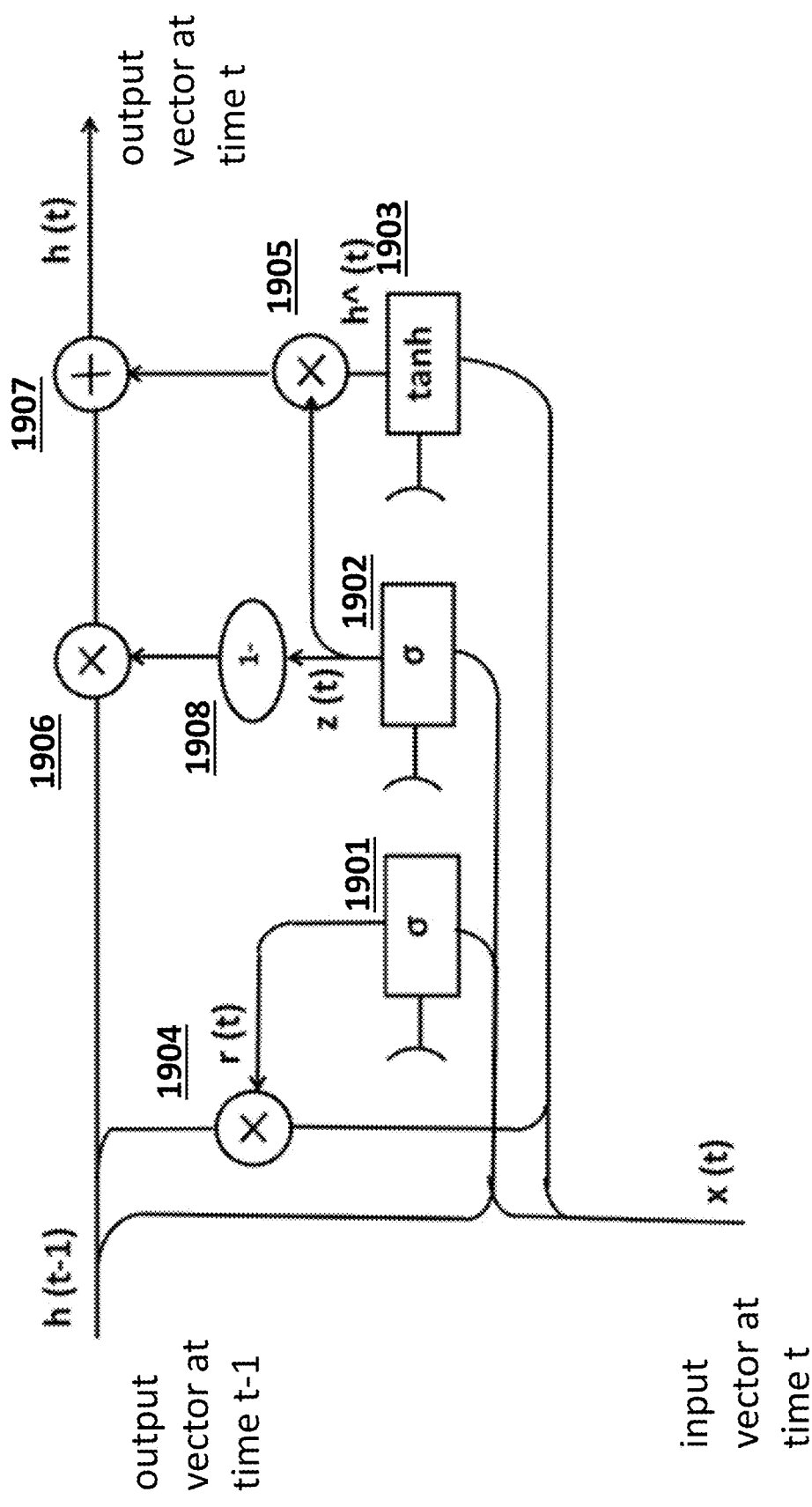
FIG. 19 depicts an exemplary cell for use in a gated recurrent unit system.
Figure 20:
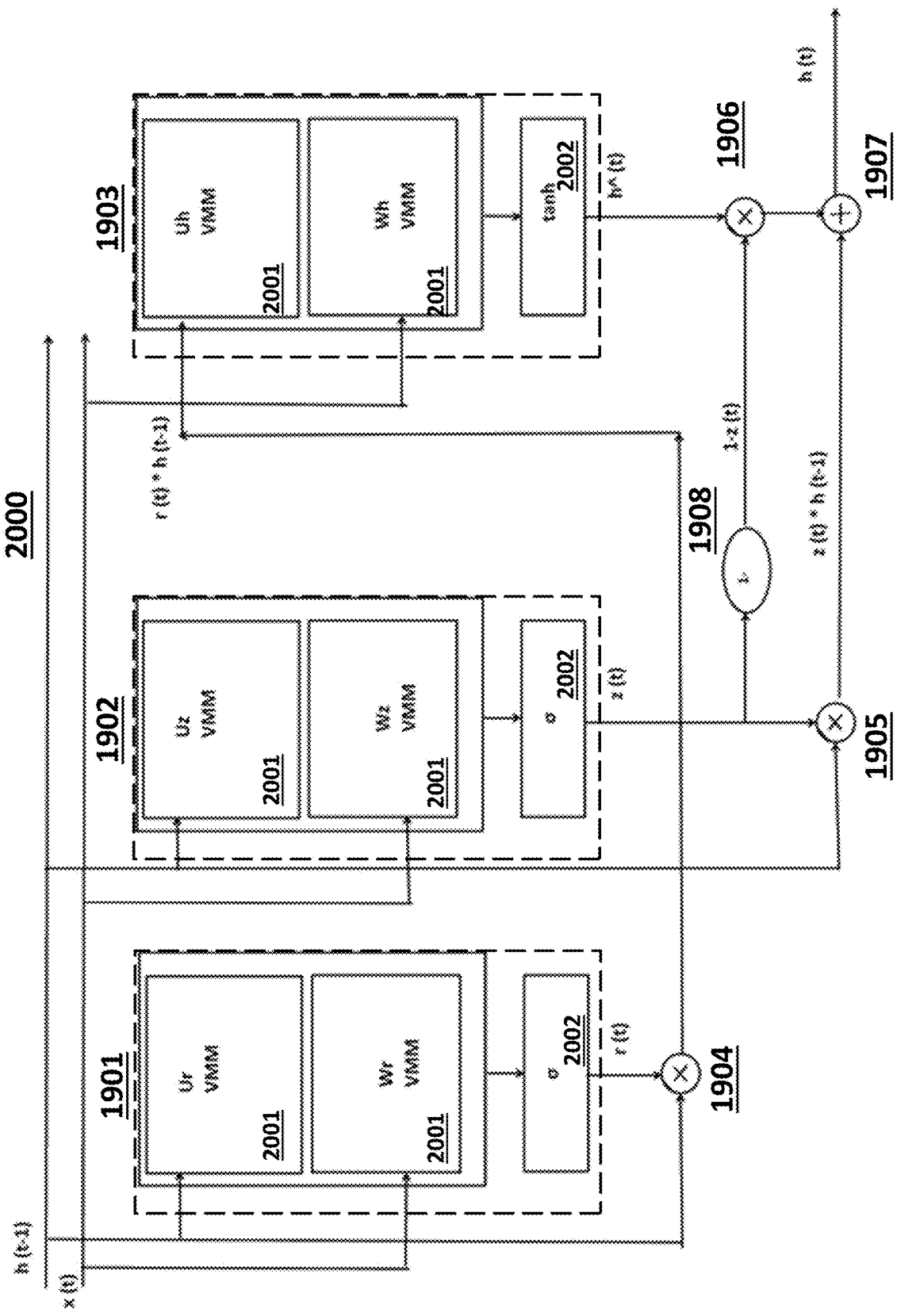
FIG. 20 depicts an embodiment of the exemplary cell of FIG. 19.
Figure 21:
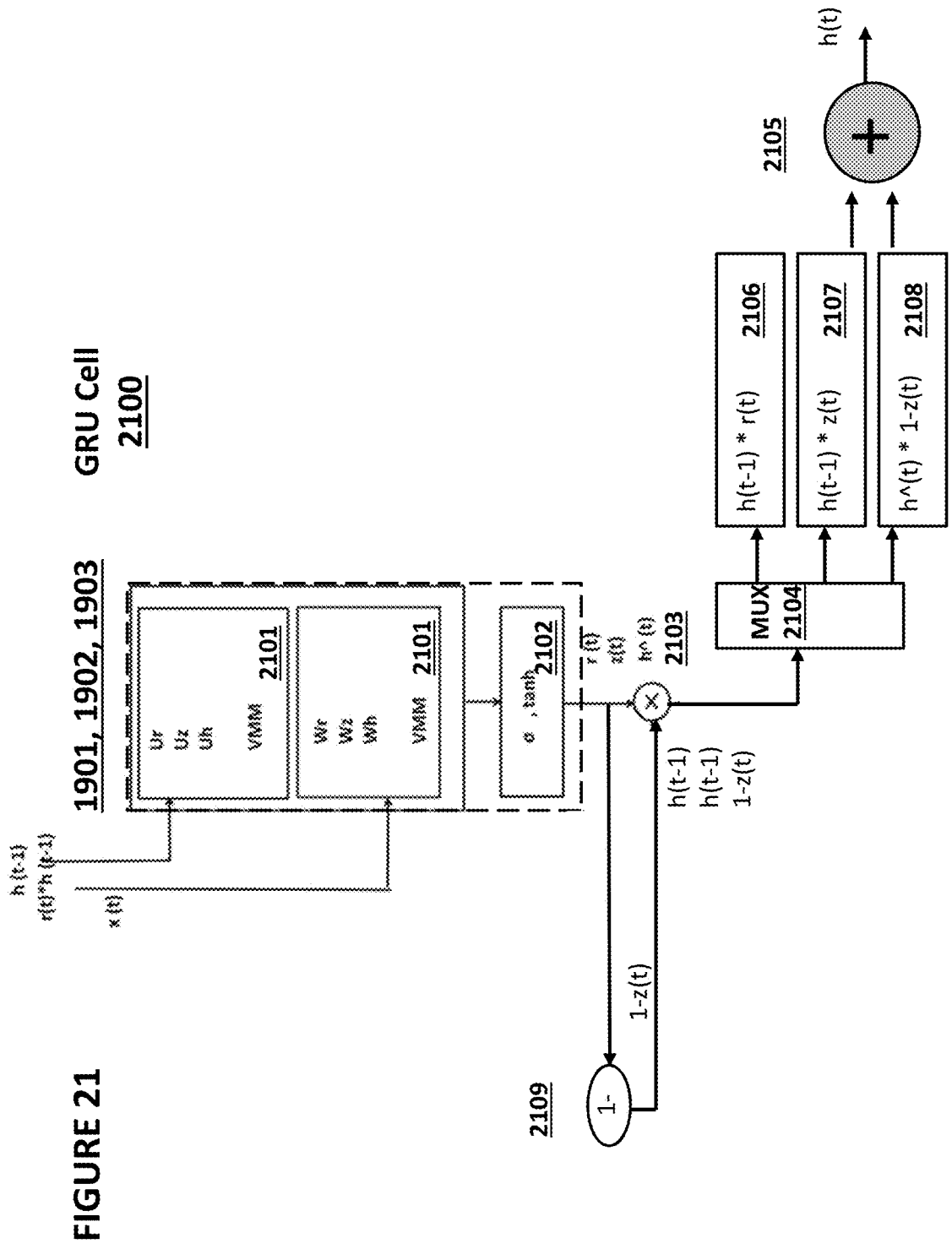
FIG. 21 depicts another embodiment of the exemplary cell of FIG. 19.
Figure 22:
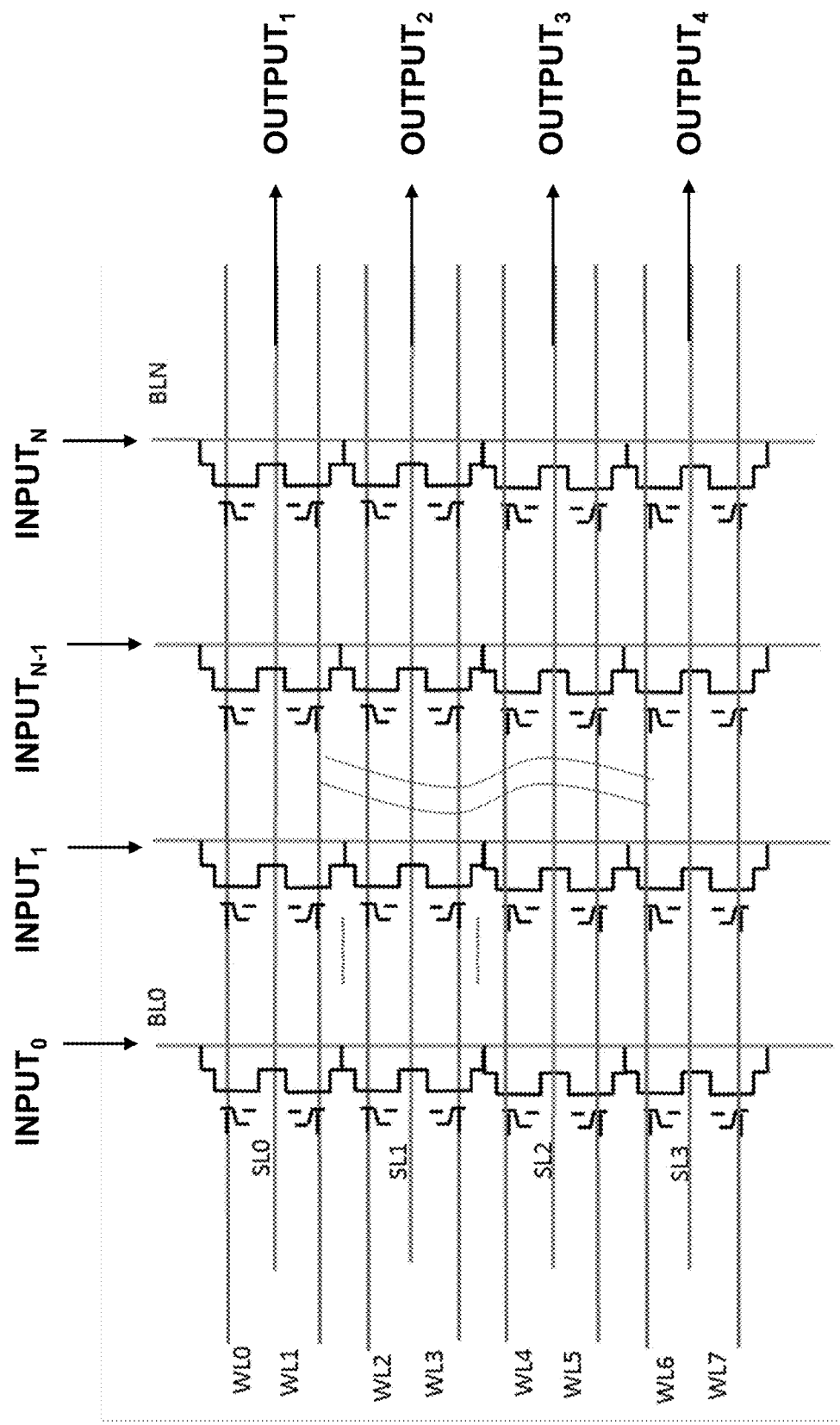
FIG. 22 depicts another embodiment of a vector-by-matrix multiplication system.
Figure 23:
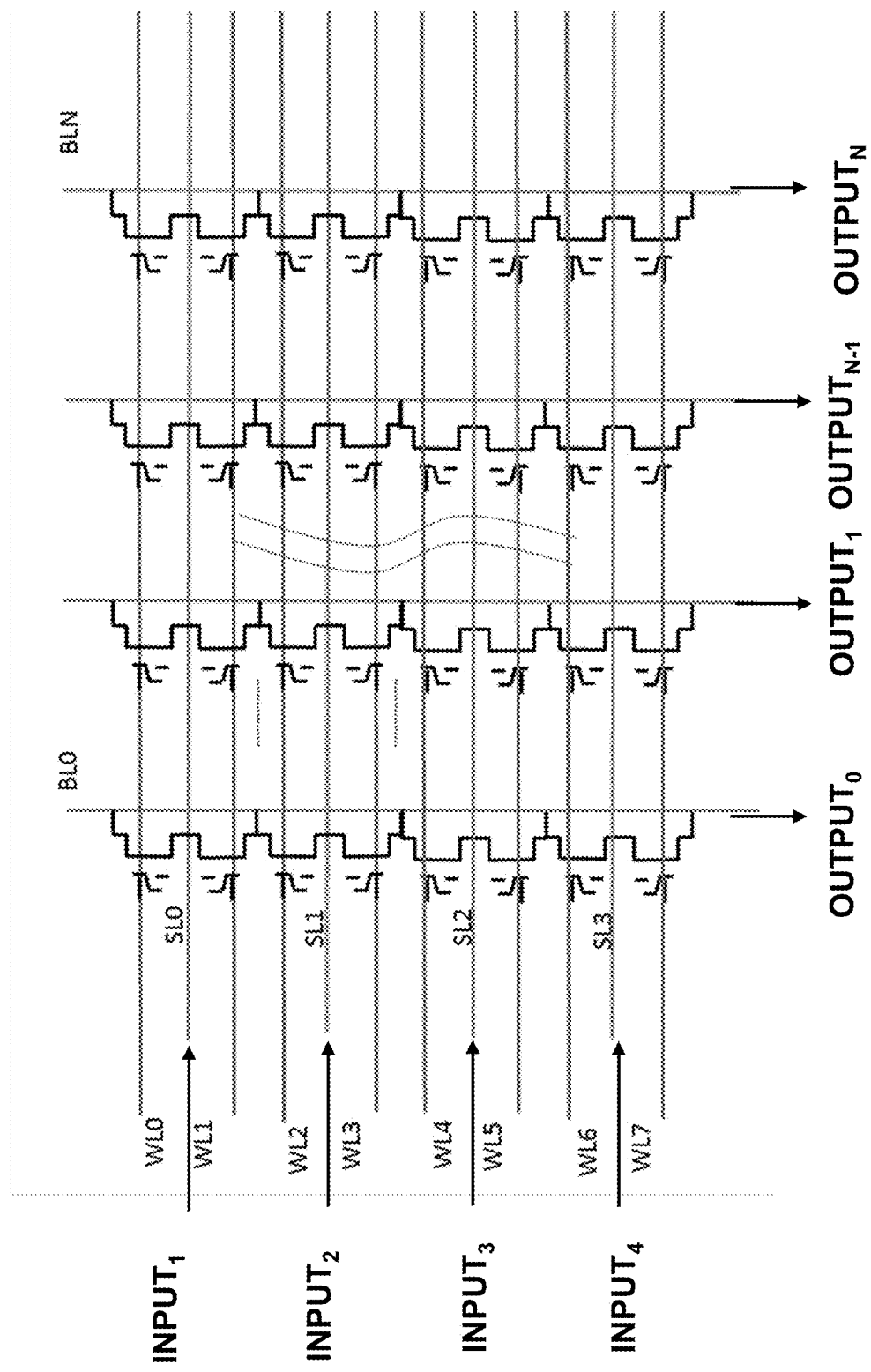
FIG. 23 depicts another embodiment of a vector-by-matrix multiplication system.
Figure 24:
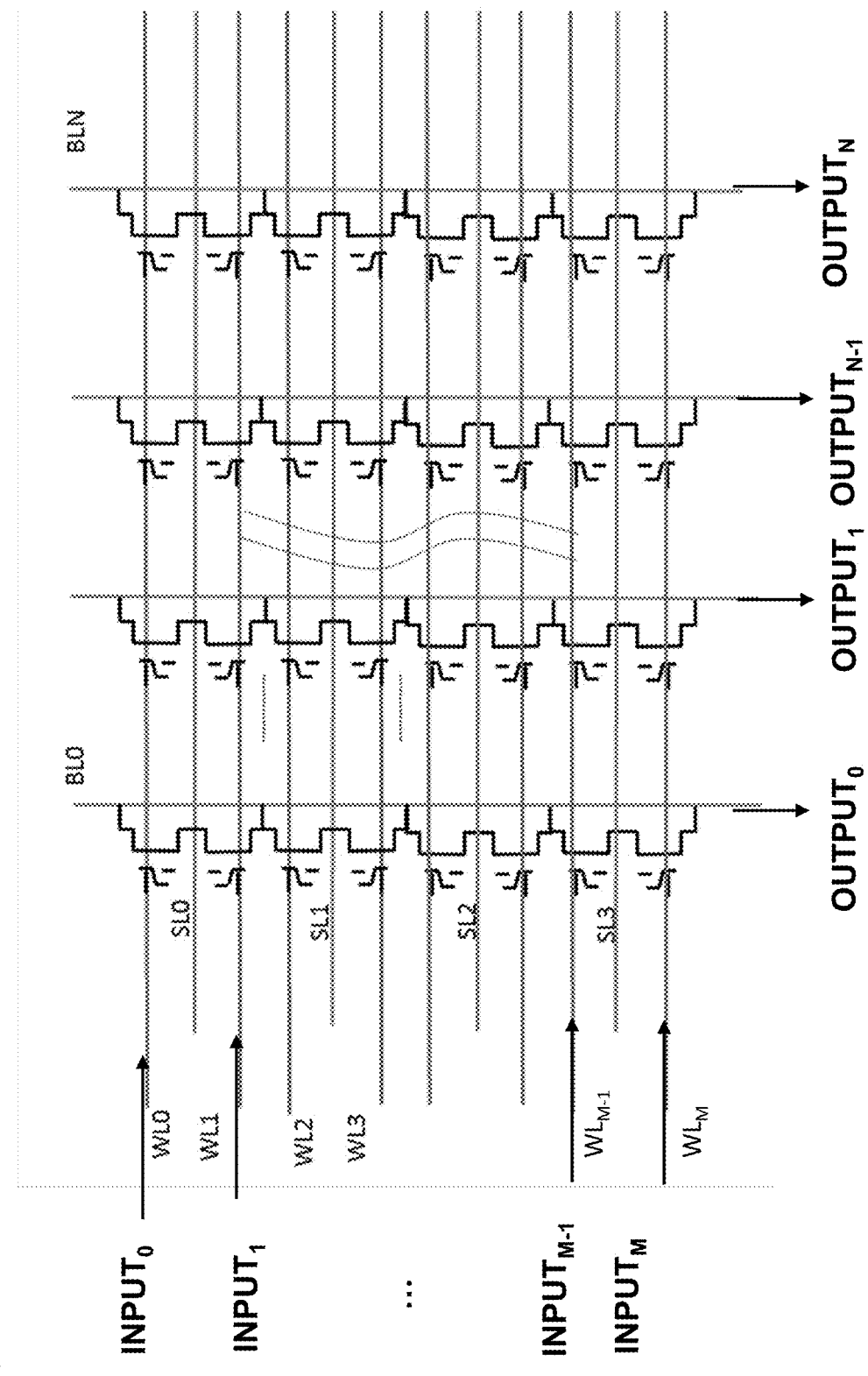
FIG. 24 depicts another embodiment of a vector-by-matrix multiplication system.
Figure 25:
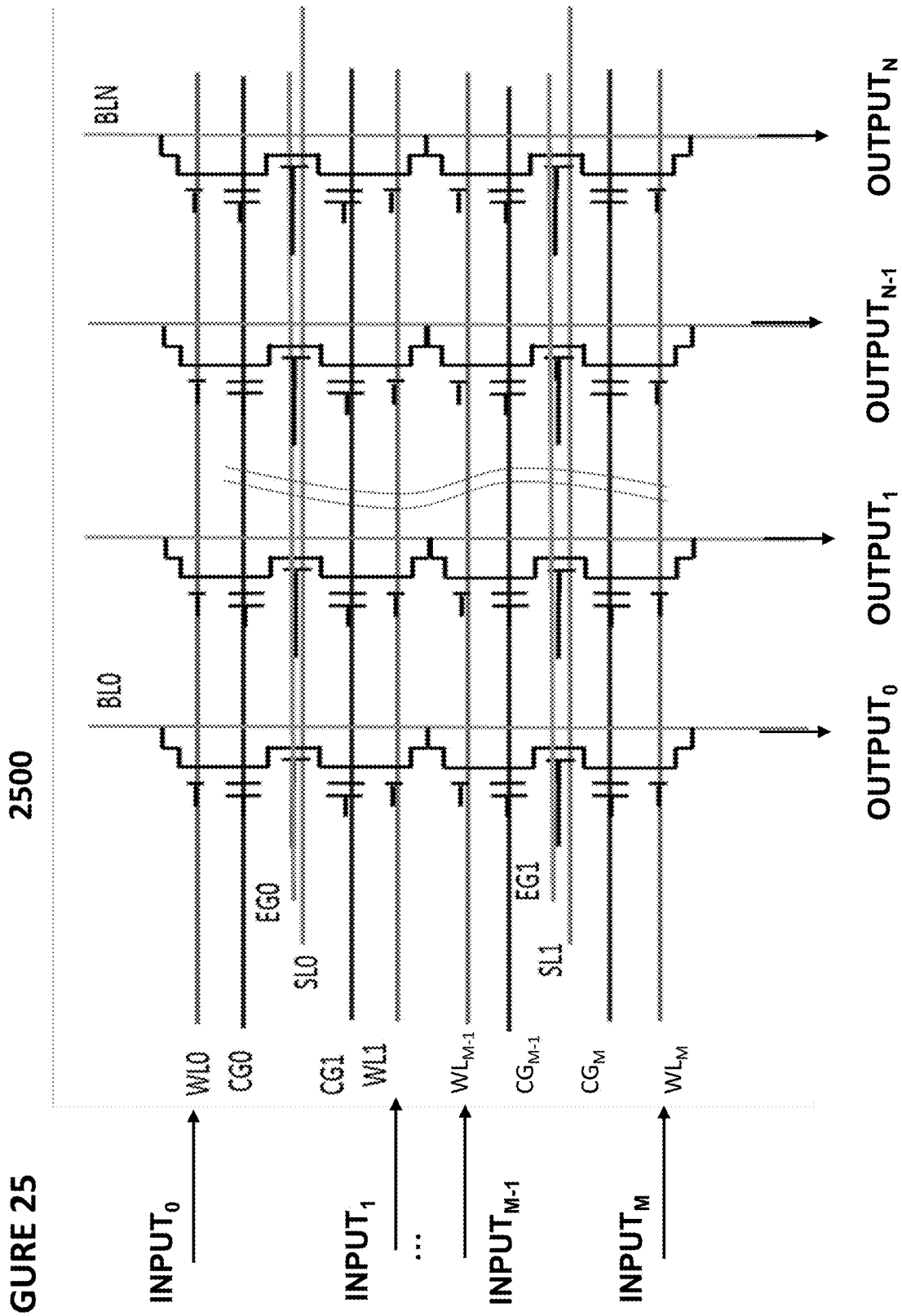
FIG. 25 depicts another embodiment of a vector-by-matrix multiplication system.
Figure 26A:
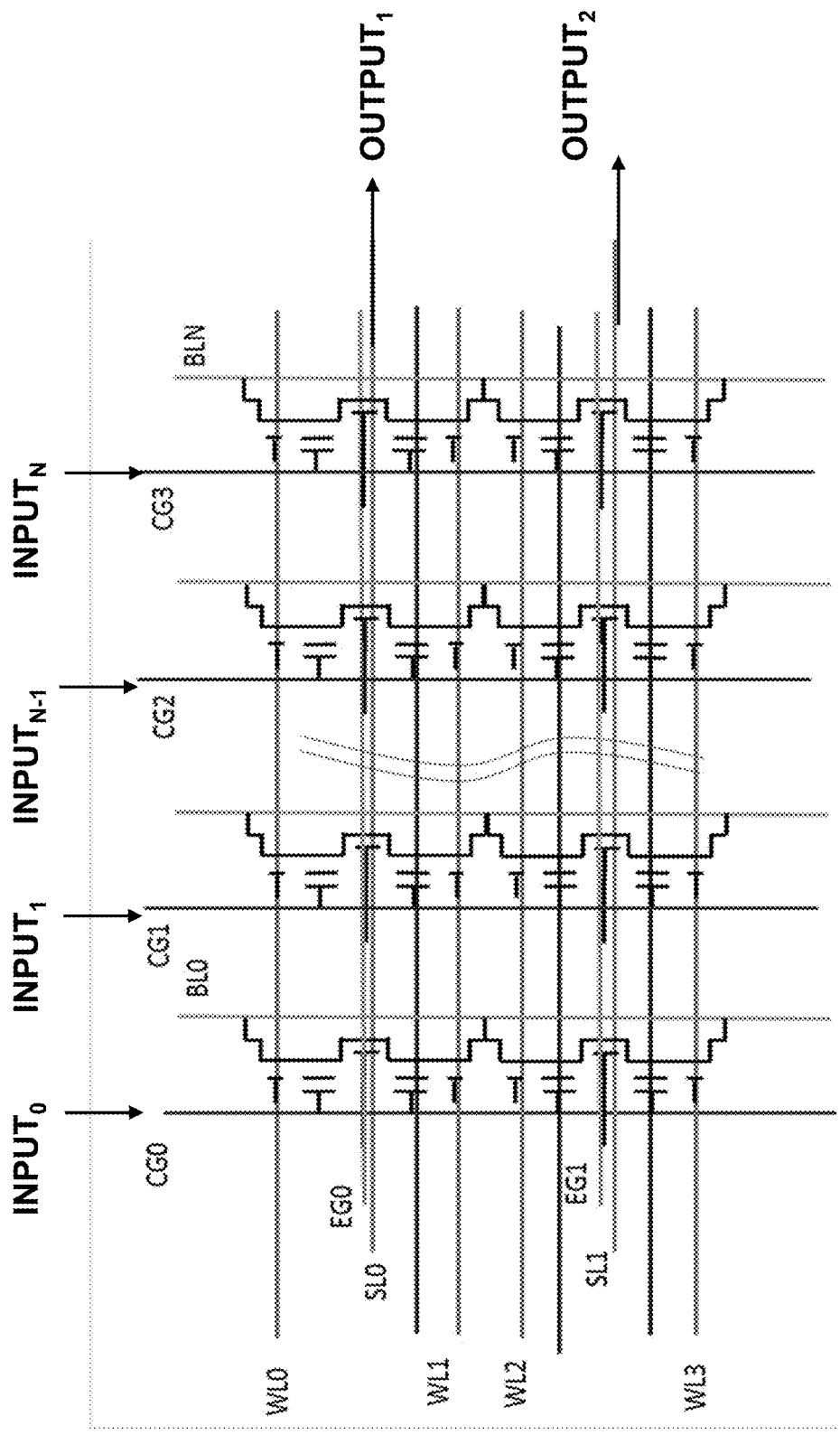
FIG. 26A depicts another embodiment of a vector-by-matrix multiplication system.
Figure 26B:
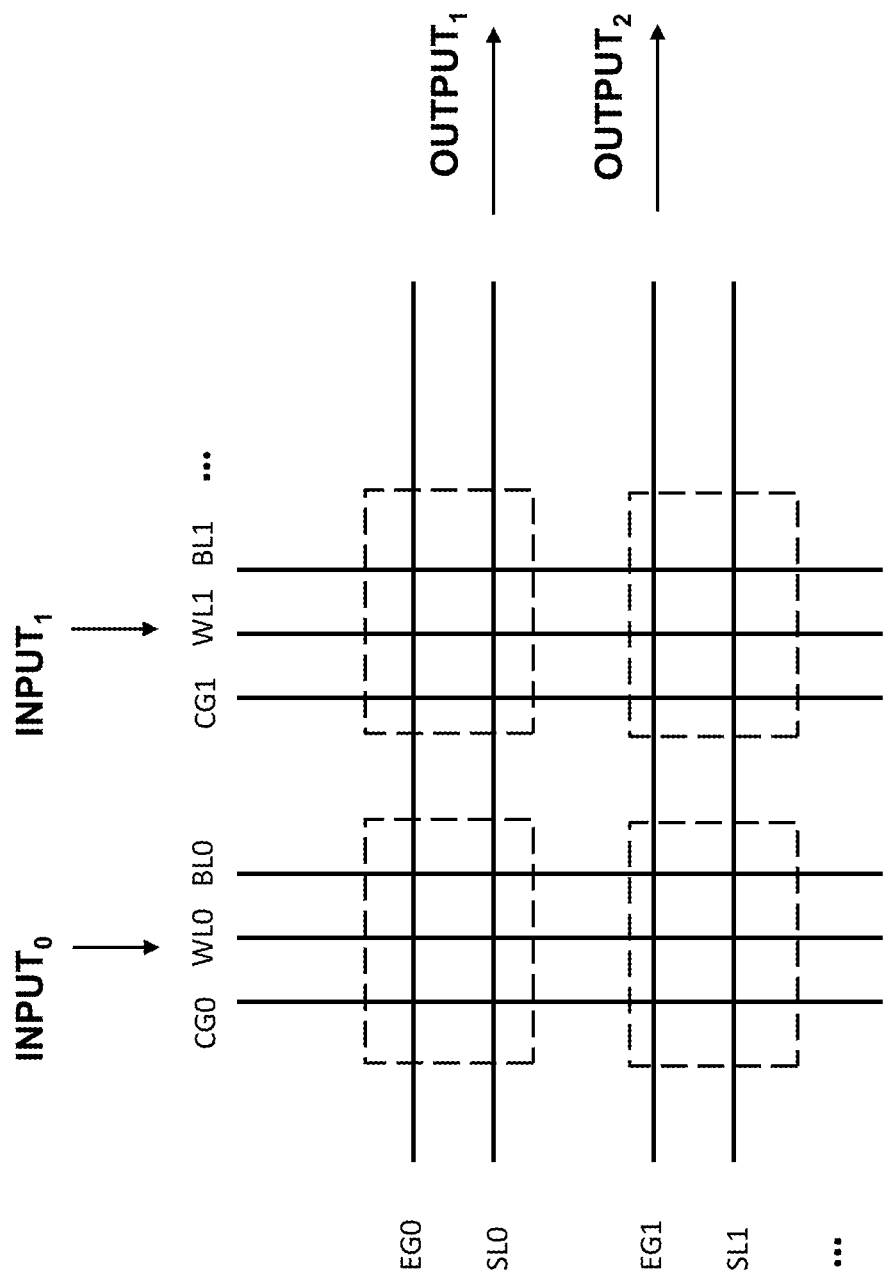
FIG. 26B depicts another embodiment of a vector-by-matrix multiplication system.
Figure 26C:
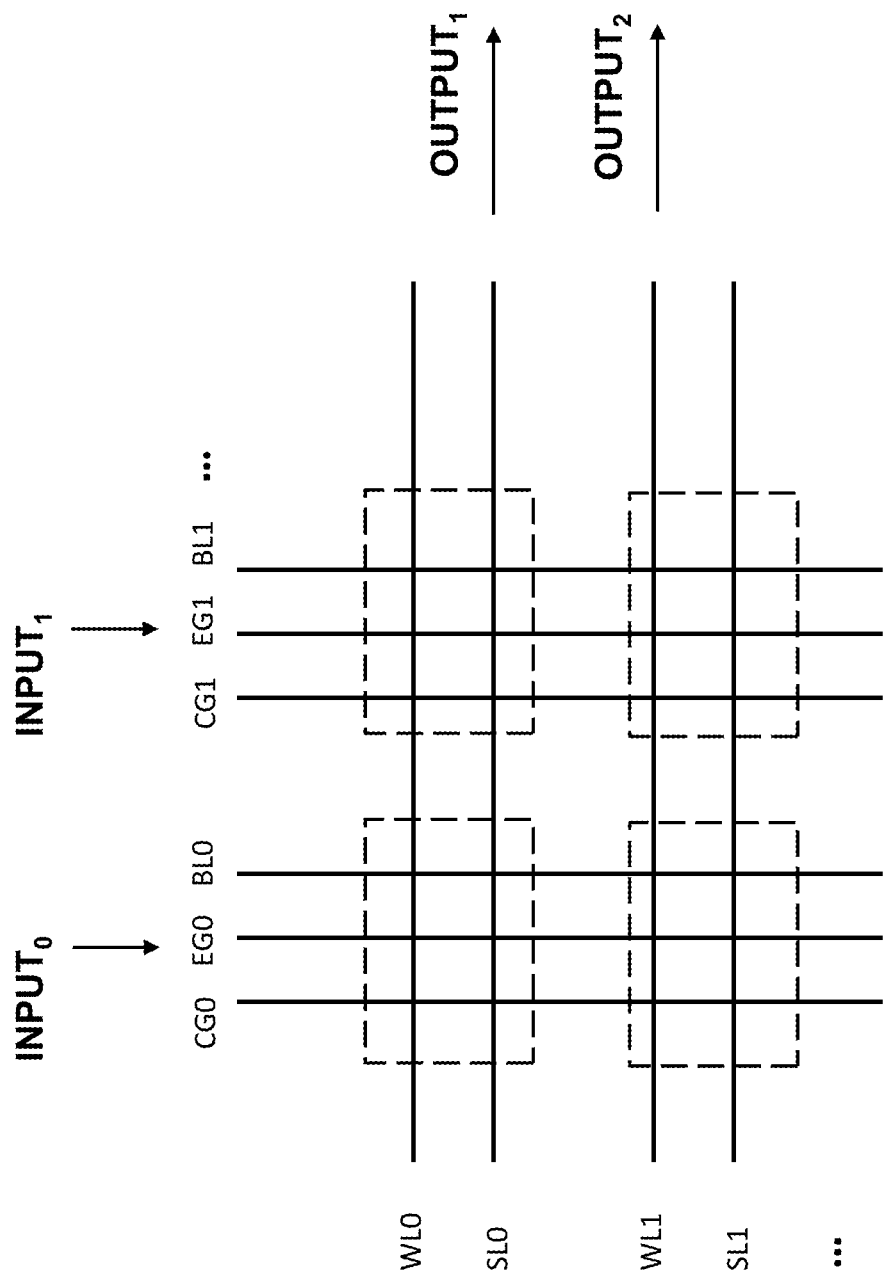
FIG. 26C depicts another embodiment of a vector-by-matrix multiplication system.
Figure 27:
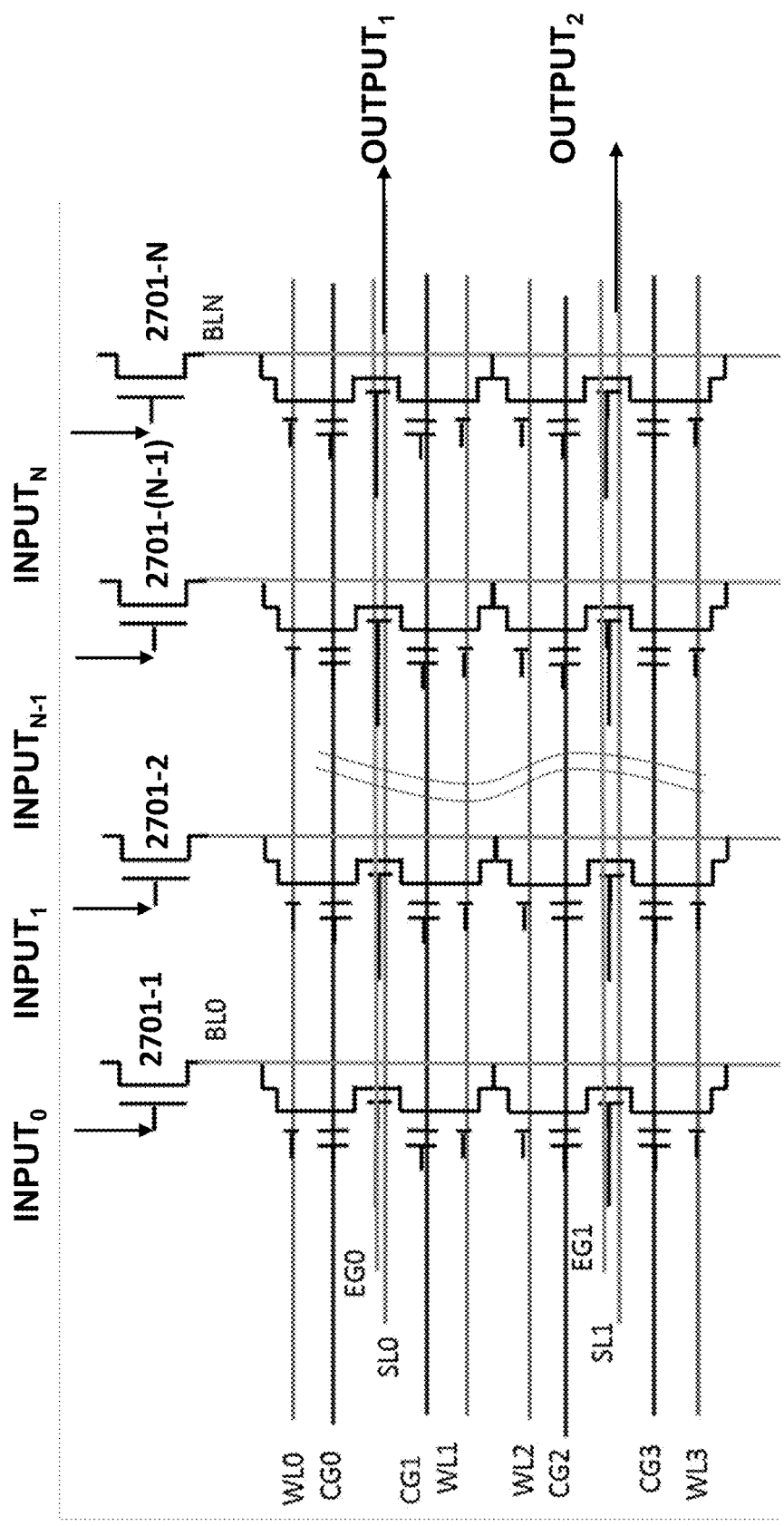
FIG. 27 depicts another embodiment of a vector-by-matrix multiplication system.
Figure 28:
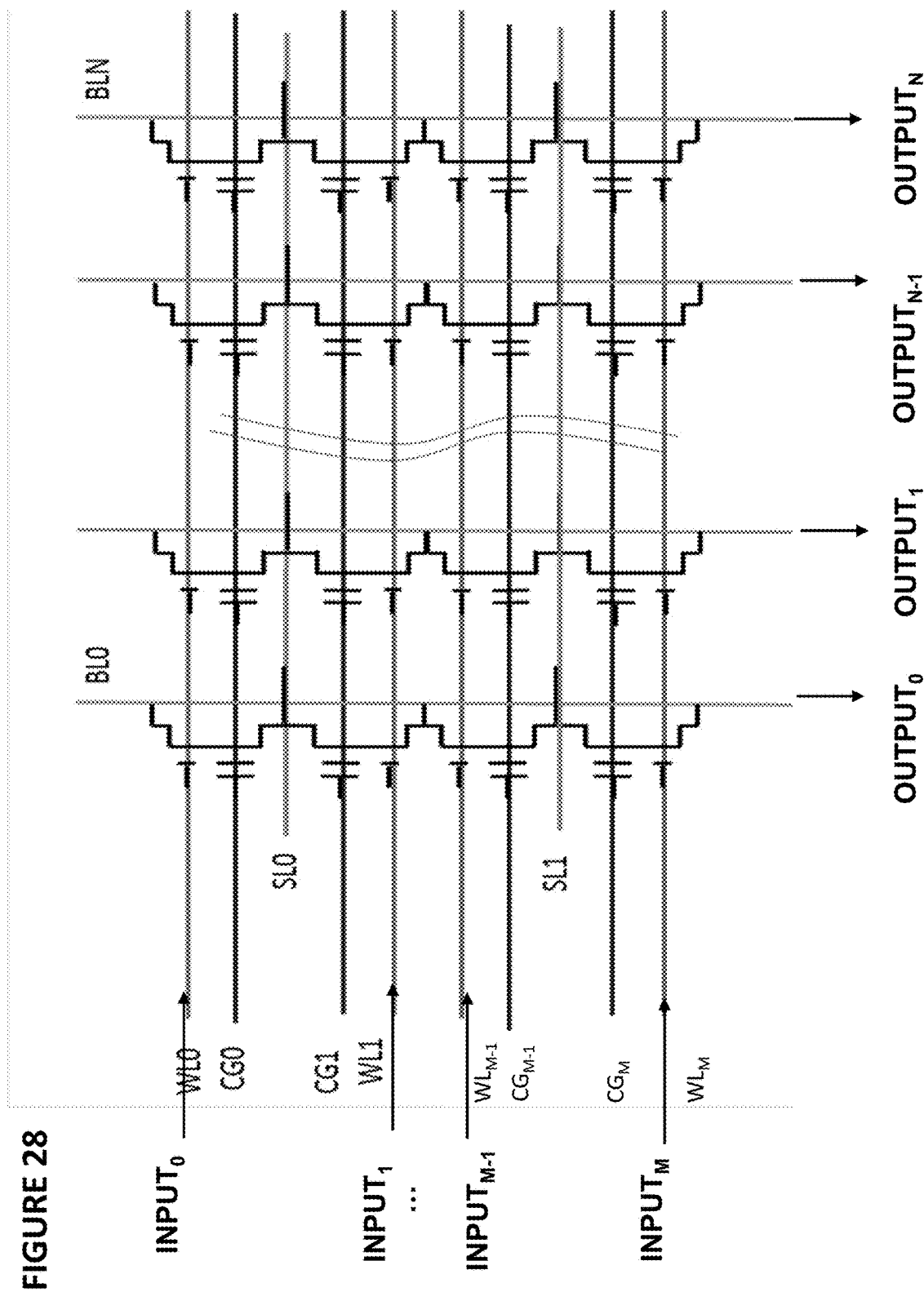
FIG. 28 depicts another embodiment of a vector-by-matrix multiplication system.
Figure 29:
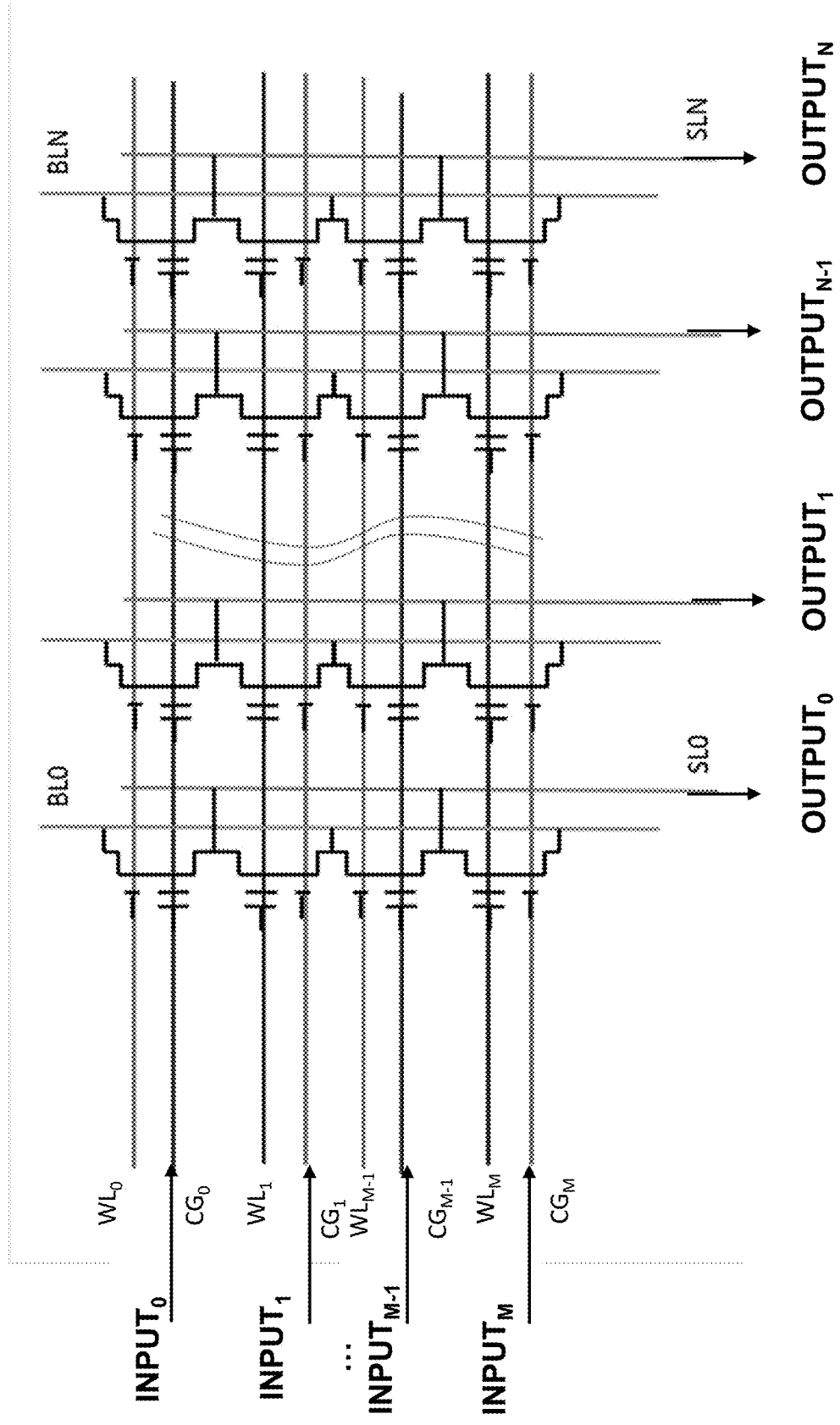
FIG. 29 depicts another embodiment of a vector-by-matrix multiplication system.
Figure 30:
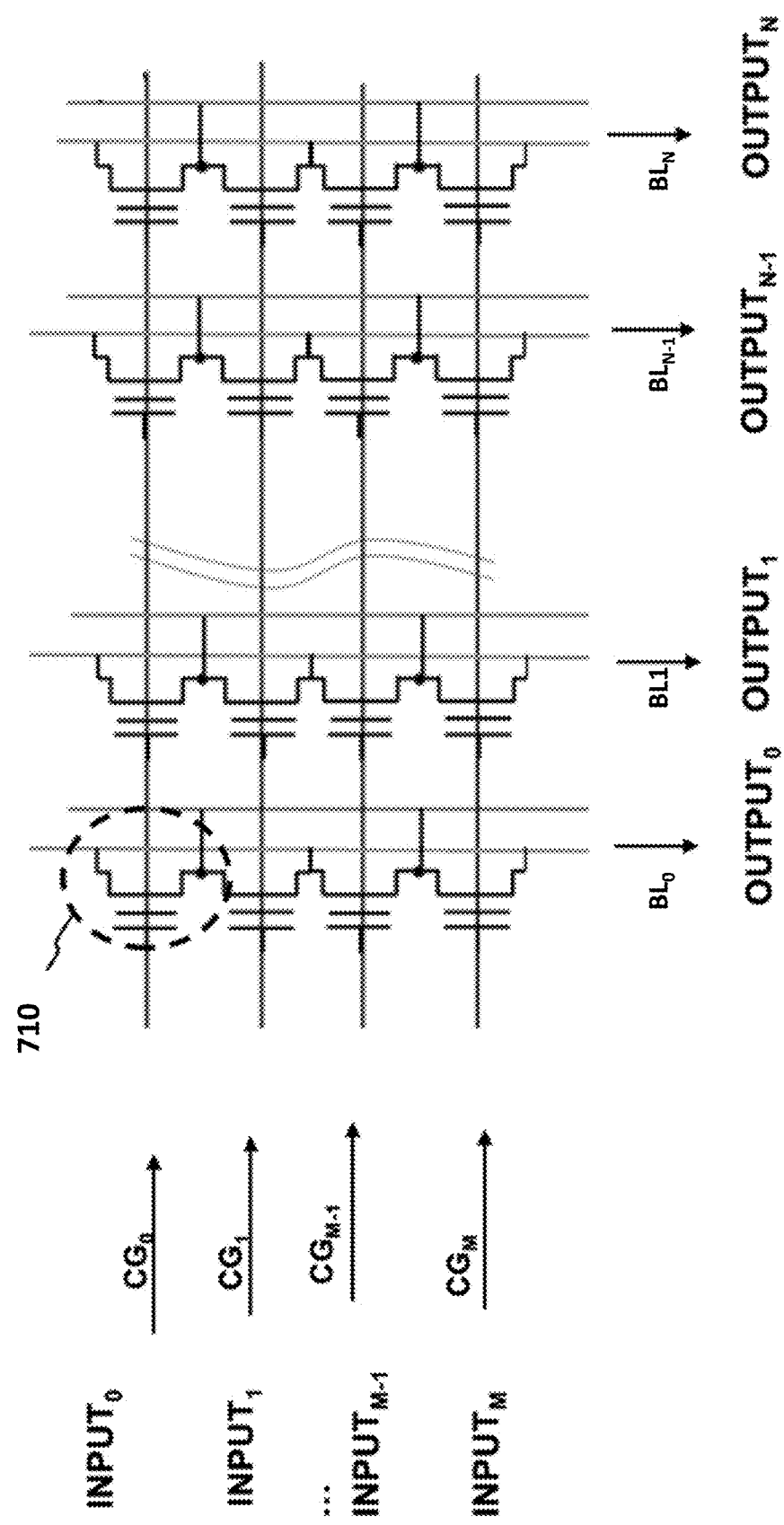
FIG. 30 depicts another embodiment of a vector-by-matrix multiplication system.
Figure 31:
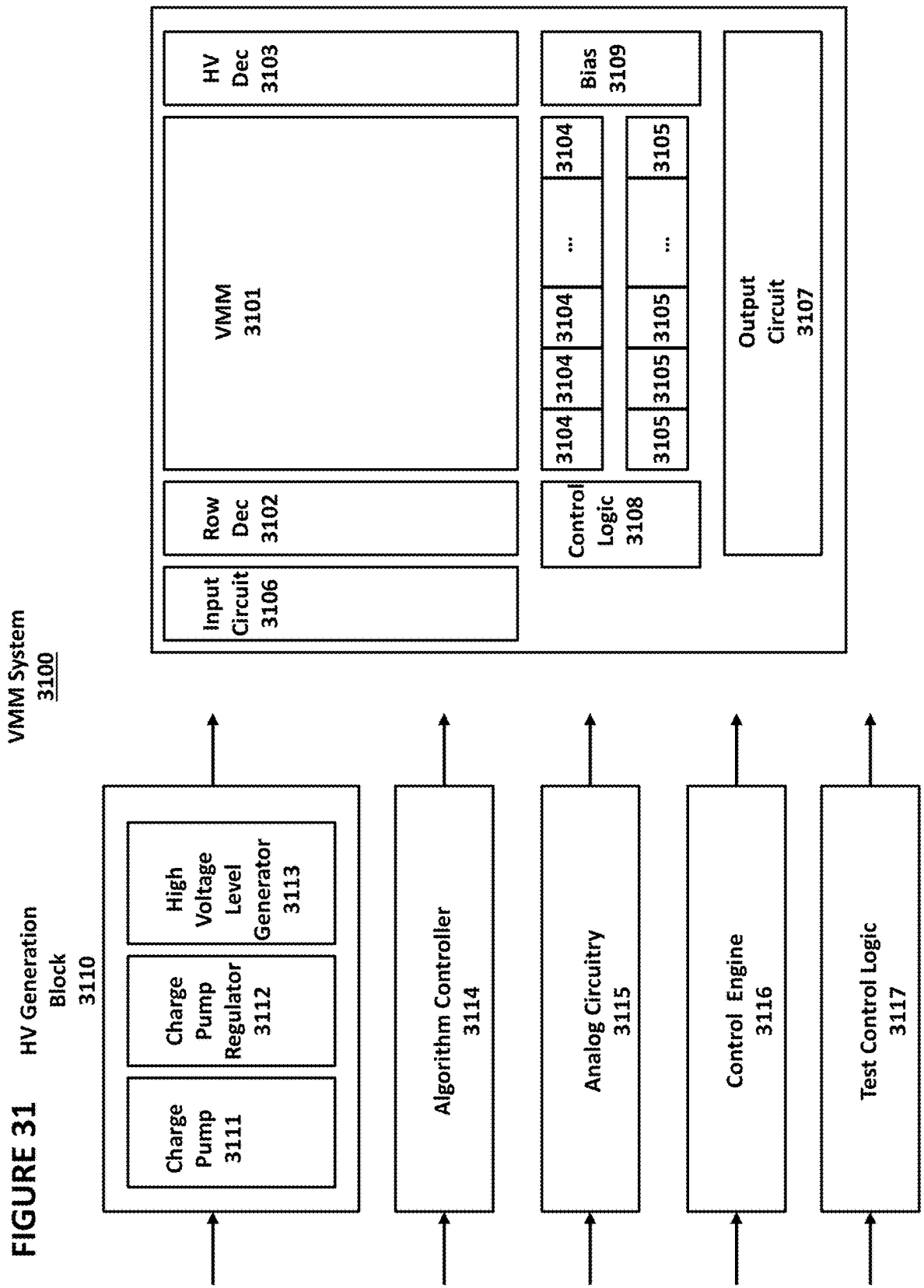
FIG. 31 depicts a vector-by-matrix multiplication system.

FIG. 31 depicts a block diagram of VMM system 3100. VMM system 3100 comprises VMM array 3101, row decoder 3102, high voltage decoder 3103, column decoder 3104, bit line drivers 3105, input circuit 3106, output circuit 3107, control logic 3108, and bias generator 3109. VMM system 3100 further comprises high voltage generation block 3110, which comprises charge pump 3111, charge pump regulator 3112, and high voltage level generator 3113. VMM system 3100 further comprises (program/erase, or aka weight tuning) algorithm controller 3114, analog circuitry 3115, control engine 3116 (that may include special functions such as arithmetic functions, activation functions, embedded microcontroller logic, etc.), and test control logic 3117. The systems and methods described below can be implemented in VMM system 3100.

The input circuit 3106 may include circuits such as a DAC (digital to analog converter), DPC (digital to pulses converter, digital to time modulated pulse converter), AAC (analog to analog converter, such as a current to voltage converter, logarithmic converter), PAC (pulse to analog level converter), or any other type of converters. The input circuit 3106 may implement normalization, linear or non-linear up/down scaling functions, or arithmetic functions. The input circuit 3106 may implement a temperature compensation function for input levels. The input circuit 3106 may implement an activation function such as ReLU or sigmoid. The output circuit 3107 may include circuits such as an ADC (analog to digital converter, to convert neuron analog output to digital bits), AAC (analog to analog converter, such as a current to voltage converter, logarithmic converter), APC (analog to pulse(s) converter, analog to time modulated pulse converter), a current-to-voltage converter, or any other type of converters. The output circuit 3107 may implement an activation function such as ReLU or sigmoids. The output circuit 3107 may implement statistic normalization, regularization, up/down scaling/gain functions, statistical rounding, or arithmetic functions (e.g., add, subtract, divide, multiply, shift, log) for neuron outputs. The output circuit 3107 may implement a temperature compensation function for neuron outputs or array outputs (such as bitline output) so as to keep power consumption of the array approximately constant or to improve precision of the array (neuron) outputs such as by keeping the IV slope approximately the same.

FIGS. 32-36 depicts embodiments of VMM systems that contain some commonality with VMM system 3100 but also some modifications.

Figure 32:
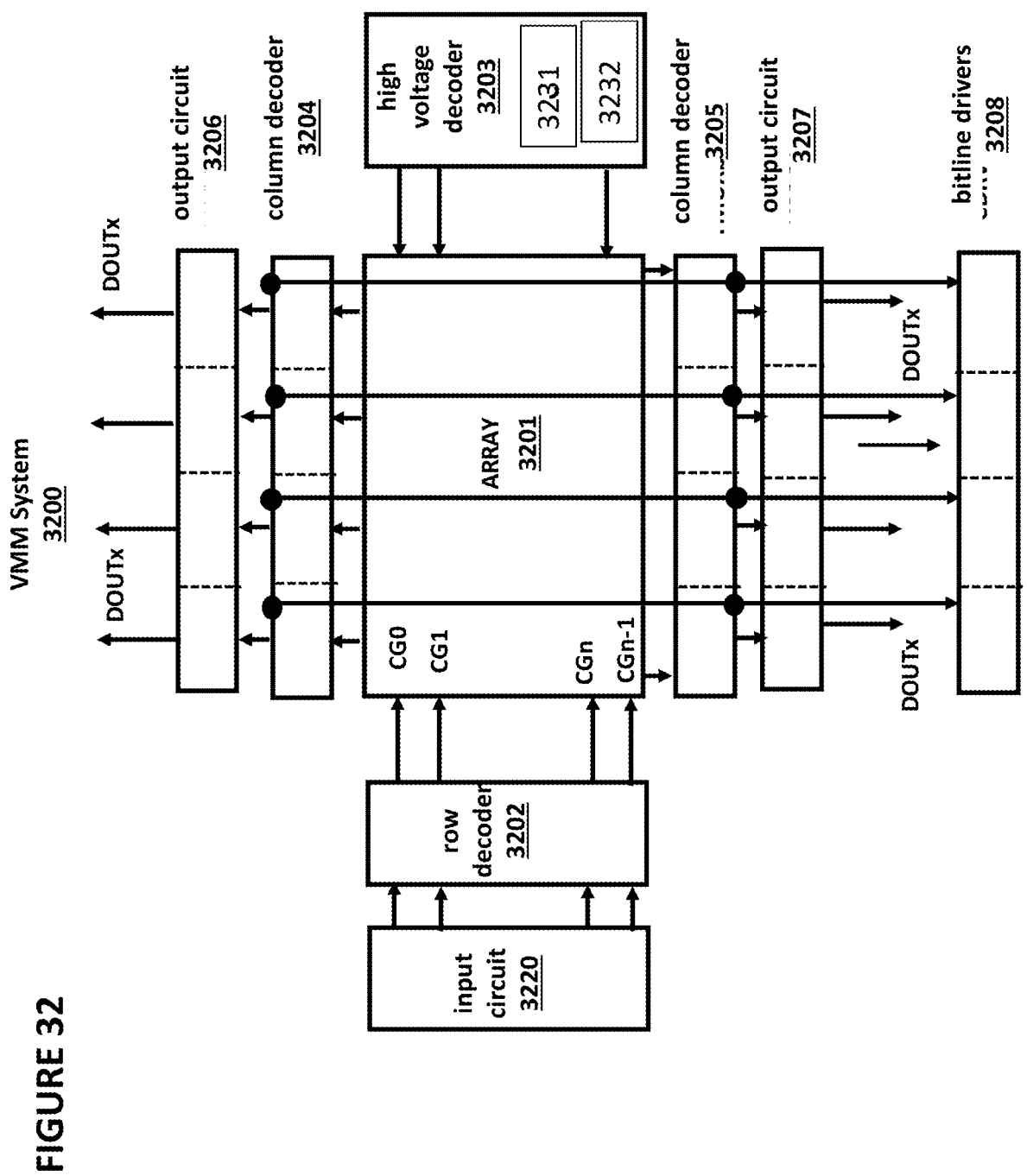
FIG. 32 depicts an embodiment of a split vector-by-matrix multiplication system.

FIG. 32 depicts VMM system 3200. VMM system 3200 comprises array 3201, shared row decoder 3202, shared high voltage decoder 3203, column decoders 3204 and 3205, (row) input circuit 3220, output circuits 3206 and 3207, and shared bit line drivers 3208. Shared row decoder 3202 is coupled to all rows in array 3201 and applies a voltage to a selected row. Shared high voltage decoder 3203 can be selectively coupled to all rows in array 3201. Shared high voltage decoder 3203 optionally comprises control gate high voltage decoder 3231 that can be selectively coupled to all rows in the array and shared erase gate high voltage decoder 3232 that can be selectively coupled to all rows in the array. The input circuit 3220 is, for example, similar to the input circuit 3106 of FIG. 31. The circuits and functions of the output circuit 3206 and 3207 are, for example, each similar to the circuits and functions of the output circuit 3107 of FIG. 31. Unlike in VMM system 3100, in VMM system 3200 certain operations are split between different sets of circuitry. Specifically, half of the columns (for example, all odd columns) in array 3201 are operated upon by column decoder 3204 and output circuit 3206, and the other half of the columns (for example, all even columns) in array 3201 are operated upon by column decoder 3205 and output circuit 3207. Thus, output circuit 3206 is coupled to column decoder 3204 for generating a first output from one or more columns in a first half of the columns during a read operation, and output circuit 3207 is coupled to column decoder 3207 for generating a second output from one or more columns in a second half of the columns during a read operation. In this embodiment, all columns are coupled to shared bit line drivers 3208 during program or erase operations. This allow multiple bitlines to be read concurrently, meaning bitlines coupled to the column decoder 3204 and the output circuit 3206 and bitlines coupled to the column decoder 3205 and the output circuit 3207 are enabled at the same time, by shared bit line drivers 3208, for read operations. Hence, this increases the throughput for reading the array 3201. Alternatively, the read operations need not be concurrent.

Figure 39:
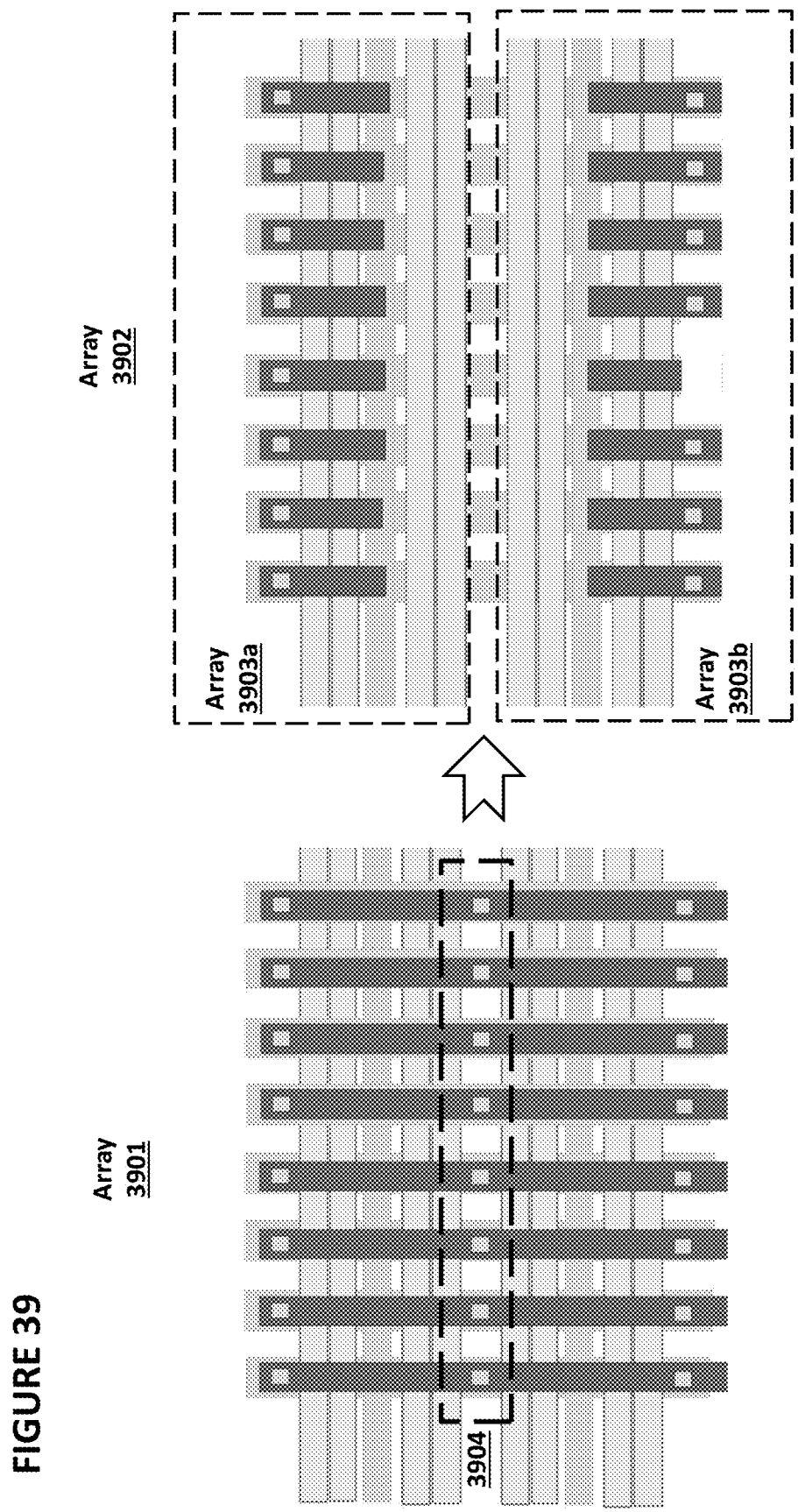
FIG. 39 depicts exemplary layouts of a single array and a split array in vector-by-matrix multiplication systems.

Optionally, with further reference to FIG. 39, continuous diffusion can be implemented between the top half and the bottom half of the array.

Figure 33:
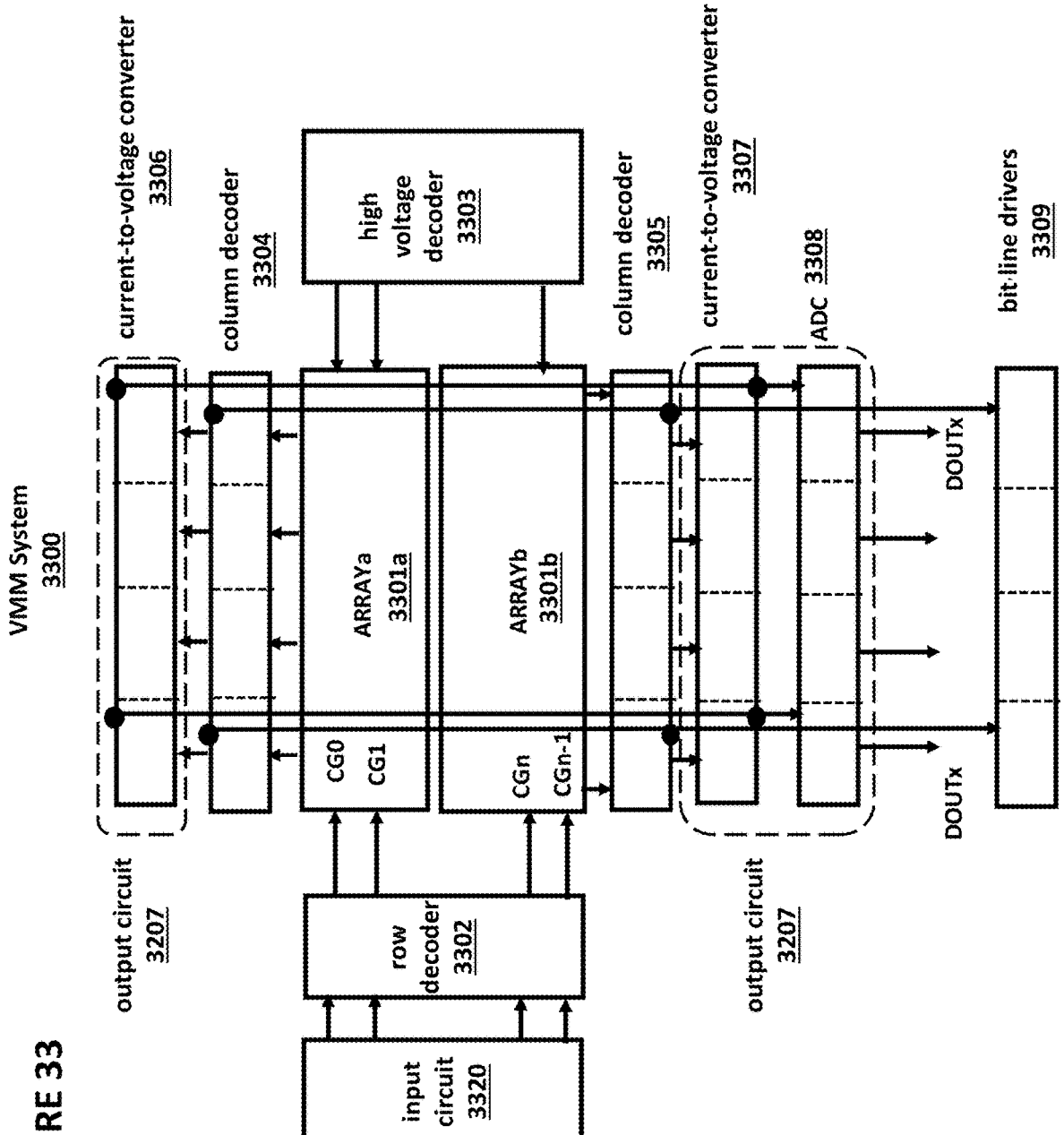
FIG. 33 depicts an embodiment of a split array vector-by-matrix multiplication system.

FIG. 33 depicts VMM system 3300. VMM system 3300 comprises arrays 3301a and 3301b, row decoder 3302, shared high voltage decoder 3303, column decoders 3304 and 3305, input circuit 3320, current-to-voltage converter circuits 3306 and 3307, shared analog-to-digital converter (ADC) 3308, and shared bit line drivers 3309. The current-to-voltage converter circuits 3306 or 3307 and the shared ADC circuit 3308 are parts of the output circuit 3207 in FIG. 32.

Unlike in VMM system 3100, in VMM system 3300 certain operations are split between different sets of circuitry. Specifically, array 3301a is operated upon by column decoder 3304 and current-to-voltage converter 3306, and array 3301b is operated upon by column decoder 3305 and current-to-voltage converter 3307. This allows multiple read and/or program operations to be performed simultaneously, where read or program operations can be performed concurrently on one or more cells in array 3301a and one or more cells in array 3301b.

Current-to-voltage converter circuits 3306 and 3307 are both coupled to shared analog-to-digital converter 3308, which is used in a time multiplexing fashion during read operations, and to shared bit line drivers 3309, which is used during program and erase operations. For example, in read operation, the array 3301a is enabled and is coupled to the column decoder 3304 and to the current-to-voltage converter circuit 3306 while the array 3301b is enabled and is coupled to the column decoder 3305 and the current-to-voltage converter circuit 3307 at the same time. The output voltage from the current-to-voltage converter circuits 3306 and 3307 are sampled and held (S/H), e.g., by S/H capacitors inside the shared ADC 3308, and these array output voltage are digitized (converted) by the time multiplexed shared ADC 3308 (since it is shared between the current-to-voltage converter circuits 3306 and 3307). For example, for one ADC shared between two current-to-voltage converter circuits, two set of S/H capacitors are used. In another embodiment, one ADC can be used for N current-to-voltage converter circuits, and in this case N set of S/H capacitors are used.

Figure 34:
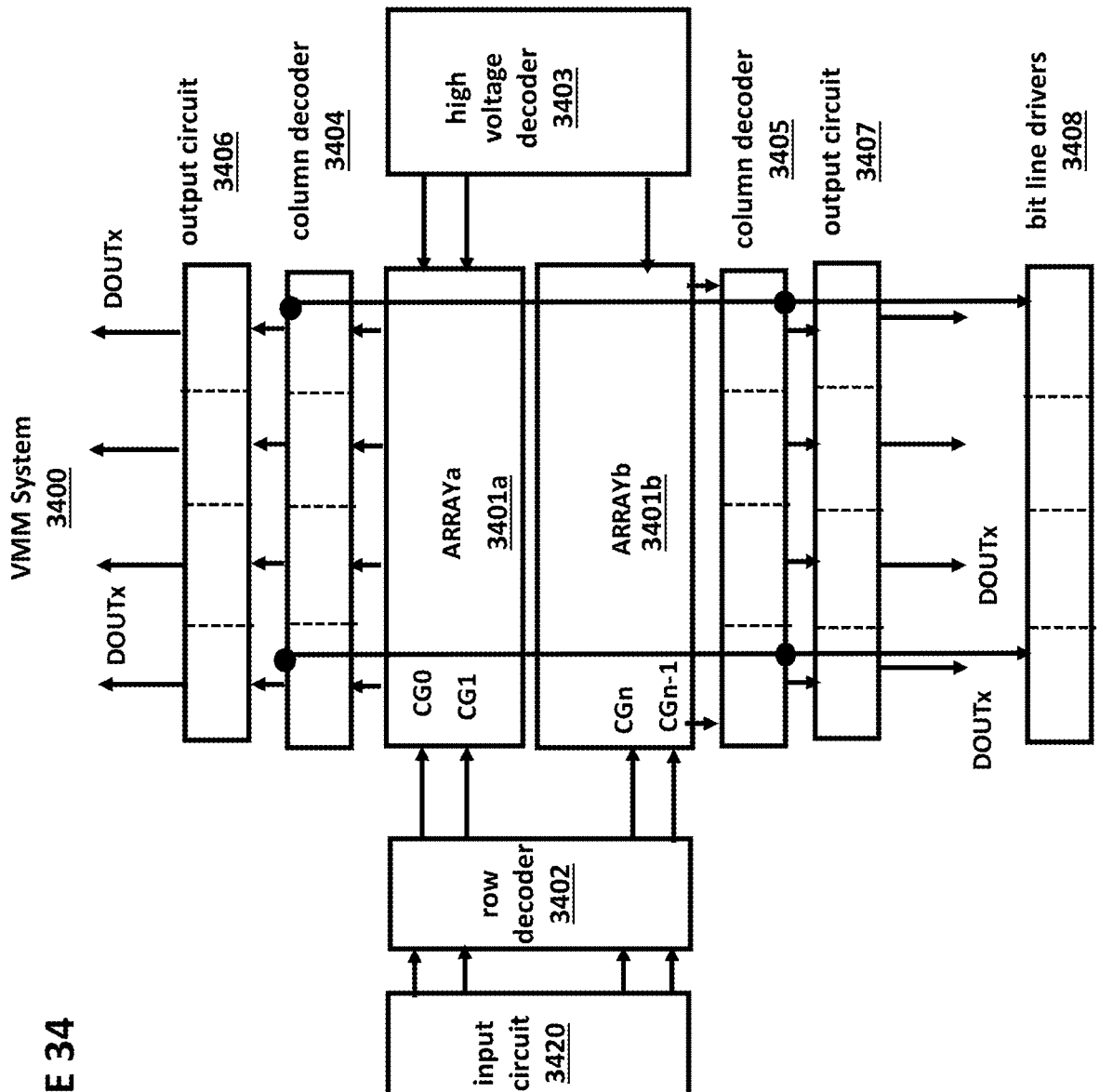
FIG. 34 depicts another embodiment of a split array vector-by-matrix multiplication system.

The use of a shared ADC between two current-to-voltage converter circuits can be applied to FIGS. 34/35/36 as well.

FIG. 34 depicts VMM system 3400. VMM system 3400 comprises arrays 3401a and 3401b, shared row decoder 3402, shared high voltage decoder 3403, column decoders 3404 and 3405, input circuit 3420, output circuits 3406 and 3407, and shared bit line drivers 3408. Unlike in VMM system 3100, in VMM system 3400 certain operations are split between different sets of circuitry. Specifically, array 3401a is operated upon by column decoder 3404 and output circuit 3406, and array 3401b is operated upon by column decoder 3405 and output circuit 3407. This allows multiple read/or and program operations to be performed simultaneously, where read or program operations can be performed concurrently on one or more cells in array 3401a and one or more cells in array 3401b. Arrays 3401a and 3401b are both coupled to shared bit line drivers 3408, which is used during program and erase operations.

Figure 35:
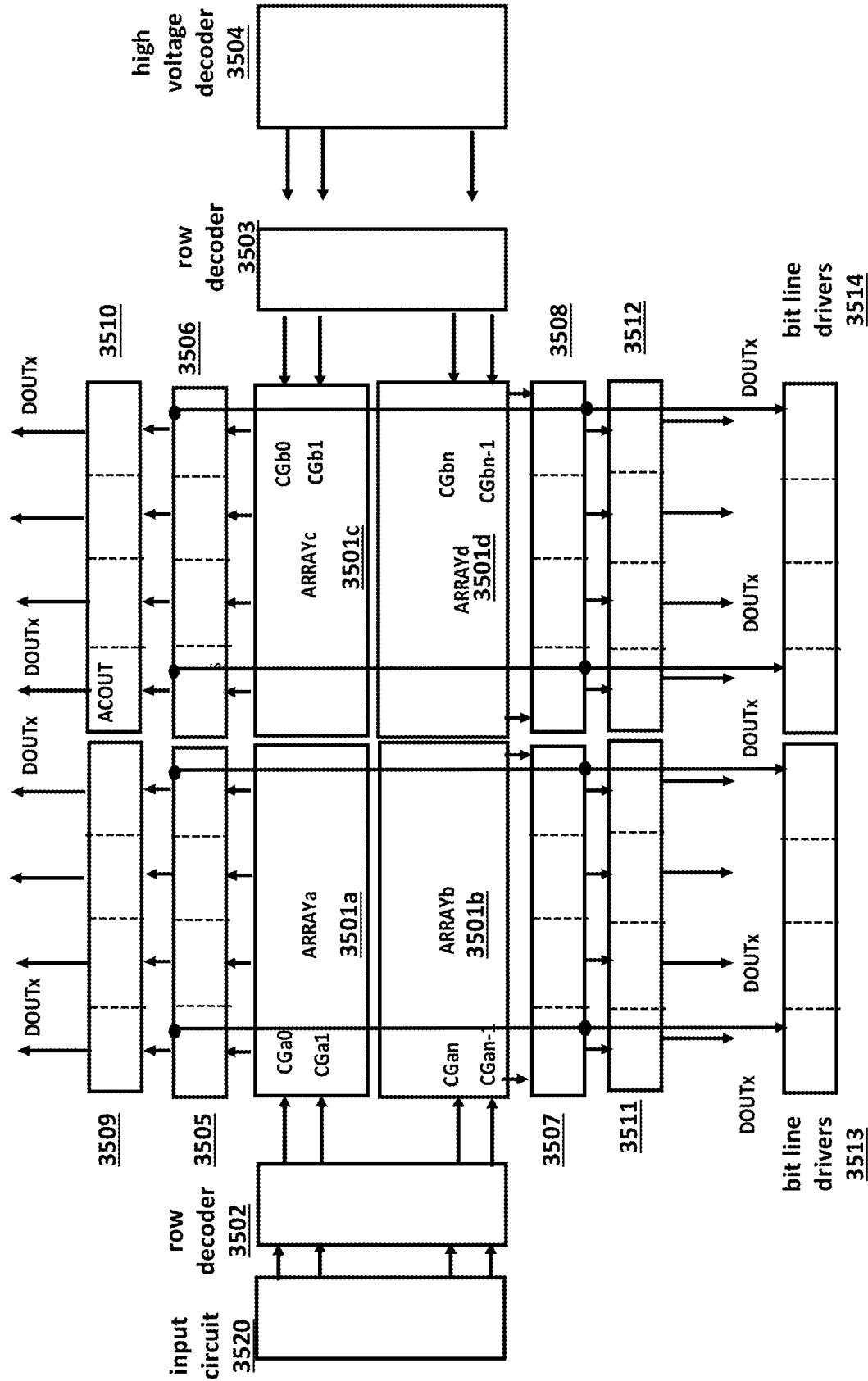
FIG. 35 depicts another embodiment of a split array vector-by-matrix multiplication system.

FIG. 35 depicts VMM system 3500. VMM system 3500 comprises arrays 3501a, 3501b, 3501c, and 3501d; row decoders 3502 and 3503; shared high voltage decoder 3504; column decoders 3505, 3506, 3507, and 3508; input circuit 3520, output circuits 3509, 3510, 3511, and 3512; and shared bit line drivers 3513 and 3514. Shared high voltage decoder 3504 can be selectively coupled to all rows in arrays 3501a, 3501b, 3501c, and 3501d. Row decoder 3502 is shared by arrays 3501a and 3501b and is coupled to all rows in those arrays and applies a voltage to a selected row, and row decoder 3503 is shared by arrays 3501c and 3501d and is coupled to all rows in those arrays and applies a voltage to a selected row.

In VMM system 3500, certain operations are split between different sets of circuitry. Specifically, array 3501a is operated upon by column decoder 3505 and output circuit 3509; array 3501b is operated upon by column decoder 3507 and output circuit 3511; array 3501c is operated upon by column decoder 3506 and output circuit 3510; and array 3501d is operated upon by column decoder 3508 and output circuit 3512. This allows multiple read/or and program operations to be performed simultaneously in all four arrays at once, where read or program operations can be performed concurrently on one or more cells in array 3501a, one or more cells in array 3501b, one or more cells in array 3501c, and one or more cells in array 3501d. Arrays 3501a and 3501b are both selectively coupled to shared bit line drivers 3513 during program and erase operations. Arrays 3501c and 3501d are both selectively coupled to shared bit line drivers 3514 during program and erase operations.

For example, a first read operation can be performed where column decoder 3505 and output circuit 3509 generate a first output from one or more rows in array 3501a, a second read operation can be performed where column decoder 3506 and output circuit 3510 generate a second output from one or more rows in array 3501c, a third read operation can be performed where column decoder 3507 and output circuit 3511 generate a third output from one or more rows in array 3501b, and a fourth read operation can be performed where column decoder 3508 and output circuit 3512 generate a fourth output from one or more rows in array 3501d. Optionally, the first and third read operations can occur concurrently. Optionally, the second and fourth read operations can occur concurrently.

Figure 36:
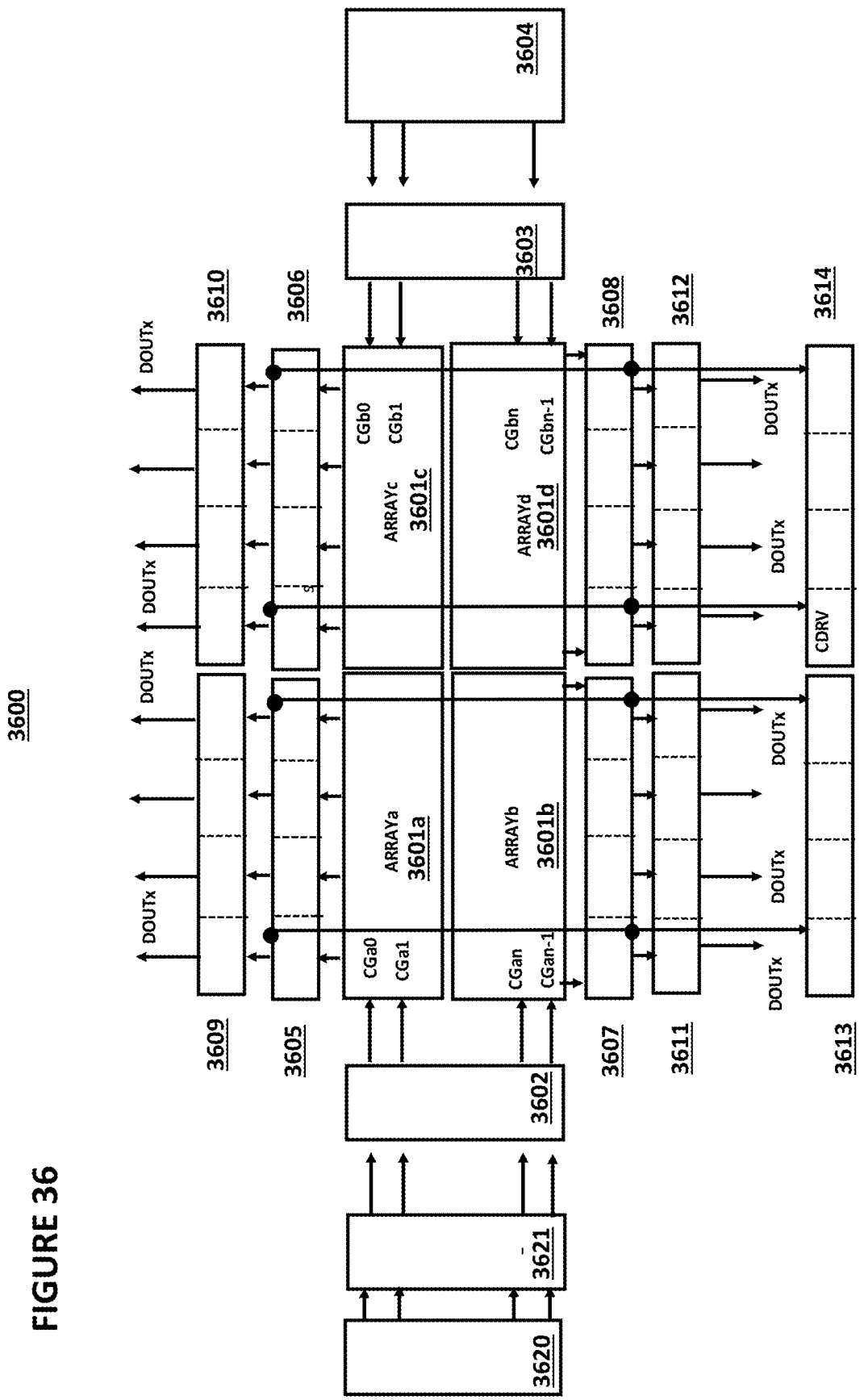
FIG. 36 depicts another embodiment of a split array vector-by-matrix multiplication system.

FIG. 36 depicts VMM system 3600. VMM system 3600 comprises arrays 3601a, 3601b, 3601c, and 3601d; row decoder 3621; control gate decoders 3602 and 3603; shared high voltage decoder 3604; column decoders 3605, 3606, 3607, and 3608; output circuits 3609, 3610, 3611, and 3612; and shared bit line drivers 3613 and 3614. In VMM system 3600, certain operations are split between different sets of circuitry. Specifically, array 3601a is operated upon by column decoder 3605 and output circuit 3609; array 3601b is operated upon by column decoder 3607 and output circuit 3611; array 3601c is operated upon by column decoder 3606 and output circuit 3610; and array 3601d is operated upon by column decoder 3608 and output circuit 3612. This allows multiple read and/or program operations to be performed simultaneously in all four arrays at once, where read or program operations can be performed concurrently on one or more cells in array 3601a, one or more cells in array 3601b, one or more cells in array 3601c, and one or more cells in array 3601d. Arrays 3601a and 3601b are both selectively coupled to shared bit line drivers 3613 during program and erase operations. Arrays 3601c and 3601d are both selectively coupled to shared bit line drivers 3614 during program and erase operations.

FIGS. 32-36 show the reading is done by row input on control gates. Alternatively, it can be done on word lines or erase gates. The input circuit 3220 in FIG. 32, 3320 in FIG. 33, 3420 in FIG. 34, 3520 in FIGS. 35, and 3620 in FIG. 36 are similar to the input circuit 3106 of FIG. 31. The output circuits 3206/3207 in FIGS. 32 and 3406/4307 in FIG. 34, 3507/3508/3509/3510 in FIGS. 35, and 3607/3608/3609/3610 in FIG. 36 are similar to the output circuit 3107 of FIG. 31.

Figure 37:
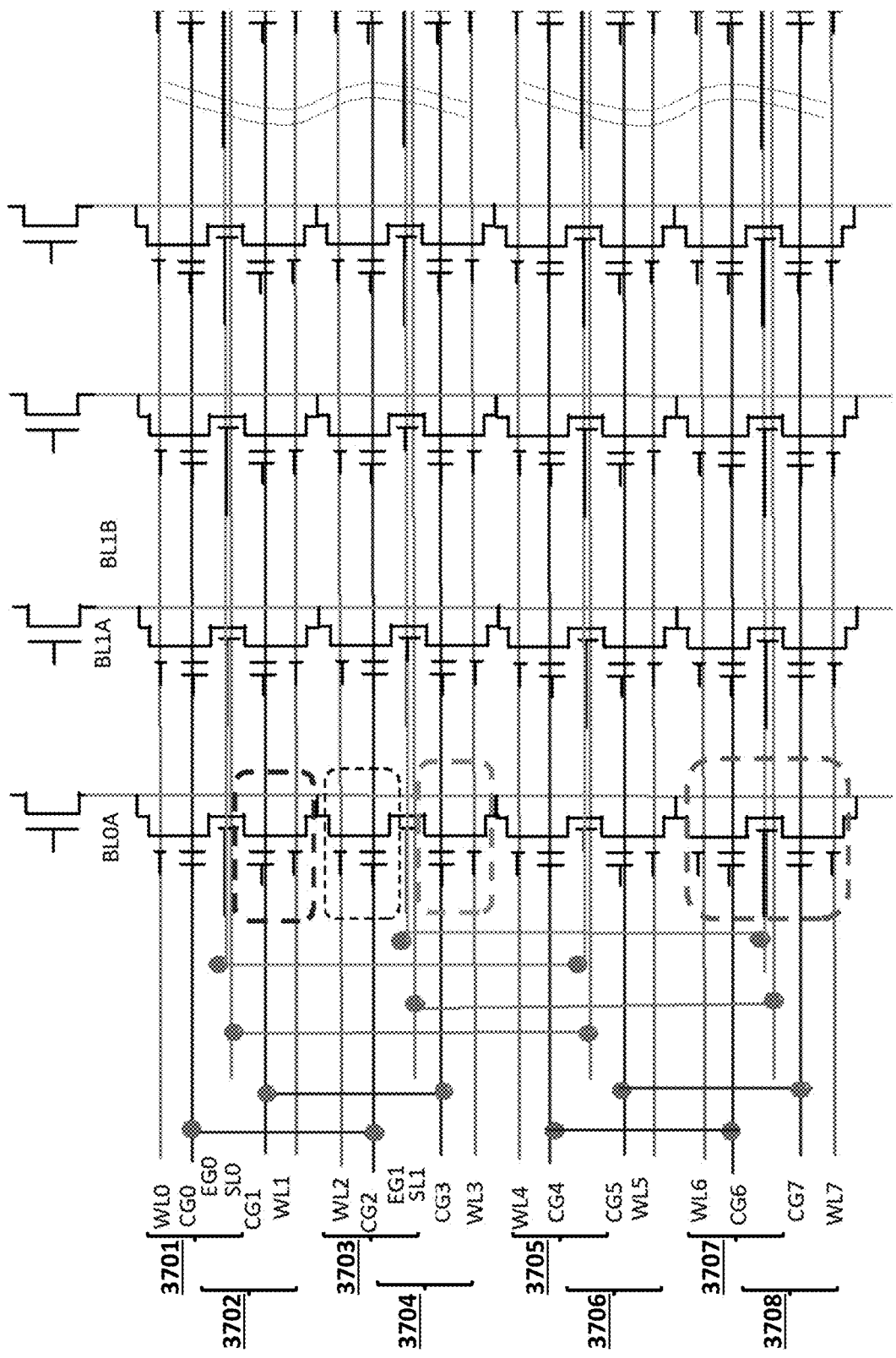
FIG. 37 depicts an embodiment of a split array in a vector-by-matrix multiplication system.

FIG. 37 depicts a portion of VMM array 3700. VMM array 3700 comprises rows 3701, 3702, 3703, 3704, 3705, 3706, 3707, and 3708. Rows 3701, 3702, 3705, and 3706 share an erase gate line (EG0) and a source line (SL0); rows 3703, 3704, 3707, and 3708 share an erase gate line (EG1) and a source line (SL1). In addition, rows 3701 and 3703 share a control gate line (CG0/CG2); rows 3702 and 3704 share a control gate line (CG1/CG3); rows 3705 and 3707 share a control gate line (CG4/CG6); and rows 3706 and 3708 share a control gate line (CG5/CG7). These couplings allow different rows to share decoder circuitry. The array terminals are shared such that program or erase disturb is reduced by having a reduced amount of erase or program voltage stress on un-selected cells.

Figure 38:
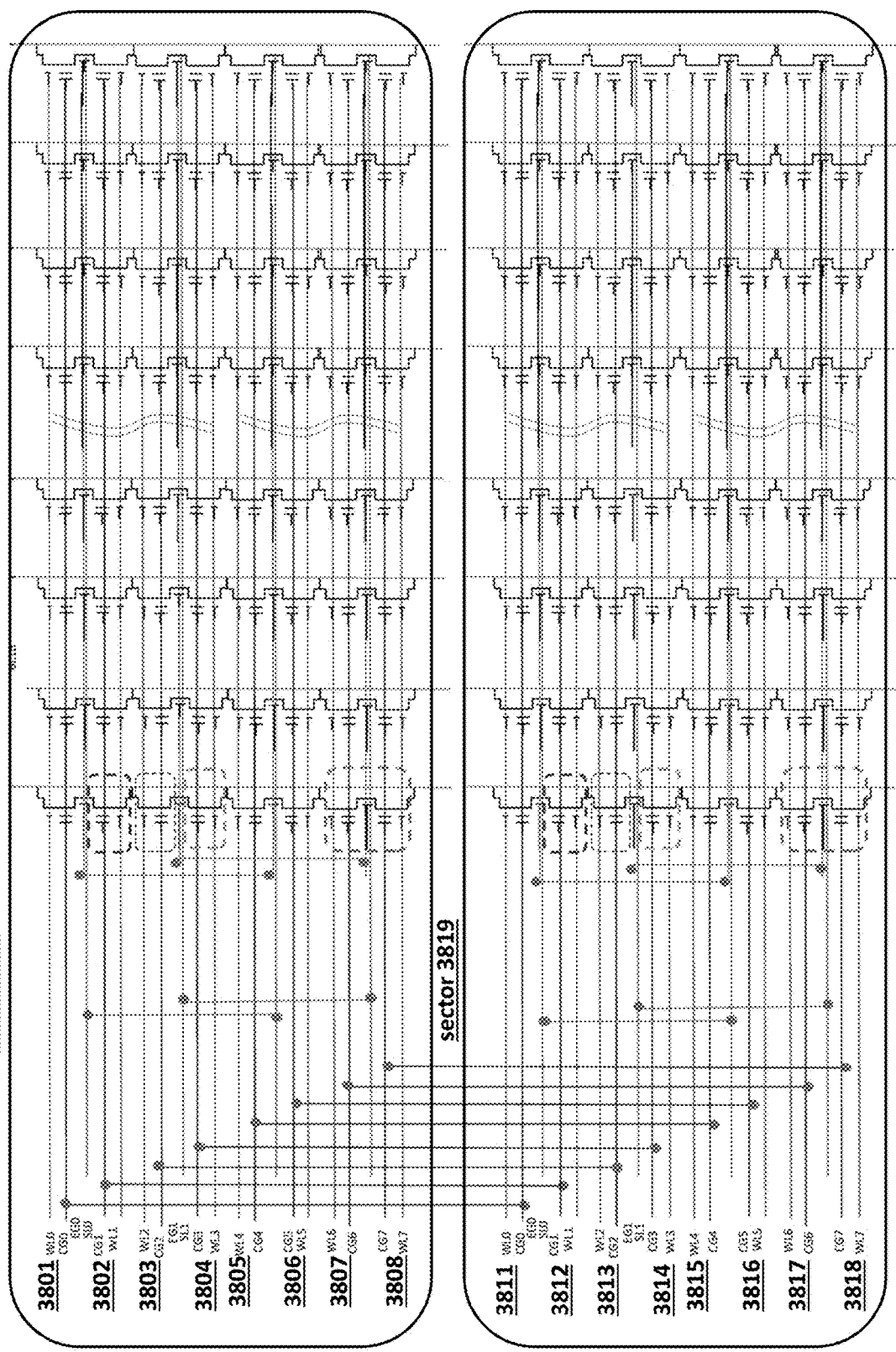
FIG. 38 depicts another embodiment of a split array in a vector-by-matrix multiplication system.

In the arrays of FIGS. 37 and 38 (described below), the row input for the VMM array 3700 and 3800 for neural read operations (multiple row and multiple bitlines are on at the same time) is on the word lines. If the input for neural read is on the control gates, the control gates cannot be shared across multiple rows in the same sub-array or array bank.

FIG. 38 depicts a portion of array 3800. Array 3800 comprises sectors 3809 and 3819. Sector 3809 comprises rows 3801, 3802, 3803, 3804, 3805, 3806, 3807, and 3808. Sector 3819 comprises rows 3811, 3812, 3813, 3814, 3815, 3816, 3817, and 3818.

Rows 3801 (a first row) and 3811 (a second row) share a control gate line (CG0) (meaning that the control gate terminal of each cell in those rows is coupled to the same control gate line); rows 3802 and 3812 share a control gate line (CG1) (meaning that the control gate terminal of each cell in those rows is coupled to the same control gate line); rows 3803 and 3813 share a control gate line (CG2) (meaning that the control gate terminal of each cell in those rows is coupled to the same control gate line); rows 3804 and 3814 share a control gate line (CG3) (meaning that the control gate terminal of each cell in those rows is coupled to the same control gate line); rows 3805 and 3815 share a control gate line (CG4) (meaning that the control gate terminal of each cell in those rows is coupled to the same control gate line); rows 3806 and 3816 share a control gate line (CG5) (meaning that the control gate terminal of each cell in those rows is coupled to the same control gate line); rows 3807 and 3817 share a control gate line (CG6) (meaning that the control gate terminal of each cell in those rows is coupled to the same control gate line); and rows 3808 and 3818 share a control gate line (CG7) (meaning that the control gate terminal of each cell in those rows is coupled to the same control gate line). This means that the control gates are shared across the sectors. These couplings allow different rows to share decoder circuitry. The array terminals are shared such that the program or erase disturb is reduced by having a reduced amount of erase or program voltage stress on un-selected cells.

Rows 3801 (a first row), 3802 (a third row), 3805, and 3806 share an erase gate line (EG0) (meaning that the erase gate terminal of each cell in those rows is coupled to the same erase gate line) and a source line (SL0) (meaning that the source line terminal of each cell in those rows is coupled to the same source line); rows 3803, 3084, 3807, and 3808 share an erase gate line (EG1) (meaning that the erase gate terminal of each cell in those rows is coupled to the same erase gate line) and a source line (SL1) (meaning that the source line terminal of each cell in those rows is coupled to the same source line); rows 3811, 3812, 3815, and 3816 share an erase gate line (EG0) (meaning that the erase gate terminal of each cell in those rows is coupled to the same erase gate line) and a source line (SL0) (meaning that the source line terminal of each cell in those rows is coupled to the same source line); and rows 3813, 3114, 3817, and 3818 share an erase gate line (EG1) (meaning that the erase gate terminal of each cell in those rows is coupled to the same erase gate line) and a source line (SL1) (meaning that the source line terminal of each cell in those rows is coupled to the same source line).

FIG. 39 depicts exemplary layouts of a portion of a single array 3901 (such as array 3101 in FIG. 31 and array 3201 in FIG. 32) and a split array 3902 (such as arrays 3301a and 3301b in FIG. 33, arrays 3401a and 3401b in FIG. 34, arrays 3501a, 3501b, 3501c, and 3501d in FIG. 35, and arrays 3601a, 3601b, 3601c, and 3601d in FIG. 36). Split array 3902 follows the same design as array 3901 except that certain contacts and metal connection 3904 are removed (or not formed), creating sub-arrays 3903a and 3903b. The few dummy rows at the interface are disabled such by grounding the wordline and control gates. This maintains process uniformity due to the front end layers (i.e., continuous column diffusion within columns and continuous row diffusion within source lines) and polysilicon are continuous and uniform between the two arrays of non-volatile memory cells (between electrically separate arrays). This also results in reduced area overhead as compared to physical separation of different arrays.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. An analog neural memory, comprising:
   an array of non-volatile memory cells arranged into rows and columns, each non-volatile memory cell comprising a bit line terminal, a control gate terminal, and an erase gate terminal;
   a first column decoder coupled to even columns in the array;
   a second column decoder coupled to odd columns in the array;
   a shared bit line driver for enabling simultaneously columns coupled to the first column decoder through bit line terminals of respective non-volatile memory cells and columns coupled to the second column decoder through bit line terminals of respective non-volatile memory cells;
   a shared control gate high voltage decoder selectively coupled to control gate terminals of rows in the array;
   a shared erase gate high voltage decoder selectively coupled to erase gate terminals of rows in the array;
   a shared row decoder coupled to all rows in the array;
   a first output circuit coupled to the first column decoder for generating a first output in response to the enabling by the shared bit line driver of one or more of the even columns; and
   a second output circuit coupled to the second column decoder for generating a second output in response to the enabling by the shared bit line driver of one or more of the odd columns, wherein the first output and the second output are generated simultaneously.

2. An analog neural memory, comprising:
   a first array of non-volatile memory cells arranged into rows and columns;
   a second array of non-volatile memory cells arranged into rows and columns;
   a third array of non-volatile memory cells arranged into rows and columns;
   a fourth array of non-volatile memory cells arranged into rows and column;
   a first row decoder coupled to rows of the first array and the second array;
   a second row decoder coupled to rows of the third array and the fourth array;

a first column decoder coupled to the first array;
a second column decoder coupled to the second array;
a third column decoder coupled to the third array;
a fourth column decoder coupled to the fourth array;
a shared high voltage decoder selectively coupled to control gate terminals of rows in the first array, the second array, the third array, and the fourth array;
a first shared bit line driver for enabling simultaneously columns coupled to the first column decoder through bit line terminals of respective non-volatile memory cells and columns coupled to the second column decoder through bit line terminals of respective non-volatile memory cells;
a second shared bit line driver for enabling simultaneously columns coupled to the third column decoder through bit line terminals of respective non-volatile memory cells and columns coupled to the fourth column decoder through bit line terminals of respective non-volatile memory cells;
a first output circuit coupled to the first column decoder for generating a first output from one or more rows in the first array during a first read operation;
a second output circuit coupled to the second column decoder for generating a second output from one or more rows in the second array during a second read operation;
a third output circuit coupled to the third column decoder for generating a third output from one or more rows in the third array during a third read operation; and
a fourth output circuit coupled to the fourth column decoder for generating a fourth output from one or more rows in the fourth array during a fourth read operation.

3. The analog neural memory of claim 2, wherein the first read operation and the third read operation occur concurrently.

4. The analog neural memory of claim 2, wherein the second read operation and the fourth read operation occur concurrently.

5. The analog neural memory of claim 2, wherein each of the first output circuit, the second output circuit, the third output circuit, and the fourth output circuit comprises a current-to-voltage converter.

6. The analog neural memory of claim 5, wherein each of the first output circuit, the second output circuit, the third output circuit, and the fourth output circuit further comprises an analog-to-digital converter coupled to the current-to-voltage converter.

7. The analog neural memory of claim 2, wherein the first array, the second array, the third array, and the fourth array are formed from one physical array and divided from one another by a portion of the one physical array without metal contacts.

8. An analog neural memory, comprising:
an array of non-volatile memory cells arranged into rows and columns, each non-volatile memory cell comprising a control gate terminal, a word line terminal, a source line terminal, and an erase gate terminal;
a plurality of control gate lines, each control gate line coupled to control gate terminals of a row of non-volatile memory cells;
a plurality of word lines, each word line coupled to word line terminals of a row of non-volatile memory cells;
a plurality of source lines, each source line coupled to source line terminals of two adjacent rows of non-volatile memory cells; and
a plurality of erase gate lines, each erase gate line coupled to erase gate terminals of a row of non-volatile memory cells;
wherein a control gate line of a first row is coupled to a control gate line of a second row that is not adjacent to the first row, an erase gate line of the first row is coupled to an erase gate line of a third row that is not adjacent to the first row, and a source line of the first row is coupled to a source line of the third row.

9. The analog neural memory of claim 8, wherein the first row and the second row are in different sectors.

10. The analog neural memory of claim 8, wherein the first row and the third row are in different sectors.

\* \* \* \* \*